United States Patent [19]
Bilas et al.

[11] Patent Number: 5,233,511
[45] Date of Patent: Aug. 3, 1993

[54] PANELBOARD ARRANGEMENT WITH IMPROVED CONTROL

[75] Inventors: Ronald J. Bilas; Ronald L. Farrington; Drew A. Reid, all of Cedar Rapids, Iowa

[73] Assignee: Square D Company, Palatine, Ill.

[21] Appl. No.: 722,814

[22] Filed: Jun. 28, 1991

[51] Int. Cl.$^5$ ............................................. G05B 11/01
[52] U.S. Cl. .................................... 364/146; 361/622; 361/643; 361/644
[58] Field of Search ........................ 364/146, 492, 493; 235/375; 361/356, 357, 360, 361, 334, 346; 340/825.06; 307/112, 113, 115, 39

[56] References Cited

U.S. PATENT DOCUMENTS

| | | | |
|---|---|---|---|
| 3,949,277 | 4/1976 | Yosset | 364/492 |
| 4,293,915 | 10/1981 | Carpenter et al. | 364/146 |
| 4,769,765 | 9/1988 | Green | 235/382 |
| 4,777,607 | 10/1988 | Maury et al. | 364/492 |
| 4,922,407 | 5/1990 | Birk et al. | 364/146 |

Primary Examiner—John Shepperd
Attorney, Agent, or Firm—Larry I. Golden; Kareem M. Irfan

[57] ABSTRACT

In a panelboard for controlling current paths through a plurality of associated circuit breakers, a panelboard enclosure includes circuit breakers which each have a side facing a front side of the enclosure and including a multi-sectioned user interface circuit, that is configured to communicate with at least one of the circuit breakers. The interface circuit includes a first circuit section and a second circuit section. The first circuit section is located adjacent the back wall of the enclosure and behind the second circuit section, and the second circuit section includes communication means for allowing an operator at the front of the enclosure to communicate with the circuit breakers. This arrangement minimizes heat in the back of the enclosure, provides control and monitoring functions at the front of the enclosure and allows room for additional circuitry in the back of the enclosure. An automatic interpreter may be included in the enclosure for interpreting a coded message which provides the operator access to control the circuit breakers. Preferably, the coded message is received on a coded key card.

20 Claims, 29 Drawing Sheets

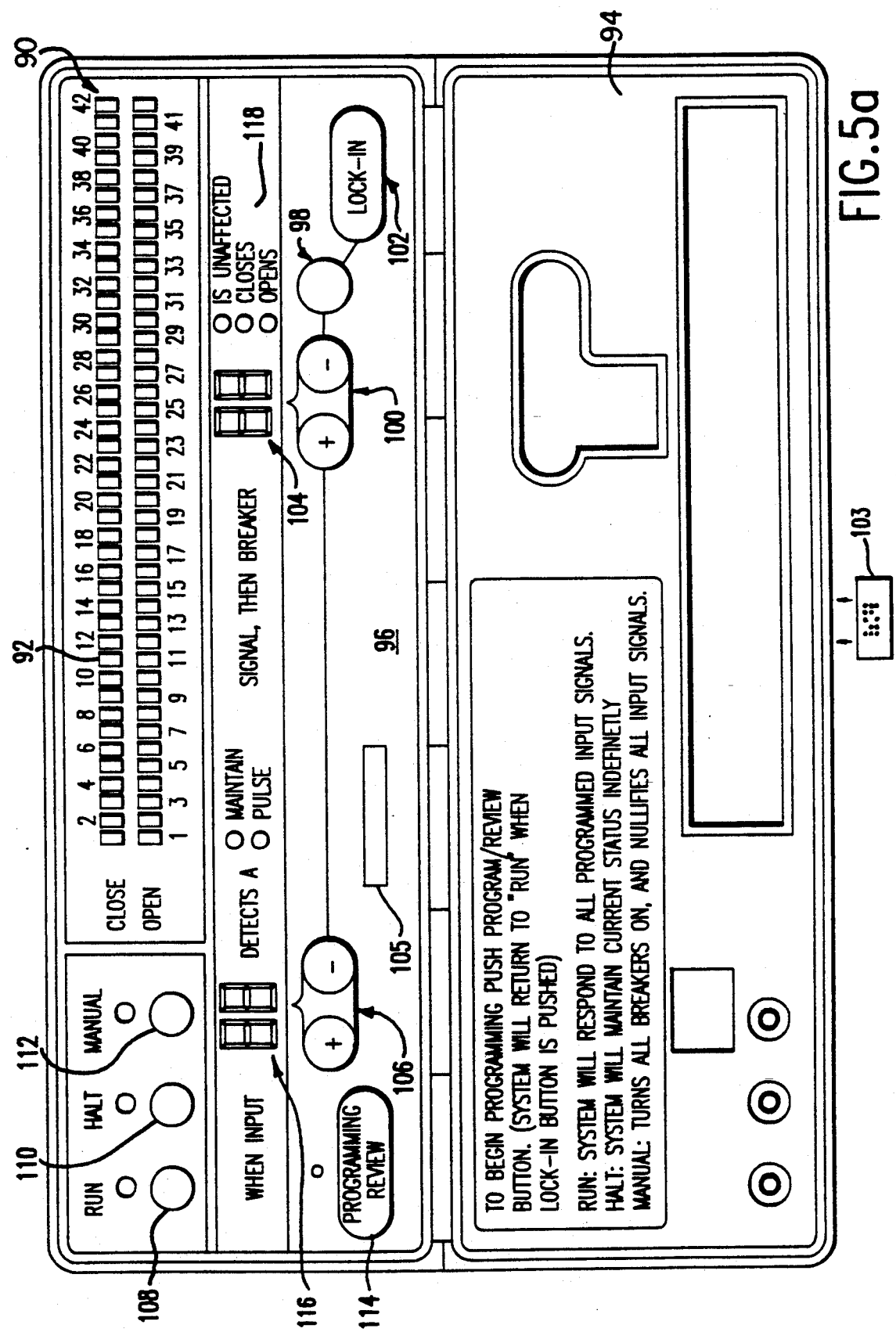

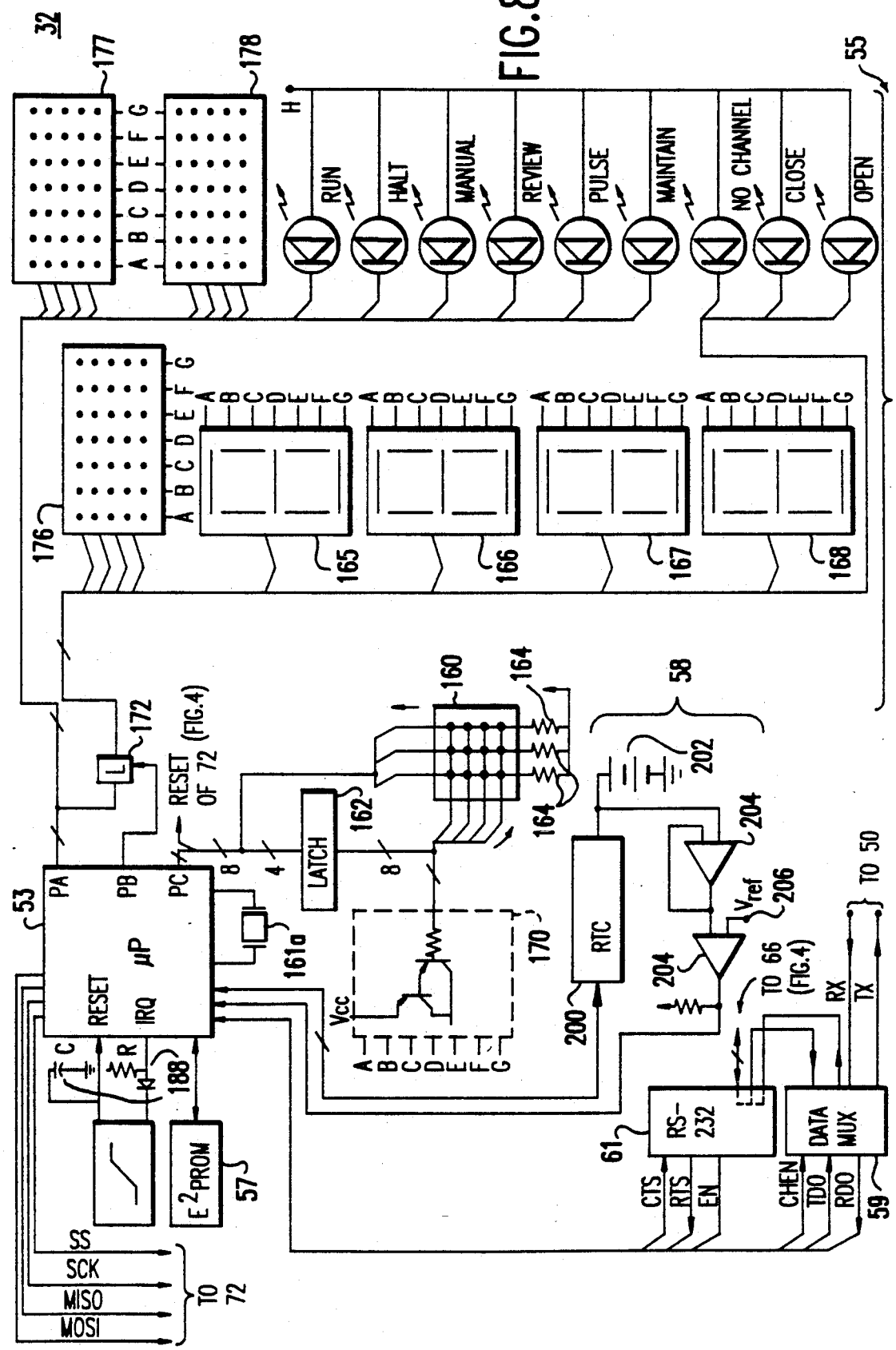

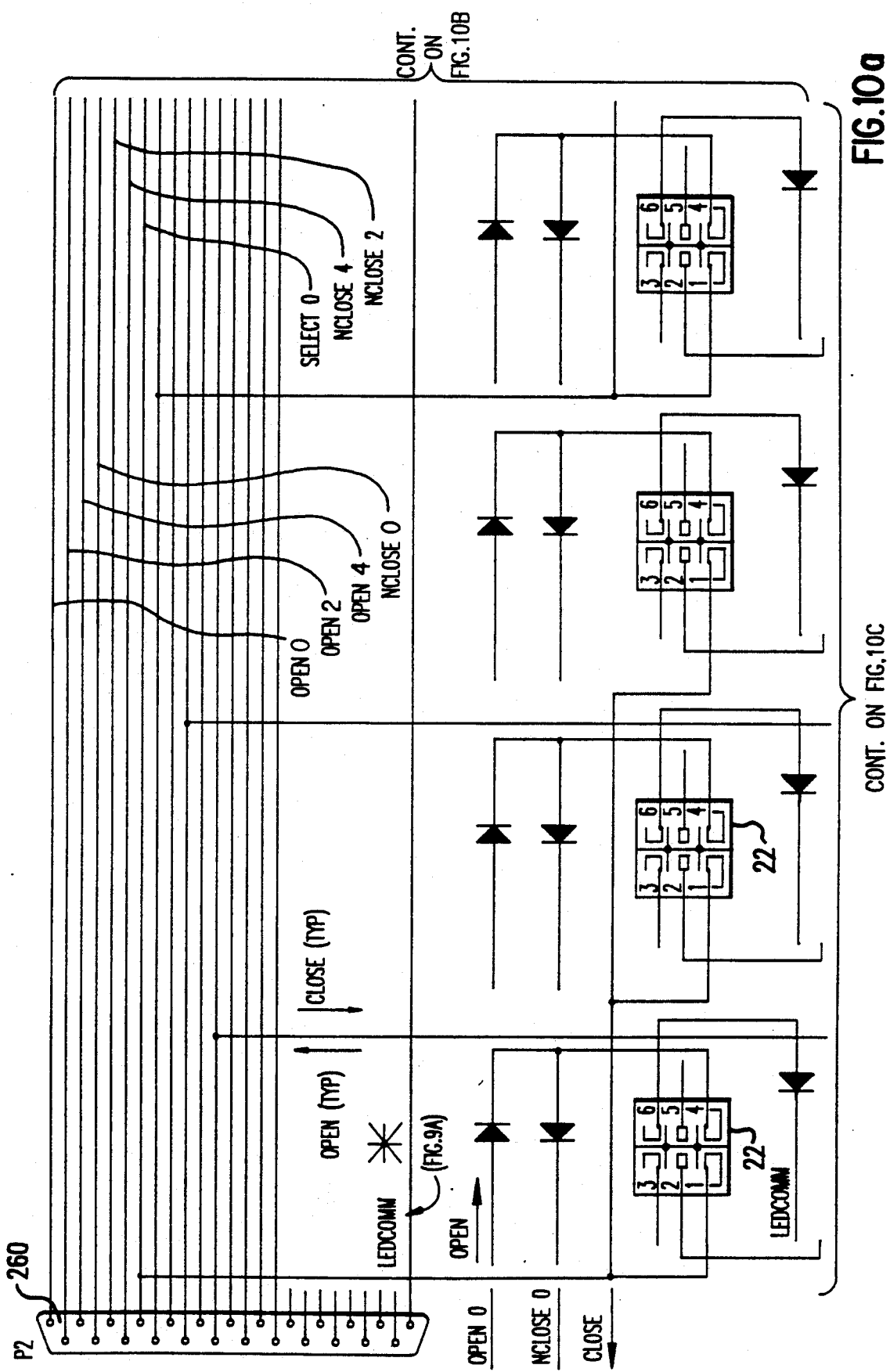

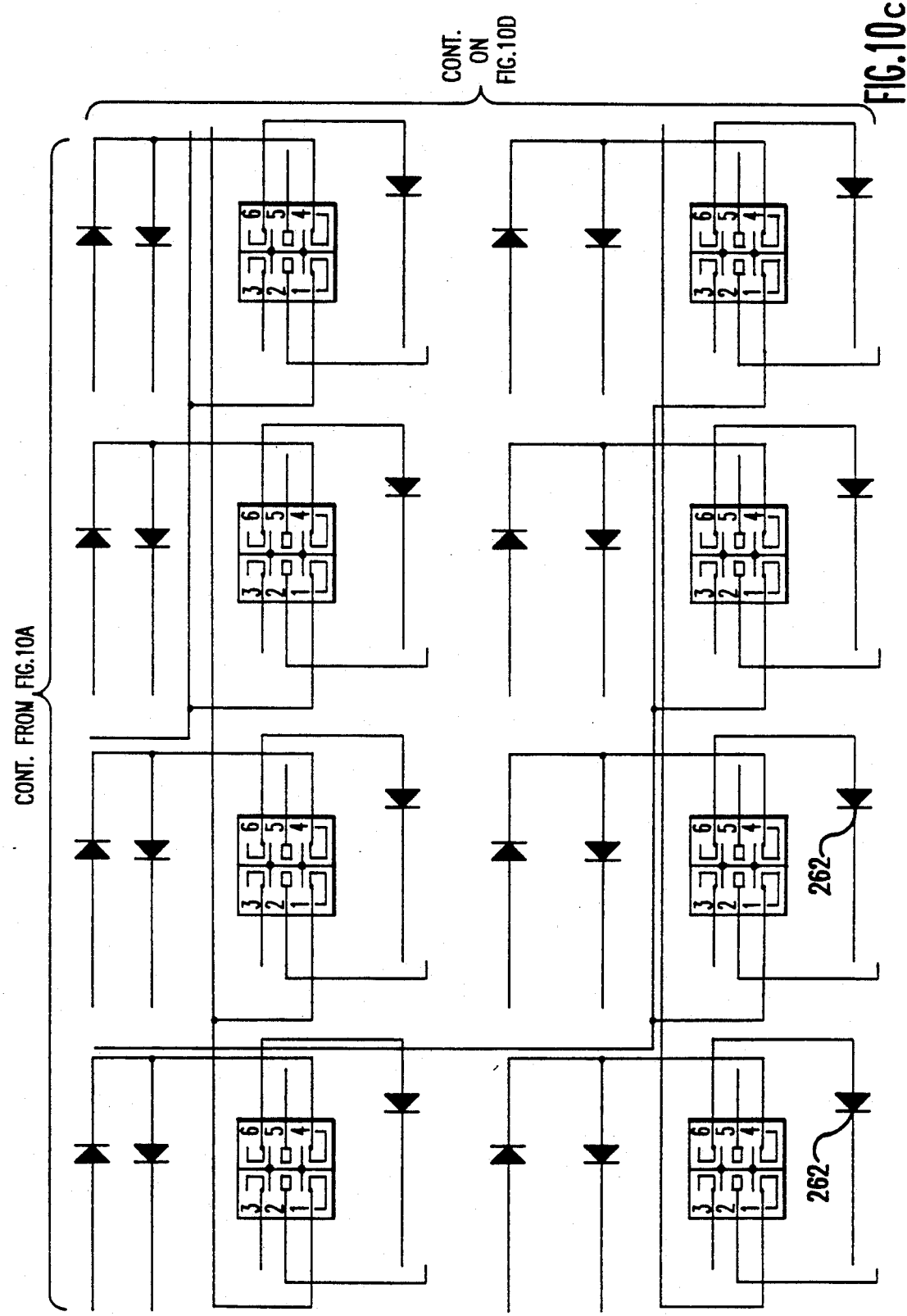

PANELBOARD ARRANGEMENT WITH IMPROVED CONTROL

FIELD OF THE INVENTION

The present invention relates generally to circuit breaker load centers and, more particularly, to improvements in the control and monitoring of remotely controlled circuit breakers.

BACKGROUND OF THE INVENTION

Remote control circuit breakers are commonly used for temporary interruption of electrical service during peak use hours and for programmable lighting control of industrial locations. By opening and closing on demand from a remote location, these circuit breakers provide a significant improvement over manually operated circuit breakers in terms of convenience.

Systems using remote control circuit breakers typically include a circuit breaker load-center having circuit breakers wired to a remotely located computer for monitoring and/or controlling each circuit breaker. The wiring has been accomplished in such systems either by using a patch-board within the load-center, as described in U.S. Pat. No. 4,920,476 (Brodsky et al.), or by hard-wiring each circuit breaker input/output to a terminal in the remotely located computer.

Such systems, unfortunately, are not very accommodating to system control changes. Rather, the systems are designed to handle specific types of remote control signals, typically provided by a pair of wires that may be shorted to command the circuit breaker to close. Each time the circuit breaker control requirements change in these systems, the wiring and many system components must be reconfigured or replaced, thereby making these systems expensive and burdensome to maintain.

Another maintenance-related problem with these types of systems concerns the ability to control and monitor the system. Most load-center systems fail to provide a conveniently arranged monitoring system for the various circuit breakers and/or fail to provide a convenient method of on-line circuit breaker programming.

There is therefore a need for a remotely controlled circuit breaker load-center which is easier and more convenient to monitor and operate.

OBJECTS AND SUMMARY OF THE INVENTION

It is a general object of the present invention to provide an improved remote control circuit breaker arrangement which overcomes the aforementioned deficiencies of the prior art and which is more convenient to monitor and operate locally and remotely.

It is another object of this invention to provide an improved circuit breaker arrangement having tamperproof, reliable, control for indicating whether power to the load has been interrupted.

In accordance with one preferred embodiment of the present invention, the present invention provides a load center having an enclosure including therein a plurality of circuit breakers, each having a side facing a front side of the enclosure and including a multi-sectioned user interface circuit, which is configured to communicate with at least one of the circuit breakers. The interface circuit includes a first circuit section and a second circuit section. The first circuit section is located adjacent the back wall of the enclosure and behind the second circuit section, and the second circuit section includes communication means for allowing an operator at the front of the enclosure to communicate with the circuit breakers. This arrangement minimizes heat in the back of the enclosure, provides control and monitoring functions at the front of the enclosure and allows room for additional circuitry in the back of the enclosure.

In accordance with another preferred embodiment of the present invention, the present invention provides a load center having an enclosure including a plurality of circuit breakers; and a user interface circuit, configured to communicate with at least one of the circuit breakers, including a circuit section located adjacent the front side of the enclosure to allow an operator at the front of the enclosure to communicate the circuit breakers and further including an automatic interpreter for interpreting a coded message which provides the operator access to control the circuit breakers. Preferably, the coded message is received on a coded key card.

BRIEF DESCRIPTION OF THE DRAWINGS

Other objects and advantages of the invention will be apparent from the following detailed description and the accompanying drawings in which:

FIG. 1b is another perspective view of the load center arrangement of FIG. 1a;

FIG. 3 is an end view, taken along line 3—3 of FIG. 1a, illustrating various interconnected components of the system of FIG. 1a;

FIG. 5a is a perspective view of the display for the controller shown in FIGS. 1-4;

FIG. 6 is a block diagram of an expansion module, according to the present invention, which may be used to interconnect a various types of accessories into the system of FIG. 1a;

FIG. 8 is a schematic diagram of the controller shown in FIGS. 1-4;

FIG. 9d is a schematic diagram of the electrical portion of a circuit breaker illustrated in FIG. 1a;

FIGS. 9e-9g comprise three state diagrams which depict the power driver, data transmit and data receive operation of the gate array illustrated in FIG. 9a;

FIGS. 9h-9k comprise a series of timing diagrams which respectively depict the receive message, open contacts, read status and read motor operations of the gate array illustrated in FIG. 9a;

FIGS. 10a-d represent is a schematic diagram of a control bus shown in FIG. 2;

FIGS. 13a-13d comprise a flow chart which may be used to program the microcomputer shown in FIG. 11a.

Figure 1A:
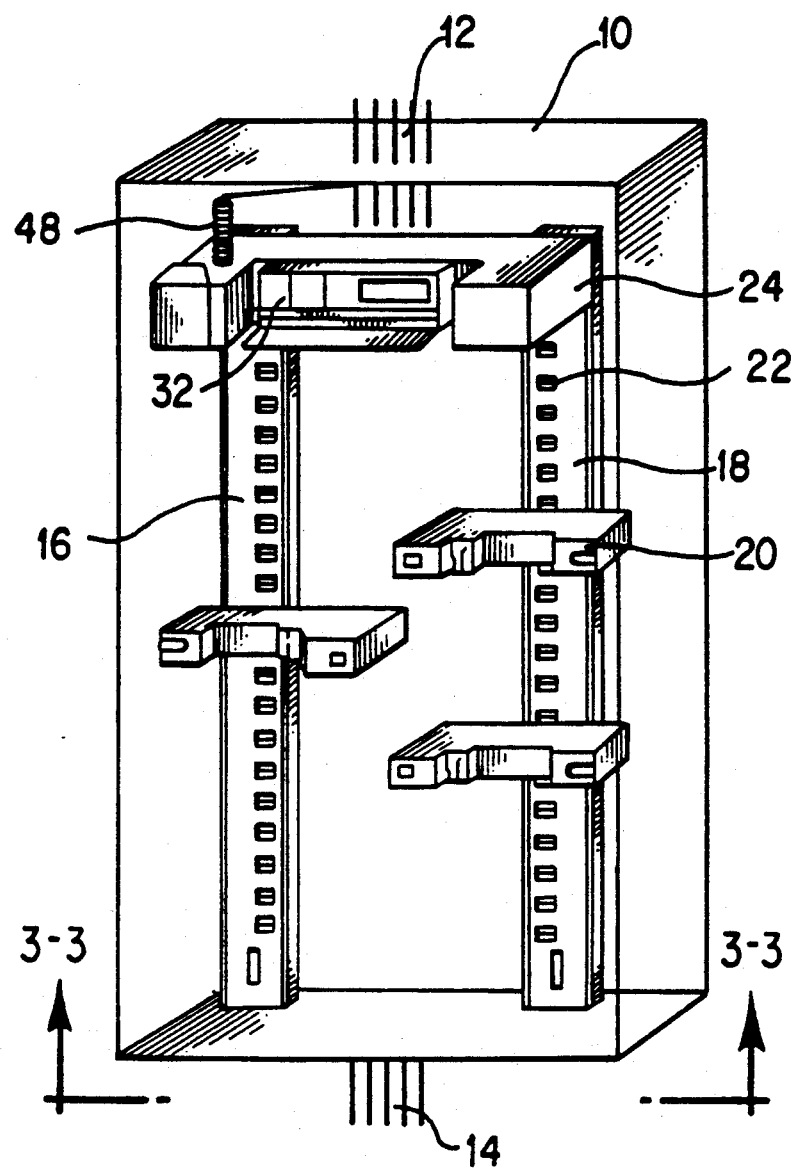
FIG. 1a is a perspective view of a load center arrangement or system, according to the present invention.
Figure 1B:
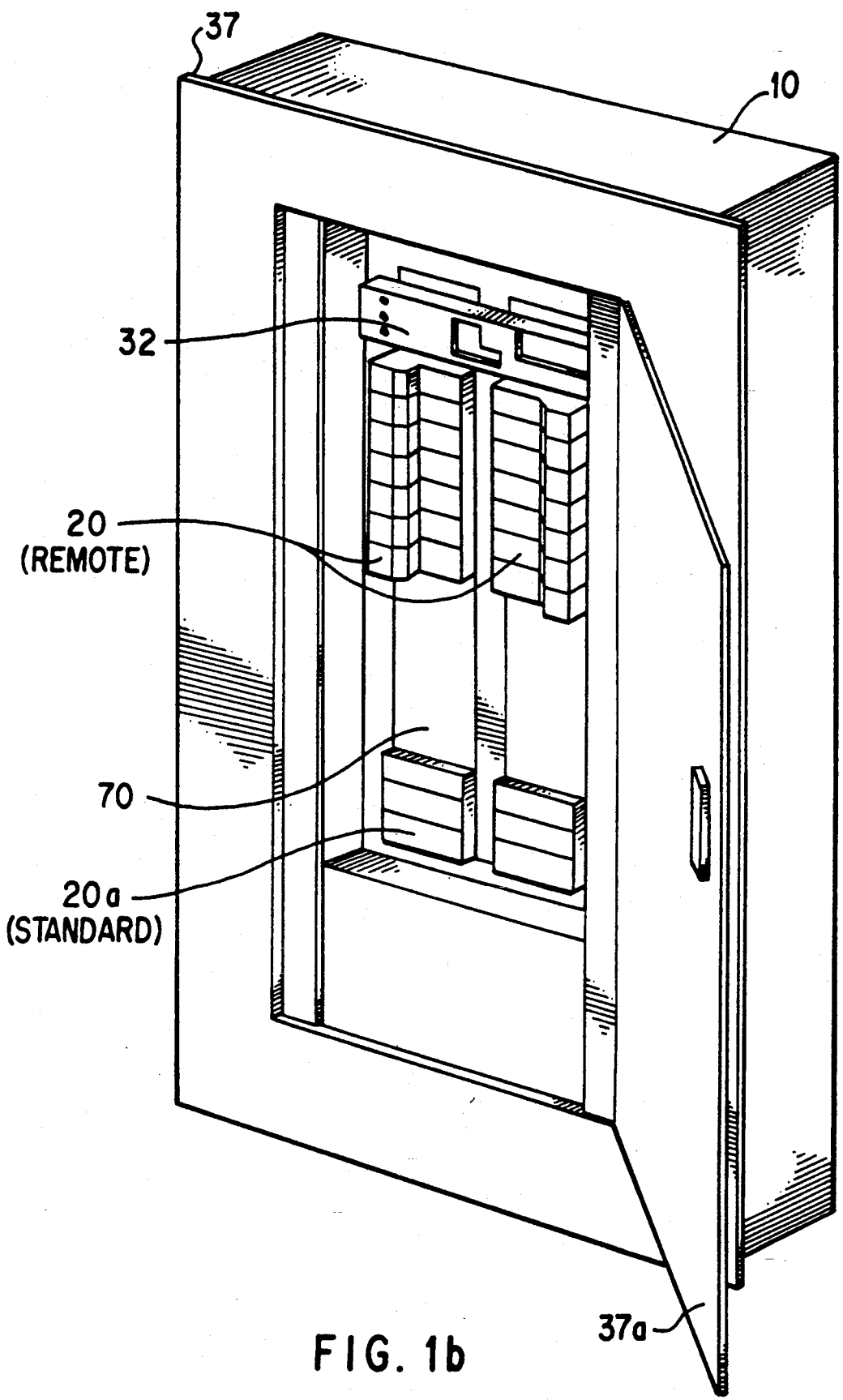

While the invention is susceptible to various modifications and alternative forms, specific embodiments thereof have been shown by way of example in the drawings and will be described in detail. It should be understood, however, that it is not intended to limit the invention to the particular form described On the contrary, the invention is to cover all modifications, equivalents, and alternatives falling within the spirit and scope of the invention as defined by the appended claims.

DESCRIPTION OF THE PREFERRED EMBODIMENT

In FIG. 1a, the present invention is shown to provide an electrical distribution system or arrangement which may include a panelboard or load-center enclosure 10 which receives a plurality of input power lines 12 from a power source (not shown). Lines 14 exit the enclosure 10 to distribute power to various loads (not shown). Bus boards 16 and 18, which may be implemented on the same board, are disposed in parallel on each side of the load-center for mounting remotely controlled circuit breakers 20, each having a plug-in socket which is coupled to one of a plurality of connectors 22 on the bus boards 16 and 18. The connectors 22 are used with the bus boards 16 and 18 to carry motor control and contact-status signals, via an interface module 24, to and from the circuit breakers 20. Electrical switching devices other than circuit breakers may be used such as contactors or electrical relays.

A preferred circuit breaker, which may be used to implement the remotely controlled circuit breakers 20, is described in copending patent application 07/722050, entitled REMOTE CONTROL CIRCUIT BREAKER, which is filed herewith, assigned to the instant assignee and incorporated herein by reference. Another circuit breaker which may be used to implement the remotely controlled circuit breakers 20 is described in U.S. Pat. No. 4,623,859, Erickson et al., also assigned to the instant assignee and incorporated herein by reference.

Figure 2:
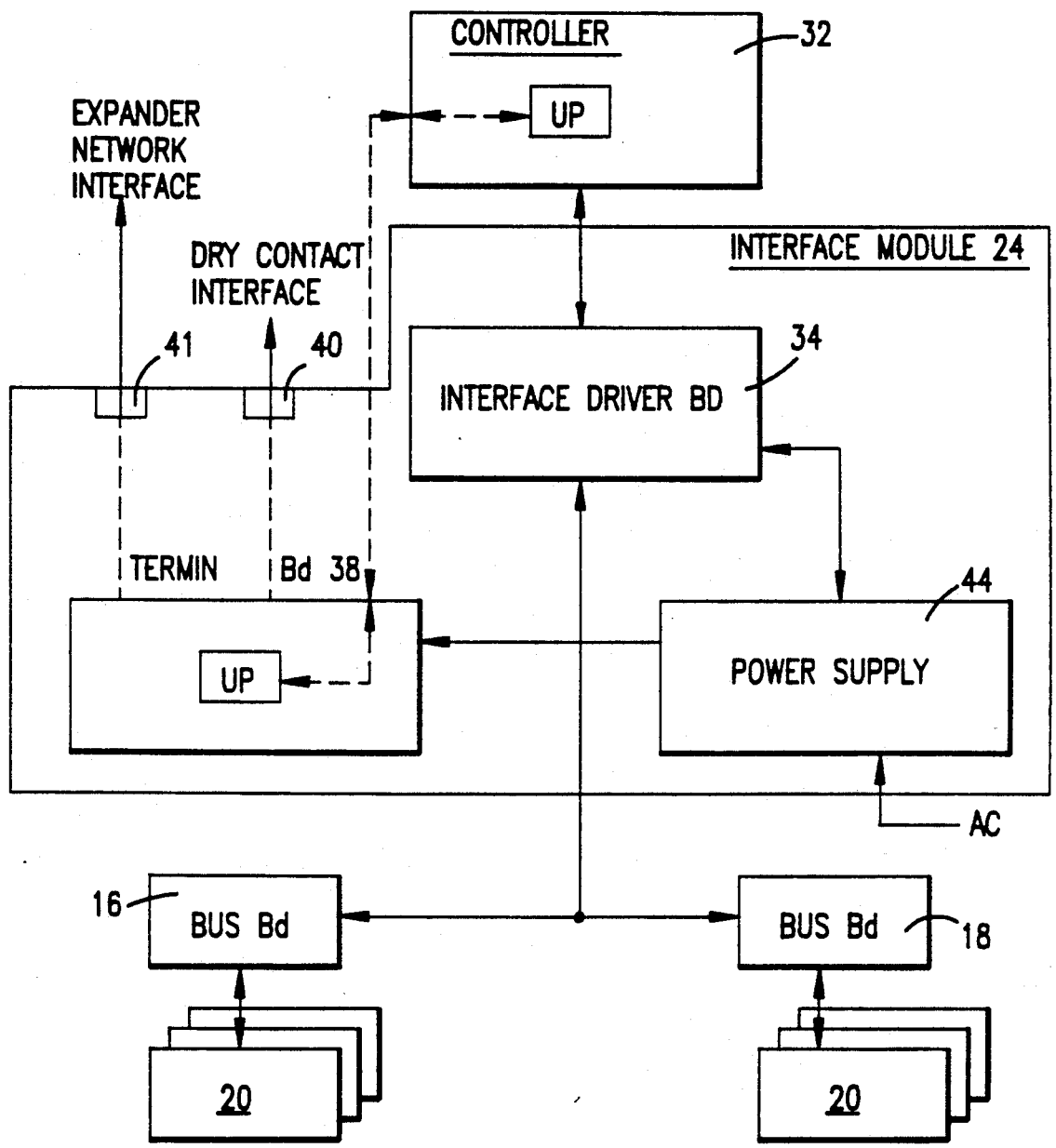
FIG. 2 is an electrical block diagram of the system shown in FIG. 1a, and including a controller, an interface module and a termination board which are intercoupled to provide the primary control functions of the system.
Figure 7:
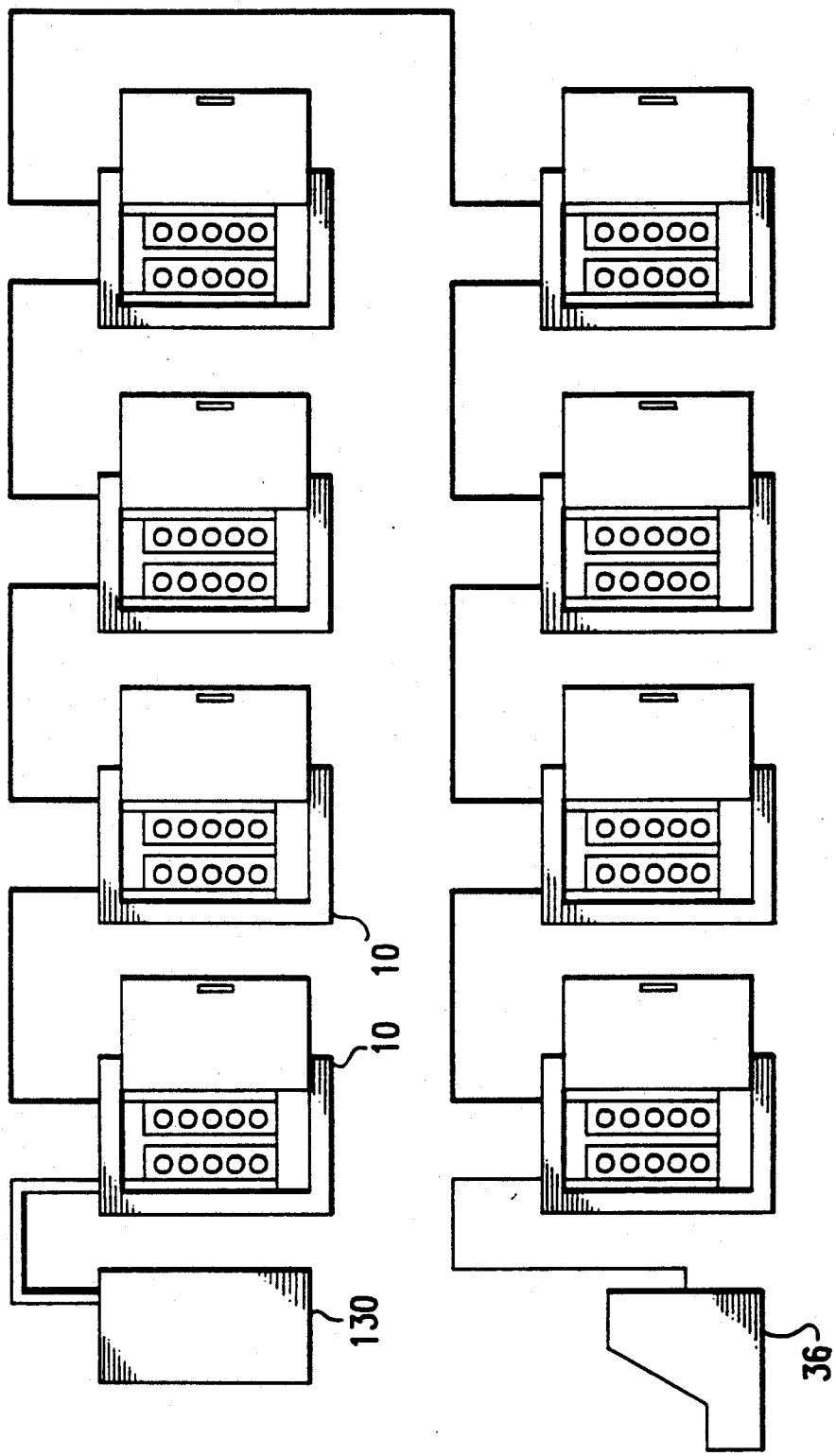
FIG. 7 illustrates a perspective view of a plurality of systems interconnected in accordance with the present invention.

As illustrated in the block diagram of FIG. 2, the interface module 24 interprets messages from a controller 32 so as to facilitate electrical control and monitoring functions from both local and remote locations. Both the control and monitoring functions are accommodated within the interface module 24 using an interface driver board 34. The interface driver board 34 provides a communications path between the circuit breakers 20 and the controller 32, which resides within, and as an integral part of, the load-center enclosure 10. The controller 32 may communicate with a remotely located control/monitoring device 36 (FIG. 7) via the termination board 38. Any such control or monitoring signal transmitted between the interface driver board and the circuit breakers is carried by one of two control buses on the bus boards 16 and 18.

The interface module 24 also includes a termination board 38 which is used to couple the control and monitoring signals between the interface driver board 34 and the remotely located control/monitoring device via the controller 32. Preferably, the control and monitoring signals are transmitted and received using either a direct-wiring (or dry contact) interface, as depicted at port 40 of the termination board 38, or a prescribed serial communication protocol (e.g., a wired or wireless LAN-type interface), as depicted at port 41 of the termination board 38. This coupling may also be accomplished using a number of different techniques, including, for example, those techniques discussed in U.S. Pat. No. 4,709,339 (issued to Fernandez), and co-pending U.S. patent application Ser. No. 07/503,267, by Lee Wallis.

Figure 3:
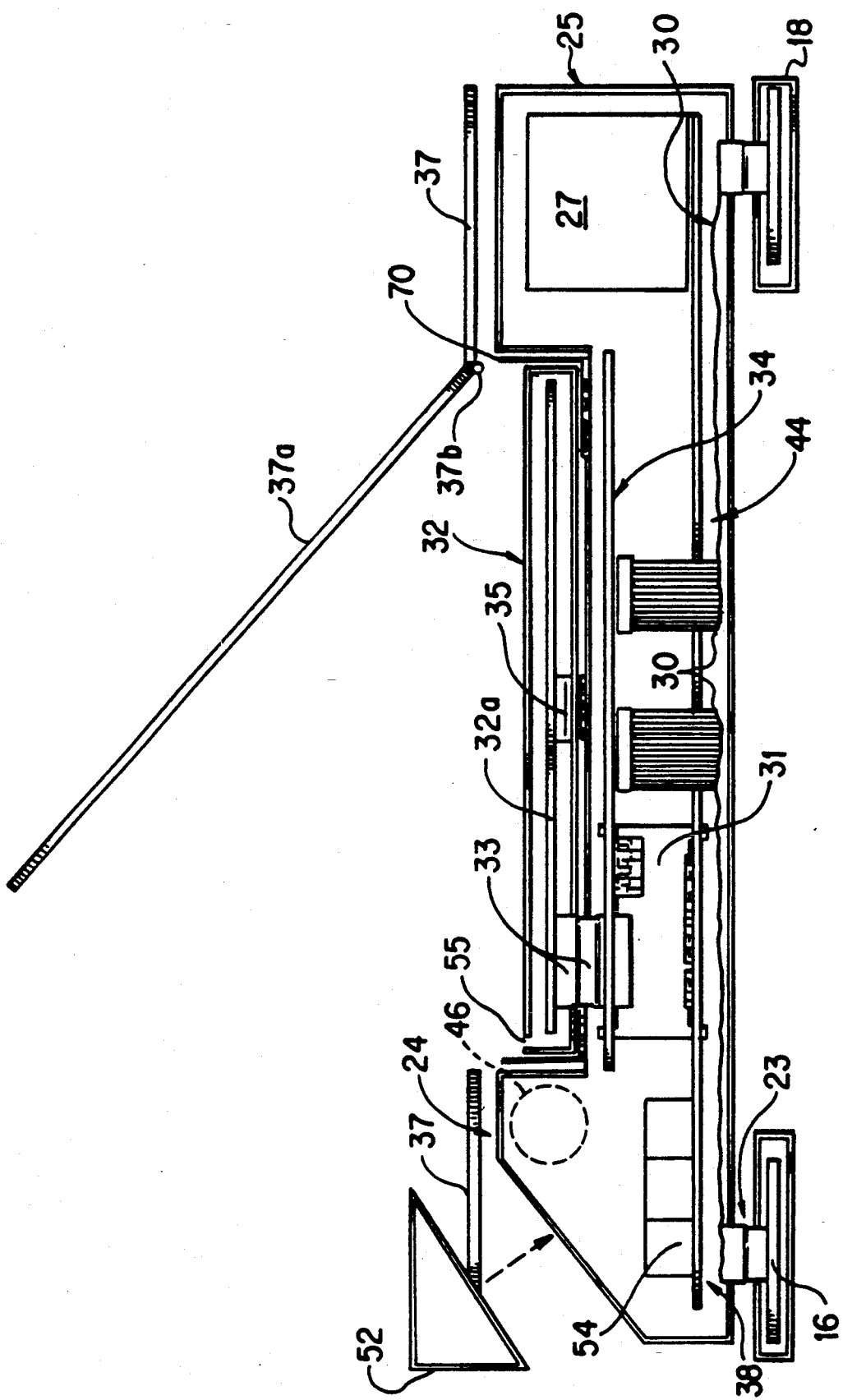

FIG. 3, which shows an end view of load-center components of FIG. 1a, best illustrates the above-described electrical arrangement of FIG. 2 from a structural perspective. FIG. 3 illustrates a manner of interconnecting the bus boards 16 and 18, the controller 32 and the interface module 24, the latter of which includes an interface module housing 25 for enclosing the interface driver board 34, a power supply board 44 and the termination board 38. The interface module 24 may be coupled to the uppermost or lowermost portion of the bus boards 16 and 18 according to the preferred viewing position. The interface driver board 34 is preferably coupled to the bus boards 16 and 18 via a pair of ribbon cables 30 and associated DB25-type connectors 23, and the interface driver board 34 is coupled to the power supply board 44 and the termination board 38 using an interconnect board 31. The connectors 33 may be offset so that the controller 32 overhangs the top or bottom of the load-center if desired. The controller 32 may be secured to the front panel of the interface module 24 using DB-9 connectors 33.

The controller 32 includes a controller circuit board 32a which may be secured to the front panel of the interface module 24 using DB-9 connectors 33. A membrane keyboard 35 is used to receive user inputs for controlling the circuit breakers and for programming the system.

The power supply board 44 and the termination board 38 may be implemented on a single printed circuit board or separate circuit boards. Further, a power transformer 27 is preferably attached to the power supply board 44 to provide power to the interconnect board 31. The transformer 27 may include two primary windings and three secondary windings to provide signals which may be processed using full-wave rectifier/regulator stages, such that $+5$ (Vcc), $-5$ and $-24$ Volts are provided along with their associated common signals, of which at least the latter two may be the same. In a preferred embodiment, one secondary winding provides the $+5$ Volt signal, the second secondary winding provides the $-24$ Volts signal, and the third secondary winding provides an isolated unregulated signal which is regulated to $+5$ Volts ($V_{iso}$ of FIG. 11a); and the $-5$ Volt signal emanates from the $-24$ Volt regulator.

A cover 37, including a cover door 37a rotating about a hinge 37b, is conventionally used to enclose the load center.

Also illustrated in FIG. 3 is a conduit mounting hole 46 on the interface module housing 25 for receiving leads, via conduit (not shown), which connect to input terminals 54 on the termination board 38. The leads include low voltage wiring for switch inputs, e.g., dry-contact type inputs or a LAN. A removable termination area cover 52 protects and allows access to the input terminals 54 of the termination board 38.

Another important part of the present invention concerns the location of the controller 32. As shown in FIG. 3, a deadfront panel 70 is used to isolate the power lines from operators and to cover the interface module 24 and most of the bus boards 16 and 18 and the circuit breakers 20 (FIGS. 1a and 2). The controller 32 is separated from the interface driver board 34 and located in front of the deadfront panel 70. This arrangement is advantageous for a number of reasons. For instance, it provides additional room for the circuitry within the interface module 24, which is located behind the deadfront panel 70.

Another advantage relates to the dissipation of heat generated by the circuitry within the interface module 24, as well as the circuit breakers 20. Unfortunately, the deadfront panel 70 has the potential to significantly increase the temperature resulting from the generated heat due to the lack of ventilation that would otherwise be provided to the interface module circuitry in the absence of the deadfront panel 70. Thus, by locating the controller 32 and its associated circuitry in front of the deadfront panel 70, the termperature of the circuitry is lowered and the cost and reliability of the circuitry is therefore improved.

Yet another advantage provided by this controller arrangement is the additional access it provides for operator interface. By using an informationally sophisticated monitor/control panel, such as is shown in FIG. 5a, within the load-center enclosure 10, an operator will need complete access to the various displays and control keys on the monitor/control panel.

Further, this arrangement allows an operator to easily replace or upgrade the controller without removing the deadfront panel and thereby exposing the operator to the power lines.

In order to allow removal of the deadfront panel 70 without disconnecting the electronics between the controller 32 and the interface module 24, the controller 32 may be coupled to the interface module 24 by a hinged pivot. In the operating position, the controller 32 would be held in position by a connector which attaches to the interface module 24. The opposite side of the controller would be attached by the hinged pivot such that the controller 32 could be perpendicularly pivoted away from the panel to allow for removal of the deadfront panel 70.

Figure 4:
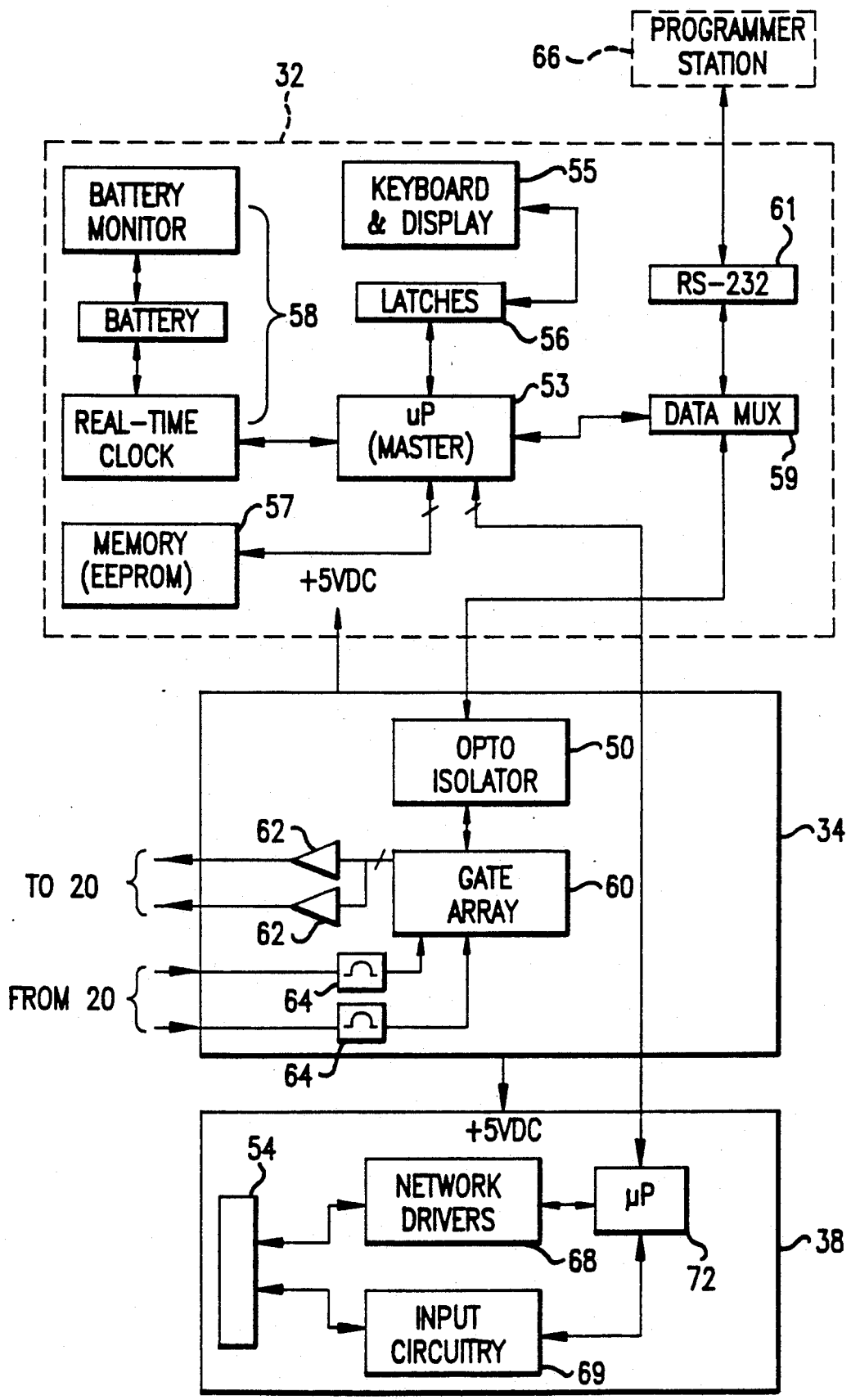
FIG. 4 is a more specific block diagram of the controller, the interface module and the termination board of FIG. 2.

In FIG. 4, an electrical block diagram of the controller 32, the interface driver board 34 and the termination board 38 is illustrated. The controller 32 includes a microcomputer 53, preferably an MC68HC05C4 (or C8) type available from Motorola, Inc., which communicates with a keyboard and display panel 55 through data latch circuitry 56. The user or operator is provided complete control over, and status of, the circuit breakers 20 through the keyboard and display panel 55.

The controller 32 also includes electrically alterable nonvolatile memory 57, which may be programmed by the user to contain specific information for operating each of the system's circuit breakers 20. Preferably, the memory 57 does not store the present state of the circuit breakers, since their state may be regularly accessed from the circuit breakers 20 themselves. However, a history of the circuit breaker activity may be recorded in the memory 57 for maintenance purposes.

In order to prevent memory endurance problems from limiting the life of the system, writes to the memory 57 are limited. Variable data is stored in the system RAM (internal to the microcomputer 53) as long as possible before any writes to the memory 57 are performed. Data is only written to the memory 57 at prescribed times during the programming mode of the controller 32. During the system run mode, data is not written to the memory 57 so as to prolong the life of the memory.

In order to prevent charge-drain off from the gates of the individual memory transistors (internal to the memory 57), the microcomputer 53 checks for valid data each time that the memory is read. Charge-drain off occurs to only one transistor at a time and is corrected by a single bit error code that determines the validity of the data in the memory. Normally, the data is valid and no further action with respect to the memory is required. However, if an error is detected, an algorithm is run to determine if the error is a charge drain-off error or a noise error. If it is an error due to noise, the correct data is read again from the memory and used. The erroneous bit will be corrected if the error is a hard error, and the corrected data will then be written to the memory. This is the only instance where the memory is written during the run mode rather than during the program mode.

Conventional circuitry 58 may be optionally provided to provide reliable, battery-backed real-time clock functions for the system. For example, this may be used to allow time-phased events to trigger certain ones of the circuit breakers 20.

The interface driver board 34 is shown as interfacing with the controller 32, through a data multiplexer 59, using an optical isolator 50 to maintain voltage isolation between the circuits and protect the circuits from power-line transients. The data multiplexer 59 also provides electronic programming capabilities from a programming computer or station 66 for accessing the controller functions. This is preferably accomplished using serial interface circuitry 61, e.g., for an RS-232 type protocol, between the data multiplexer 59 and the station 66. The interface driver board 34 and the controller 32 may be coupled in this manner using a serial protocol to reduce the number of pins required for communication therebetween.

The interface driver board 34 further includes a gate array 60 which couples the interface driver board 34 through amplifiers 62 to the motors of the remotely controlled circuit breakers 20 in order to significantly reduce the number of required driver transistors and PC board traces. When the interface driver circuitry is commanded to engage a breaker (i.e., open or close the breaker contacts), the gate array 60 essentially maps the address of the circuit breaker into a form which will turn on any two of a plurality of power output transistors associated with the gate array 60. Timers within the gate array 60 drive power transistors 62 external to the gate array 60 to control the circuit breaker motor engagement time and status read times. For example, a pair of power transistors may drive the circuit breaker motor in either of two directions for a controlled time period in order to turn the circuit breaker on or off by closing or opening the contacts. After the motor drive time period elapses, the status of the selected circuit breaker is automatically read after a specified settle time and is passed to the communications circuitry of the gate array 60. Only one circuit breaker can be switched at a time, and sets of breakers must be turned on or off sequentially.

Because of the limited physical space available for the power driver circuitry of the gate array 60, a minimum circuit breaker cycle time, i.e., the time period to complete the tasks and communications associated with a single command, is observed. This cycle time allows the power supply to sufficiently recharge the power supply storage capacitors (which may be located at the input of the −24 Volt regulator) to supply full voltage to the circuit breaker motors.

The status signals provided by the selected circuit breaker 20 are filtered by noise filters 64 before being provided to the gate array 60, which transmits the circuit breaker status to the controller 32 through the optical isolator 50.

In addition to controlling and monitoring the circuit breakers 20 from the keyboard and display panel 55, the circuit breakers 20 may be accessed using the microcomputer 53 of the controller through the termination board 38. For such communication with the controller 32, the termination board 38 includes a microcomputer 72 to communicate directly with the microcomputer 53. A significant advantage of this arrangement is that it allows a multitude of remote devices to control and monitor the circuit breakers in the same manner as with the keyboard and display panel 55.

The termination board 38 includes a communication or input terminal port 54 for remote device access to the controller 32. As previously indicated, such remote access may be provided by hard-wiring the devices to the input terminal port 54 with common, positive and negative leads at the respective terminals. A set of network drivers 68 may be used to provide the requisite network interface, and additional input circuitry 69 may be used to custom-program interface specifications.

The input circuitry 69 may include, for example, trinary DIP switches mounted to the termination board 38 which are utilized to program pulsed and maintained control modes of the plurality of inputs at terminal port 54. A single switch may be included for each of the plurality of input terminals 54. Each of the switches preferably have both pulsed and maintained labels to allow the system operator set the DIP switches according to whether the connected inputs are pulsed or maintained.

In one application, a pulsed input may refer to any of the plurality of input terminals at terminal port 54 which remains active for less than sixty seconds. Using this sixty second limitation, a maintained input then refers to an input signal which does not make two state transitions within a time period of less than sixty seconds, a transition being an input change between a pair of prescribed high and low voltage levels. The microcomputer 72 then uses the DIP switch setting to determine if an input is pulsed or maintained.

Common, positive and negative leads may be used to control either pulsed or maintained modes. For a maintained input, only two of the three terminals (common, positive and negative) are used and the DIP switch is set to its maintained position. The common terminal is always connected for any input. The positive terminal is connected to normally open contacts, the negative terminal is connected to normally closed contacts. If a closing contact is to cause an associated circuit breaker to switch, the two wires from the contacts connect between the positive and common terminals. If an opening contact is to cause a circuit breaker to switch, the wires connect between the negative and common terminals. If the DIP switch associated with a given input is set to the pulsed position, the input will be programmed to pulse mode operation. Two or three wires are connected to the terminals in the pulsed mode. When a positive terminal is connected, a closing contact causes each selected circuit breaker, or group of circuit breakers, to open or close according to the user program. When a negative terminal is connected, the closing contact causes each selected circuit breaker, or group of circuit breakers, to do the opposite of the positive terminal.

The pulsed mode is useful for normally open momentary wall switches used to override the automatic operation of the system. A first input is programmed to turn off a selected circuit breaker at a selected time. Next, a momentary, normally open two position wall switch is programmed to control the same circuit breaker using a second input. The system turns the selected circuit breaker on automatically when the contact of the first input is closed. The circuit breaker turns off when the contacts of the first input are open. The momentary switch of the second input may override the state of the contacts. If the switch is placed in the on position, the circuit breaker turns on regardless of the state of the contacts. Likewise, if the switch is pushed off, the associated circuit breaker would turn off regardless of the state of the contacts.

The contractor may optionally include a feature in the system while setting the input terminals wherein the system may autostep to used inputs while skipping unused inputs during programming. To enable this feature, the contractor sets the corresponding trinary DIP switch to the center position. When in program mode, the system looks for these shorts and does not display them on the front panel of the controller such that the user cannot program them. If this condition is not present, the system shows the inputs on its display during normal programming. The programmer may choose not to program these inputs thereby achieving the same result. If the condition is not present, the pulsed or maintained DIP switch settings are ignored.

The controller 32 initiates all communications to the gate array 60 by sending a two byte message which minimizes communications protocol errors. The first byte of the two transmitted bytes is equivalent for communications either to or from the interface driver board 34 or controller 32. A byte number is placed in the least significant bit position of all transmitted bytes to reduce the chance of unsynchronized messages. Accordingly, bit zero of the first byte always has a value of zero because it indicates the byte number. Bits one through four indicate the circuit breaker address and are the least significant bits of a particular circuit breaker address. Bits five through seven are check bits which are generated to check bits one through four. The format for the second byte of a message differs depending on whether it is sent from the interface driver board 34 or the controller 32. Messages sent from the controller 32 are command bytes. In the second command byte, bit zero is always one because it signifies byte two of the message. Bits one and two are the most significant two bits of the circuit breaker address. Bits five through seven are generated to check bits one through four. Bits three and four are encoded with four possible commands to the interface driver board 34. The controller commands are to read the motor, read the contact status, open a selected breaker or close a selected breaker. When the most significant bit of the command code is a zero, the interface driver board 34 only sends back a status. If the most significant of the two bits is a one, a switch command is sent to the interface driver board 34.

Messages sent from the interface driver board 34 are status bytes. The second byte of a status message may differ from the second byte of a command message in bit positions three and four. In a status byte, bit four is a status and bit three is always zero. These bits indicate the presence of a motor in the circuit breaker, the status of the contact, i.e., whether a selected breaker has been opened or closed.

If the interface driver board 34 detects an error in either byte one or byte two, no circuit breaker switching or status reading occurs. An all 1's error message is returned and the interface module is reset to wait for the first byte of the next command. The controller 32 then retransmits the previous message. Accordingly, if the controller 32 sends a read status message, the interface driver board 34 reads the circuit breaker status and returns the results to the controller 32. If the controller message is a switch command, the interface driver board 34 carries out the command by switching the breaker. It then reads and returns the contact status of the selected breaker. The interface module response to a read status message is the desired status of the contacts of the selected circuit breaker. The interface module response to a switch command is the actual status of the contact after the switch has occurred. The controller 32 uses the returned information to ascertain whether the selected circuit breaker has switched. If the returned status shows that the contacts are in the wrong state, the controller 32 may be programmed to attempt to correct the problem.

A seven bit cyclic hamming code detects errors in the most significant seven bits of a message byte. The byte number bit is excluded because there is no available hamming code which will detect seven bits with three check bits. The exclusion is insignificant since parity detects any odd bit error in any bit position. If a two bit error occurs in any message byte which includes bit zero, the hamming code will detect it because the other seven bits of the byte are checked by the code. If a controller command is retransmitted multiple times and an unexpected status is received from the gate array 60, the controller may be programmed to display the error and may then discontinue transmitting the command thereby assuming that the circuit breaker has failed.

As can be seen in FIG. 5a, the keyboard and display panel which is shown in FIG. 4 is preferably implemented as part of a flip-open housing which encloses the controller circuitry of FIG. 4, except for portions of the keyboard and display panel 55. The controller 32 comprises a system display which provides an interface to allow a user to program the system responses according to the programming provided at the input circuitry 69 of the termination board 38.

The system may operate in any of four modes: run, halt, manual or program. The run mode represents the normal operation of the system, including provision of the primary functions of controlling and displaying the status of the circuit breakers. When the system is first powered on or comes up after a power down, it may enter the run mode. In this mode, the controller 32 may drive the system display, scan the control buttons, and look for changes at the plurality of inputs.

The system regularly scans all of the circuit breaker status lines and displays the results on a plurality of LEDs 90. The LEDs 90, which indicate the open or closed status position of the circuit breakers 20 are conveniently arranged to correspond to the arrangement of the circuit breakers 20 as viewed from the front of the load center (as shown in FIG. 1a). When the system commands a circuit breaker to switch, the actual status of the circuit breaker will be displayed on a status indicator display 92. The status of all of the remotely controlled circuit breakers appears in the same configuration as the breakers are arranged in the load-center. The breaker statuses may be polled only periodically, rather than constantly, to avoid communications protocol traffic and reduce panel temperatures. Preferably, however, the breaker statuses are polled as fast as possible so as to provide immediate responses.

When the front cover 94 of the front panel 96 is closed, the status indicator 92, the breaker status button 98 and the breaker select button 100 are accessible to the user. While the enter button 102 is accessible to the user only when the front panel 96 is open, these buttons 98 and 100 allow a user to switch a selected circuit breaker and display the breaker status on the status indicator 92 while in the run mode. Instructions (not shown) may be affixed to the exterior of the front cover 94 to instruct the user as to operations for switching circuit breakers during the run mode.

The display will display the number of the last circuit breaker which the user programmed or manually switched. The status display 92 indicates whether that breaker is open, closed or unaffected by the switch. If the breaker statuses are polled only periodically, the breaker status indicator 92 is blank in order to limit the amount of power continuously dissipated in the circuit breaker status read circuitry. If the status LEDs 90 were on continuously, power would be dissipated in the opto-isolator drive circuitry raising the temperature inside the breaker to that which may exceed the opto-isolator specifications.

In order to manually open or close a selected circuit breaker, the user selects the desired circuit breaker by pressing the breaker select button 100 until the number of the desired circuit breaker appears in the breaker display 104. Each time that the breaker select button 100 is pressed, the system automatically scans for the next installed circuit breaker. The position of the circuit breaker that is found is 15 displayed in the breaker display 104. The user continues to press the circuit breaker select button 100 until the number of the selected circuit breaker appears in the breaker display 104. The circuit breaker that is manually switched will remain in the desired state until another manual or automatic signal causes it to switch.

Alternatively, the status indicator display 92 and the breakers status button 98 may be replaced by status indicator lights and a breaker status button located on the front of the load-center dead front 70 next to each circuit breaker 20. When the system is in operation, the indicator light of each breaker is lit when the breaker is on, and is unlit when the breaker is off. When the programmer selects an input by using the input select button 106, the desired circuit breaker is selected by pressing the button next to that breaker.

When the front cover 94 is opened, additional buttons and display become accessible. The system mode is selected using the run mode button 108, the halt mode button 110, the manual mode button 112 or the program/review mode button 114. When the system first enters the run mode from either the halt or manual modes, it scans the terminals at input terminal port 54. Since pulsed inputs are lost in both the half and manual modes only the maintained inputs are available for scanning. As the inputs are scanned, the equations for all of the available circuit breakers are solved, and the breakers are switched accordingly. After this initial scan, the system reverts to normal run mode operation and scans both pulsed and maintained inputs. The system regularly scans the inputs and display buttons while driving the various display devices. There are no other controller actions until an input transition occurs, or a button is pressed.

If an input transition occurs, the microcomputer on the termination board will debounce and interpret the input. The microcomputer on the controller receives the interpretted input from the termination board and then switches the circuit breakers accordingly. Similarly, if a button on the front of the controller is pressed, the microcomputer on the controller will debounce, process, and act on the user input according to the function of the button. As the circuit breakers are switched, their actual status is displayed on the status indicator 92. Additionally, the last input which goes through a transition is displayed on the input display 116.

The system enters the halt mode when the halt mode button 110 is pressed by the user. The halt mode ignores the plurality of input terminals 54 and leaves the system in its present state. Once the halt mode is entered, the system remains there until the user presses another mode button. System status information is not stored while in the halt mode such that if a pulse occurs it will be missed. To exit the halt mode, the user presses any of the other three mode buttons. If the system is halted and either the manual or program/review button is pressed, the selected mode is entered with no further action from the controller 32. If however, the run mode is entered after the halt mode, the system will scan all programmed inputs and set the system circuit breakers 20 according to the values present on the maintained inputs. Pulsed inputs that occurred prior to entering the run mode are not acted upon.

The manual mode is entered by pressing the manual mode button 112. In the manual mode, the system sequentially switches all circuit breaker motors to their on state and then displays the current status on the status indicator 92. This action places the circuit breakers in a mode which emulates standard manual circuit breakers. While in this mode, the circuit breakers can only be controlled by the handles of the individual breakers because all inputs are ignored as in the halt mode. The manual mode differs from the halt mode in that it changes the state of the circuit breakers to their on position. When the system is in the manual mode and either the halt or program/review buttons are pressed, the system immediately enters the new mode without further action by the controller. If the run mode button is pressed, the system scans the maintained inputs and sets the affected breakers accordingly.

The program/review mode is one means by which the system may be programmed. This mode is used to enter, modify or review circuit breaker control programs. The user presses the program/review button 114 to enter the program/review mode. When this mode is entered, the system remains in the run mode from the standpoint of the system's reaction to input transitions. The system continues to process input transitions even if the user is programming the circuit breakers. Unlike the other operating modes, the program/review mode has an auto exit feature. If no button is pressed for a selected time period while the system is in the program/review mode, the system reverts to its previous mode.

Upon entering the program/review mode, the input channel to be programmed is displayed in the input display 116 and the circuit breaker to be programmed is displayed in the breaker display 104. The input display 116 and breaker display 104 are incremented or decremented by using the input select button 106 and breaker select button 100, respectively. As described above, the system automatically scans for the next installed selection as either of these buttons is pressed. If no circuit breakers are installed in the system, the system display is blank in order to prevent a never ending loop. When the + button of the respective buttons 106 or 100 is pressed, the inputs or breakers are scanned in ascending order and the next available input or breaker is displayed. Conversely, if the − button of the buttons 106 or 100 is pressed, the next available input or breaker is displayed after scanning the inputs or breakers in descending order. In program/review mode, the status indicator 92 will display how the circuit breaker on the breaker display 104 will respond to the input on the input display 116 rather than displaying the actual circuit breaker status. The input signal type is displayed on the signal display 118 as maintained or pulsed.

To aid the programmer in configuring the system, a technique is employed to ease understanding of the logical connections. The programmer completes a sentence for each input, wherein the sentence is "When input (number) detects a (pulse or maintained) signal, the breaker (number) (opens, closes or is unaffected)." This sentence is printed on the input and breaker display area of the display panel. The programmer simply enters the input number, signal type, breaker number and desired circuit breaker status and presses the enter button to program the system. No permanent program saving function occurs until the enter button is pressed. If enter is not pressed, the front panel button can be pressed without permanently changing the program. This method is used to review the program content.

An input which overrides all other inputs for a given circuit breaker may be programmed by the user as a pulse input. This input is defined as an override off and is represented on the display panel 55 by an open circuit breaker status light on the status indicator 92 while in program mode. An override off input opens a given circuit breaker regardless of the status of the other inputs. If a selected input is not programmed as an override off, it remains unprogrammed or is programmed as a normal input.

The circuit breakers 20 of FIG. 1a are numbered in two columns: circuit breakers in the left column start at one and are odd numbered, and circuit breakers in the right column start at two and are even numbered. The LEDs 90 are preferably arranged and numbered in the display of FIG. 5a to correspond physically to the arrangement of the circuit breakers 20 of FIG. 1a.

An example may be helpful to explain the convenient manner in which the display of FIG. 5a may be programmed and monitored to control the circuit breakers 20 of FIG. 1a. In this example, a user is to program a three pole circuit breaker occupying circuit breaker positions numbered 7, 9 and 11 and a single pole breaker in circuit breaker position 16 to be in the same states at the same time. Assume that inputs A, B and C are connected to terminals 1, 2 and 3 (of the eight input terminals of the termination board 38) respectively, and the override off input is connected to terminal 12. Inputs A, B and C will be normally open maintained contacts. An override off will be a pulsed input. The first three terminals have one contact wire connected to its positive terminal, and one wire connected to its common terminal. The DIP switches associated with inputs 1, 2 and 3 are set to the positions corresponding to the maintain mode. The override off input wires are connected to the positive and common terminals and the DIP switch is set to its pulsed position. The motor pole of the three pole breaker is in the center and is in circuit breaker position number 9, and the single pole breaker motor will be in circuit breaker position number 16.

Proceeding from left to right on the front display panel, input I is selected by pressing the input select + button until a 01 appears in the input display. Next, the user selects the desired circuit breaker by pressing the breaker select + button until a 09 appears in the breaker display 104. Each time the + button is pressed, the system automatically searches for the next breaker motor. This method eliminates the possibility of a user programming an unused circuit breaker position since empty circuit breaker positions do not appear in the display. When the 09 appears in the breaker display 104, the status appears on the status display and MAINTAIN appears on the signal display signifying that the input is maintained. An appearance of a maintained signal is to cause a circuit breaker to close; therefore, the breaker status button 98 will be pressed until the LED next to "CLOSES" is lit and the CLOSE LED associated with breaker in position 9 in the open/close LED array also lights. While in this programming mode, all LEDs associated with the circuit breakers to be controlled by the displayed input will light as either an open or close.

At this point, the programmer can press any of the buttons without danger of changing any of the programming. If the operator presses the halt mode button, the system will enter the halt mode without changing anything. If the operator fails to press a button for a given controlled time, the system will revert to its previous state automatically. However, if the enter button is pressed, the information on the current display will be permanently stored in memory. The status display will momentarily flash to signify that the breaker is now permanently programmed.

After breaker 9 is programmed using input 1, breaker 16 is programmed by pressing the breaker select button until a 16 appears in the breaker display. When the 16 appears in the breaker display, the current breaker program appears in the status display and MAINTAIN appears signifying that the input is maintained. The breaker select button is pressed until the LED next to "CLOSES" lights. After the enter button is pressed, the input display will display a 01. The breaker display will contain a 16, and the status display close lights will be on in the 9 and 16 positions. Note that while in program/review mode the status indicator display displays the affect that one input has on all of the breakers. After programming all breakers associated with a given input, the next input is selected by pressing the input + button once so that a 02 appears in the input display. The breaker and breaker status are selected as described above. The same procedure is followed for input 3.

Now that the three inputs A, B, and C are programmed, the override off input is programmed to complete the programming operation. The input + button is pressed until a 12 appears in the input display and the pulse light appears on the signal display to signify that the input is a pulse. The breaker number is then selected as described above. Programming proceeds as described above except that status open is selected instead of status closed. When the enter button is pressed, the status indicator display shows a closed light under circuit breakers at positions 9 and 16 to signify that the input and breakers are programmed. Note that the override off input will override any of the other inputs regardless of their states to open the circuit breakers at positions 9 and 16.

Figure 5B:
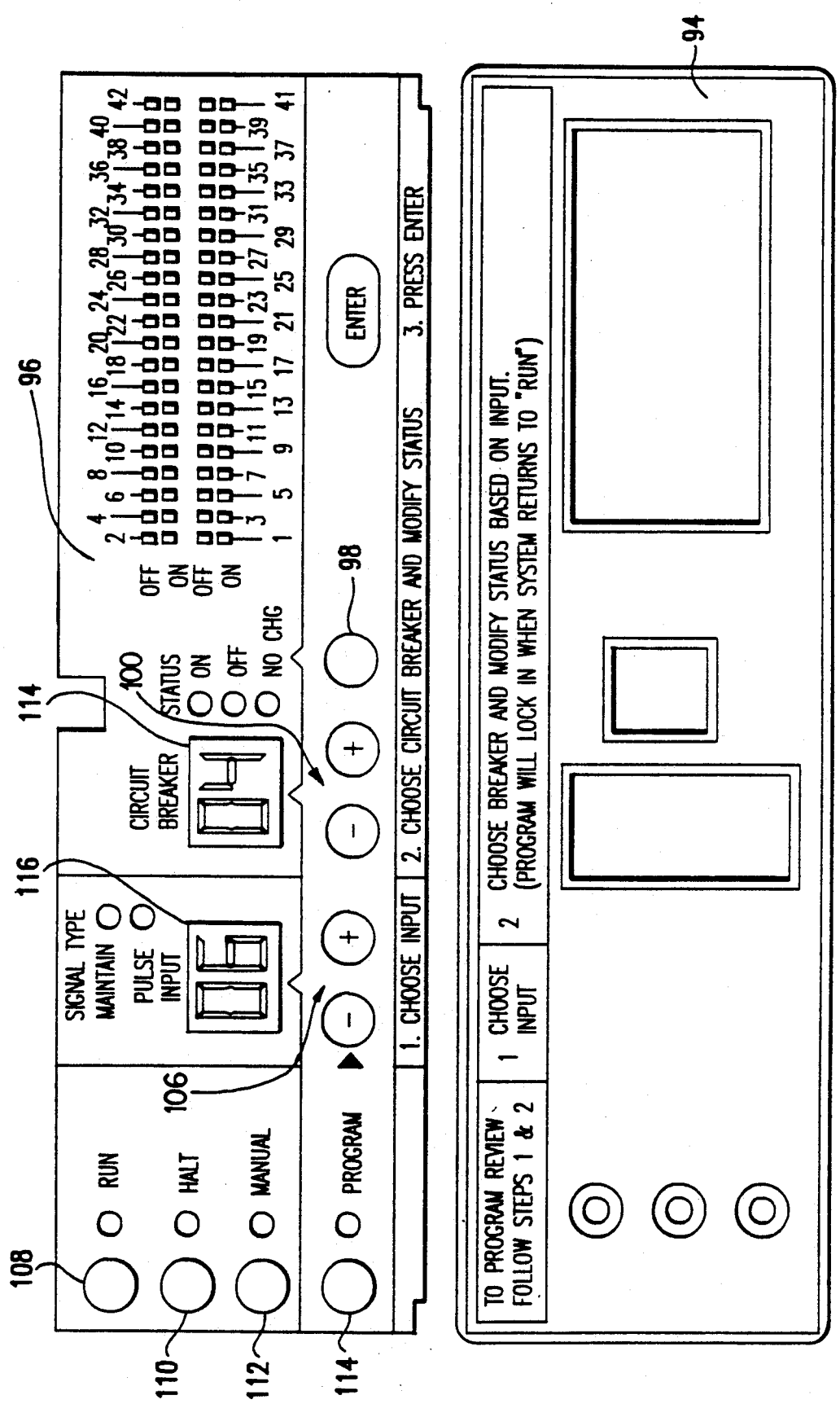
FIG. 5b is a perspective view of an alternate display for the controller shown in FIGS. 1-4.

An alternative display embodiment of the present invention is illustrated in FIG. 5b. In this embodiment, a three-step programming configuration is used in place of the sentence-programming configuration discussed above in connection with the embodiment of FIG. 5a. In terms of function, this display embodiment is the same as the display shown FIG. 5a; thus, the reference numerals depicting the various components in FIG. 5a are used to depict the corresponding components in FIG. 5b.

The primary difference between the respective embodiments of FIGS. 5a and 5b is that the enter or "LOCK-IN" button of FIG. 5a is replaced by the "enter" buttom in FIG. 5b. Rather, the display of FIG. 5b locks in the programmed inputs when the system returns to the RUN mode via button 108.

As a controller circuit option, unauthorized access to the programming function of the controller 32 may be prevented using a key card mechanism 103 (FIG. 5a) to lock out the programming function. The key card 103 comprises a small durable card having a pattern of holes wherein the card is designed to be placed into a card slot 105 in the front of the controller 32. An LED/photo detector combination located within the controller 32 detects the presence of the key and determines the particular function from the key card pattern. The key card allows access to particular modes of operation thereby providing security for the system. An exemplary key card mechanism is described in U.S. Pat. No. 4,489,359, incorporated herein by reference.

Figure 6:
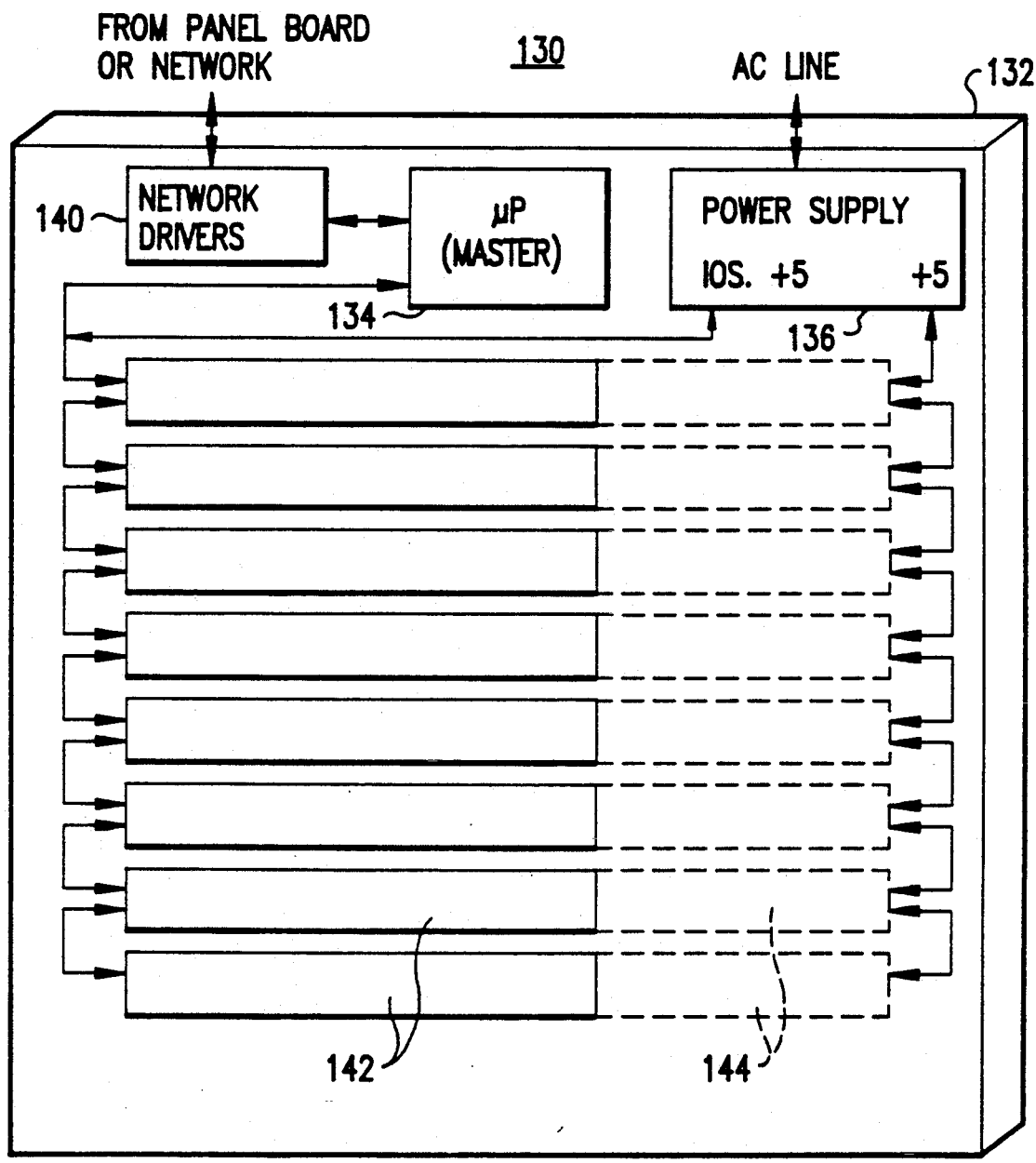

FIG. 6 illustrates an expander panel 130 which may be optionally coupled to one or more load centers, such as the load center 10 shown in FIG. 1a, to provide a number of communication-related features to the load center shown in FIG. 1a. The expander panel 130 is enclosed in a housing 132 and may include a microcomputer 134 for controlling communication with the load centers. A power supply 136, fed by a conventional AC line, may be used to provide power to the circuits contained within the housing 132, and a network driver circuit 140 may be used to interface the microcomputer 134 with a communication network or protocol required for communication with the load centers.

By employing one or more terminal ports 142 within the housing 132, external devices may be electrically coupled to the microcomputer 134 for additional kinds of remote control and monitoring of the circuit breakers, their associated current paths and other equipment associated with the controller. Ideally, the microcomputer 134 communicates through the network driver circuit 140 of FIG. 6 to the controller 32, via the network drivers 68 of the termination board 38 (FIG. 4). LAN or other types of conventional communication protocols may be used to implement this kind of interface, as previously discussed.

The expander panel 130 may also include one or more option cards (or circuits) 144 for providing customized functions. In a preferred embodiment, one of the option cards 144 is a telephone interface circuit, which is designed using conventional techniques to provide access to the controller 32 (FIG. 4) through standard telephone lines. Other option cards 144 may include, for example, an input expander card for allowing additional devices to be coupled into the system, an isolated RS232 computer interface, data logging memory with battery back-up, data logging printer interfaces, telephone network access card, telephone modem cards, wireless (FM) communication links and fiber optic repeater cards. The functions described in the expander panel may be built and installed as separate functional elements.

The expander panel, which has plug-in modularity, may be used to provide a number of network-communication type features. Although multiple load center (such as 10 of FIG. 1a) may be networked without the expander panel, FIG. 7 exemplifies an application in which a plurality of load centers may be connected in a LAN by networking the load-centers 10 with one of the expander panels 130 of FIG. 6. This kind of arrangement can provide significant maintenance-related savings when used in an industrial-type application.

Turning now to the schematic diagram of FIG. 8, the controller 32 (from FIG. 4) is shown with the keyboard and display 55 (FIG. 4), the real-time clock circuitry 58, the data multiplexer 59 and the RS-232 interface circuitry in detail. The keyboard and display 55 includes a 10-key membrane keypad 160 which is regularly scanned using a four-by-three switch matrix. To determine which, if any, of the membrane keys have been depressed, the microcomputer 53 latches logic "0"s from each of four bits from the microcomputer's C port into a latch 162, and it polls three bits from the same port to determine if any of the three bits are shorted to one of the latched four bits by the depression of the associated membrane switch. Pull-up resistors 164 bias the three polled bits so that a logic "1" is read at each polled bit if the associated four switches are not depressed.

The latch 162 and the microcomputer's C port are used in combination with the microcomputer's A port to control all of displays on the controller 32, including four 7-segment LED package displays 165-168. As discussed in connection with the breaker display 104 and input display 116 of FIG. 5a, the displays 165-168 are used to identify for the user or operator the particular input (at the termination block 38) and circuit breakers being addressed by the keypad. A network of eight Darlington transistors 170 is coupled to the output of the latch 162 to provide the proper drive level for display matrix for which the outputs (A-H) of the transistors 70 drive the row side of the matrix. The column side of the display matrix is driven by 8 bits which are provided directly from the A port of the microcomputer 53 and 8 bits which are provided indirectly from the A port, via latch 172, to enable each LED of the displays. Because the display does not require being display-refreshed more than 40 times per second, the microcomputer 53 is able to use its C port to monitor the keypad 160 and control the displays 165-168 without conflict.

The microcomputer 53 employs the latch 172 at the output of its A port to control stand-alone NO CHANGE, CLOSE and OPEN LEDs and four columns of a 7-by-5 dot matrix display 176. The A port of the microcomputer 53 directly controls stand-alone RUN, HALT, MANUAL, REVIEW, PULSE AND MAINTAIN LEDs and four columns each of 7-by-5 dot matrix displays 177 and 178. The displays 176-178 are used to indicate the contact positions of the 42 circuit breakers represented by the status indicator display 92 of FIG. 5a. The three displays 176-178 are configured so that only four columns of each are used; thereby providing 28 LEDs on each part so that the 84 required displays (two per circuit breaker) are accommodated.

A variety of staple components may be used to implement the circuit illustrated in FIG. 8. For example, the latch 162 may be implemented using a 3-8 74HC137 encoder-type IC, while the latch 172 may be implemented using a 74HC373-type IC. The displays 165-168 may be implemented using a HDSP7503-type part, and the displays 176-178 may be implemented using a HDSP4701-type part. The RUN LED is preferably implemented using a green HLMP-1790 part, and all other stand-alone LEDs are preferably implemented using a red HLMP-1700 part. Each LED type is available from Hewlett Packard Co.

Conventionally, displays are controlled by sequentially turning on one digit or display group at a time, but repetitiously and sufficiently rapid so that all devices appear to be on simultaneously. The requisite driving current (or power) for such conventional displays is proportional to the number of segments that are turned on in each display device. Accordingly, as each display is sequentially switched, the amount of current drawn from the power supply can vary significantly. For example, no current flows if all segments are off, while the maximum current flows if all segments are on. The power supply in such conventional displays must, therefore, be able to supply the peak value of the current, even if the average value is much less.

The display design of the present invention provides a significant improvement over this deficiency of the prior art. The display on the controller 32 is preferably designed and controlled to provide a significant reduction of peak power usage. This design multiplexes the display elements by grouping segments together from different displays, rather than treating each display as a group. If the variation from minimum to maximum is kept as small as possible, the peak value of current is reduced, allowing a smaller and lower cost power supply to be used.

In accordance with the display design described above, attached hereto is an Appendix A which illustrates a table for controlling the LEDs of the display. The table includes 128 status entries defined by 16 rows and 8 columns. The entries are grouped to multiplex the display elements by grouping LED segments together from different displays to lessen power usage as described above. Preferably, two pairs of rows at a time are read by the microcomputer and written out the parallel buses to update the status of each corresponding LED. For example, the first row includes: two bits to designate the proper status of circuit breaker 16—one bit is for its OPEN LED and the second bit is for its CLOSED LED; two bits to designate the proper status of circuit breaker 15—one bit is for its OPEN LED and the second bit is for its CLOSED LED etc. The OPEN and CLOSED LEDs are either both off or one of them is on; therefore, only three of the four states provided by each pair of circuit breaker status entries are used.

The second row of the table includes: a bit to designate the proper status of segment A of the 7-segment display 4 (D4Sa) (display 4, e.g., corresponds to display 168 of FIG. 8); a bit to designate the proper status of segment A of display 3 (D3Sa); ... ; two bits to designate the proper status of circuit breaker 30—one bit is for its OPEN LED and the second bit is for its CLOSED LED; etc. The bottom two rows of the table include the proper status of the labeled LEDs on the display, such as Maintain, Pulse, Review, etc. Since all segments in these groups will never by on, arranging the devices in this manner results in a lower peak current for the worst-case condition.

Also within the Appendix A and below the table is a program written in MC68HC05 assembly language code which may be used as a basis for controlling the display using the table of Appendix A in the above described manner, and with the microcomputer updating the LEDs at about 40 Hertz.

Certain ones of the C port peripheral bits may be used to program and read the EEPROM 57, which may be implemented using an X24C16 type IC, and to reset the microcomputer 72 of the termination board when necessary. Also, a reset IC 174, such as an MC34164 IC, along with conventional RC timing circuitry may be used to reset and interrupt the microcomputer 53 upon power-up and when power decays during power down or due to other low voltage occurrences.

The real-time clock circuitry 58 is optional to the remaining circuitry of the controller 32 and may be used to provide time-based circuit breaker control functions. For example, the microcomputer 53 and the real-time clock circuitry 58 may be programmed by the programmer station 66 (FIG. 4) so that the real-time clock is polled by, or interrupts, the microcomputer at one or more prescribed periods to inform the microcomputer 53 that it is time to open or close a current path associated with a certain circuit breaker. In response to this type of prompt, the microcomputer 53 commands the designated circuit breaker to open or close its associated current path, provided that a command of a higher priority for the same circuit breaker was not received by the microcomputer 53 before the prompt occurred.

Commands of various priorities which may be received by the microcomputer 53 for the same circuit breaker, in addition to the aforementioned programmed prompt from the real-time clock, include a variety of commands sent through the termination board 38 (FIG. 4), commands received from the programmer station 66 (FIG. 4) and commands received from the keyboard and display 55 (FIG. 4). It is preferred that the order of priority for conflicting commands is that: commands received from the keyboard and display 55 are treated as the most important due to servicing requirements; commands received from the programmer station 66 are treated as the second most important since servicing may also be performed from the programmer station 66; commands sent through the termination board 38 are treated as the next most important; and commands prompted by the real-time clock are treated as the least important since they are likely to be representative of a previously desired mode and, therefore, requiring an override via one of the higher priority command paths.

The real-time clock circuitry 58 is preferably implemented using a 3.0 Volt Lithium battery 202 to backup an MC68HC68T1-type real-time clock IC (integrated circuit) 200. A pair of LM393A-type amplifiers 204 may be used to monitor the battery 202 by comparing the voltage level of the battery 202 to a stable reference voltage level (Vref), e.g., about 2.3 Volts, at lead 206. For additional information concerning the implementation of the real-time clock circuitry 58, reference may be made to the data sheets and application notes for the MC68HC68T1 IC, available from Motorola, Inc.

The data multiplexer 59 is used by the microcomputer 53 to route data to and from both the programmer station 66 and the gate array 60 of the interface driver board 34. Data is passed to and from the programmer station 66 using a conventional RS-232 interface circuit 61, e.g., using a LT1180-type IC, while the data passed to and from the gate array 60 is processed using an asynchronous, serial-data protocol. As depicted in FIG. 8, data is passed to and from the microcomputer 53 via its RDO and TDO ports through the data multiplexer 59, which is preferably implemented using a 74HC4052-type IC. A peripheral bit on the microcomputer 53, depicted as CHEN, is used to select (or "enable") one of two channels through the data multiplexer 59. The first channel couples the TDO and RDO ports of the microcomputer 53 with comparable ports of the gate array 60 of the termination board 38, and the second channel couples the TDO and RDO ports with the transmit and receive ports of the RS-232 interface circuit 61. Another peripheral bit on the microcomputer 53, depicted as EN, is used to enable the RS-232 interface circuit 61 so that its CTS and RTS signals are inactive when the RS-232 interface circuit 61 is not being used The microcomputer 53 communicates with the microcomputer 72, with the former acting as the master and the latter acting as the slave and with each microcomputer 53 and 72 employing a conventional crystal oscillator circuit 161a or 161b which drives the respective microcomputer at 3.6864 Mega-Hertz. Three of the bits from the D port of the microcomputer 53 may be respectively employed as the data transmit, data receive and synchronous clock paths for communication with the microcomputer 72 of the termination board. For example, using the MC68HC05-type microcomputers to implement the microcomputers 53 and 72, the MISO (master-in-slave-out), MOSI (master-out slave-in), SCK (synchronous clock) and SS (slave select) microcomputer pin-outs (FIGS. 8 and 11a) provide an adequate interface. The protocol preferably includes error detection and error correction schemes to prevent erroneous messages from causing the interface driver board 34 to execute an incorrect command. For example, if an erroneous message is received by the interface driver board 34, the protocol detects the error and corrects it in a subsequent message from the controller.

Figure 9A:
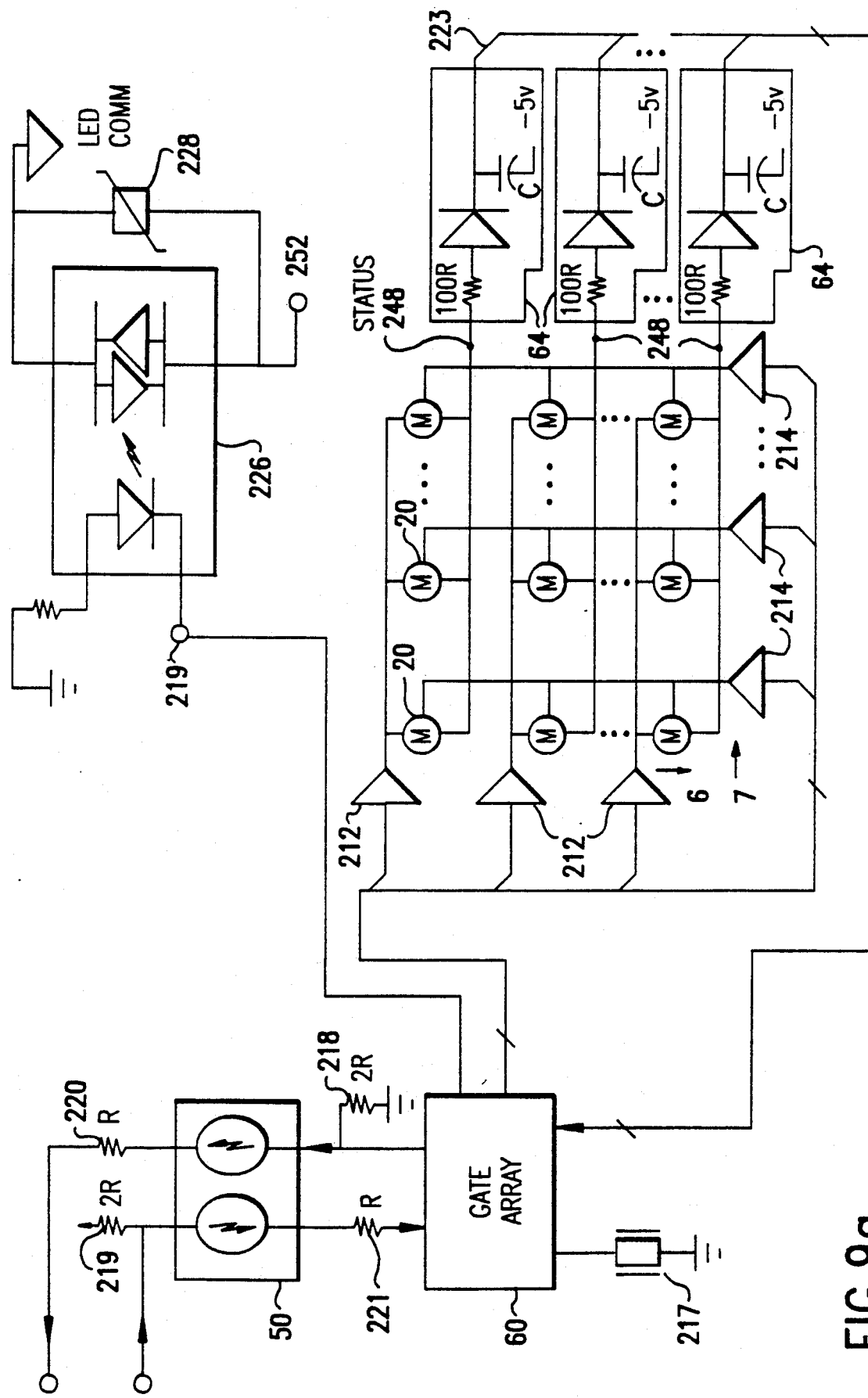
FIGS. 9a-9c comprise a schematic diagram of the interface driver board shown in FIG. 4.
Figure 9B:
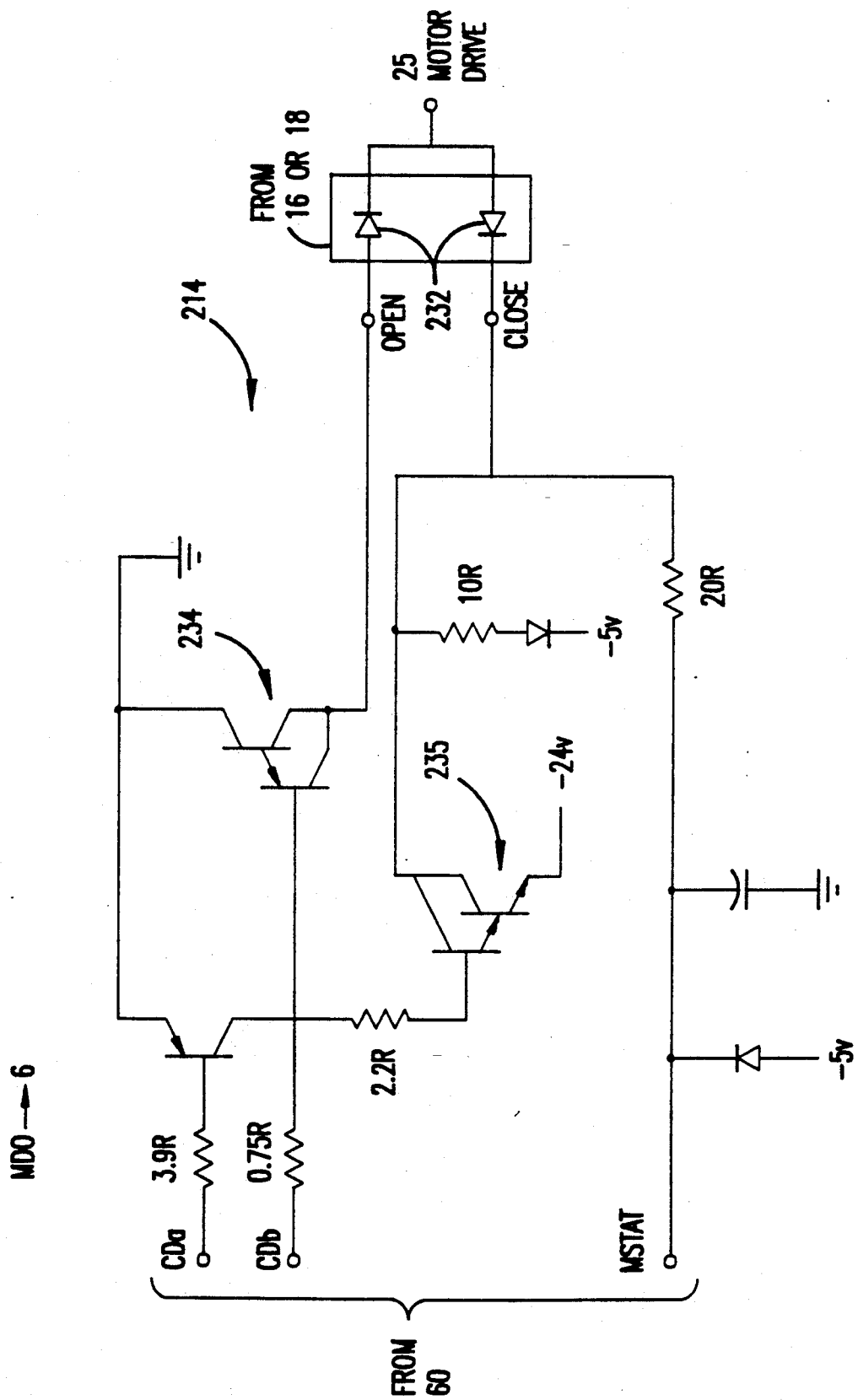
Figure 9C:
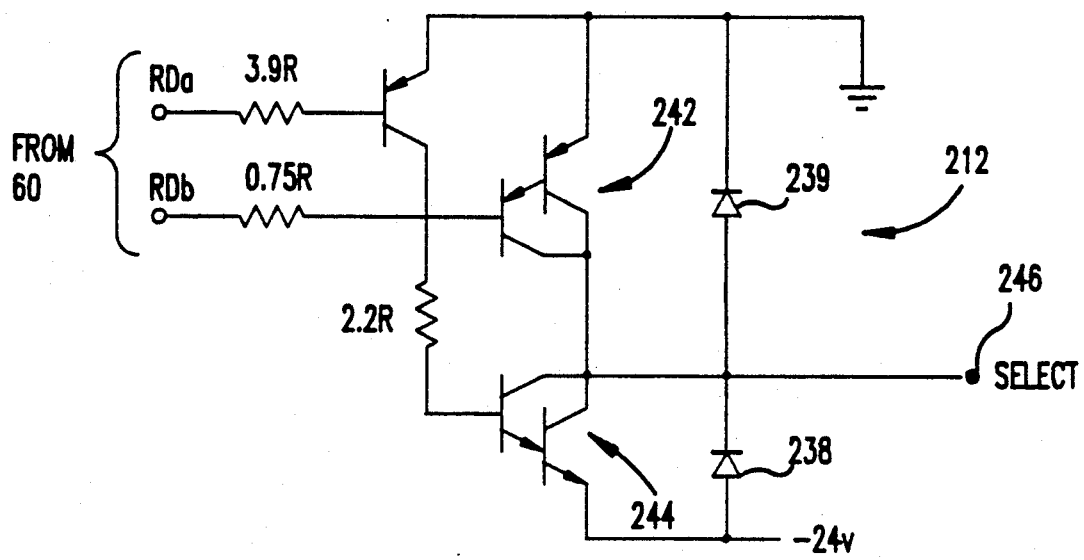

FIGS. 9a-9c illustrate the interface driver board 34 of FIG. 4 schematically. The optical isolator 50, the gate array 60 and the status filters 64 are depicted as in FIG. 4. However, the representative amplifiers 62 from FIG. 4 are shown as circuit breaker row drivers 212 and circuit breaker column drivers 214. The other elements shown will be introduced and discussed in turn.

The interface driver board also includes a conventional oscillation circuit 217 which is used to provide the appropriate clock (e.g., a 455 kHz clock) for the gate array. For further information regarding the gate array 60, reference may be made to the data sheets published and made available by ACTEL, Inc. of Sunnyvale, Calif.

The optical isolator 50 is preferably implemented using two NEC2501-1 type parts with resistors 218-221 (R = 1k Ohm in FIGS. 9a-9d) providing the appropriate bias at the inputs and outputs of the optical isolator 50.

The circuit breaker row and column drivers 212 and 214 are configured seven down and six across, respectively, for controlling the motors of the forty-two circuit breakers 20 of FIG. 1a. Each row driver 212 is used to select (or enable) the circuits of six circuit breakers, while each column driver 214 is used to actuate the circuit breaker motor which is selected by the intersecting row driver 212.

Each status filter 64, which is used to report whether the contacts of the circuit breaker are open or closed, are operative when two conditions are present: the corresponding column driver 214 must select the column of circuit breakers in which the status filter 64 is associated; and the gate array 60 must actuate a triac circuit (e.g., a Siemens IL420) to provide, simultaneously, a momentary common path (LED COMM 15 on the bus boards 16 and 18) for the input ports of the optical isolators 230 (FIG. 9d) of all forty-two of the circuit breakers 20. The gate array 60 then reads all six statuses and determines which of these statuses are to be sent to the controller 32. The circuit breaker contacts are preferably monitored using a lead 231 (FIG. 9d) connected to the load terminal of the circuit breaker 20.

A varistor 228, such as a GE-V30DLA2, is coupled across the output ports of the triac circuit 226 to provide circuit protection against voltage and current transients.

In FIG. 9b, the column driver 214 is shown as being controlled by the gate array 60 using CDa, CDb and MSTAT leads so as to drive the motor on the selected circuit breaker 20. The diodes 232 through which the motor drive signal passes are located on the bus board 16 or 18 to allow a current path through only one circuit breaker 20. The CDa and CDb signals from the gate array 60 are controlled in a polarized manner between −5 Volts and common so that if either signal is absent, the designated circuit breaker 20 cannot be commanded to open or close its contacts.

The MSTAT signal is used to indicate whether or not a motor is present. This type of status check operate in substantially the same manner as the statuses from the associated circuit breaker load, as described above. The MSTAT signal is operative when the corresponding column driver 214 selects the column of circuit breakers associated with the circuit breaker under test. The gate array 60 then reads all six MSTAT signals and determines which of these signals are to be sent to the controller 32.

In FIG. 9c, the row driver 212 is shown as being controlled by the gate array 60 using RDa and RDb leads so as to select the appropriate row of circuit breakers 20. The diodes 238 and 239 are used to mitigate the effect of transient signals received from the bus boards 16 and 18.

Figure 9D:
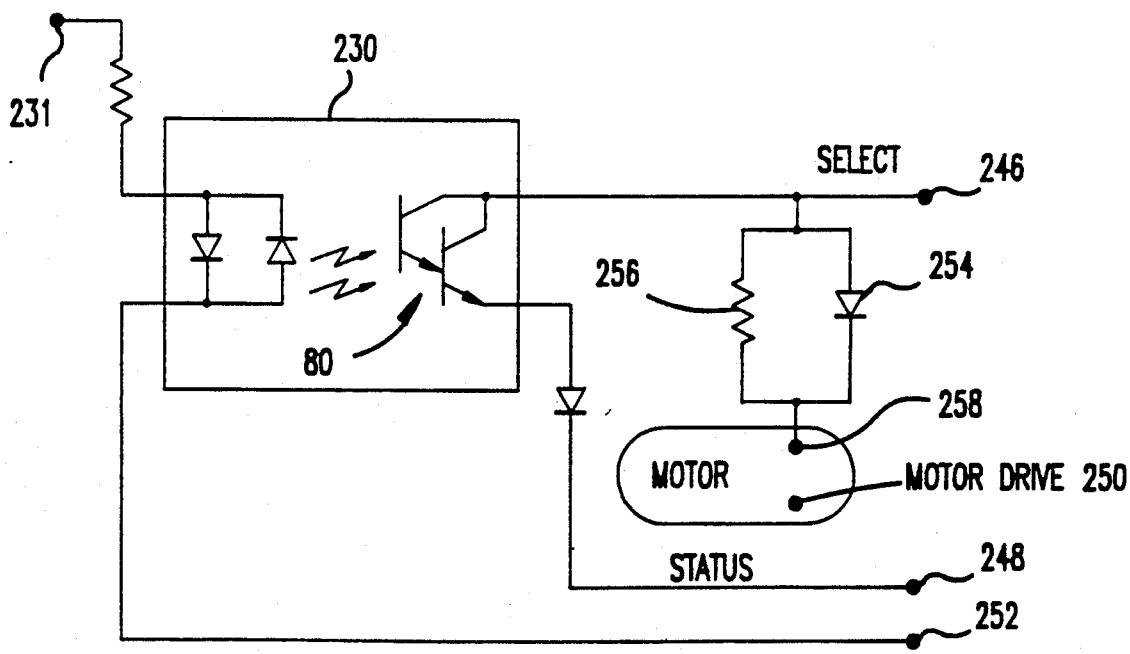

FIG. 9d, which illustrates the electrical control portion of the preferred remote control circuit breaker 20, depicts four leads carried by each plug-in connector 22 of the bus boards 16 and 18. They include: the select lead 246, status lead 248, motor drive lead 250 and an isolator enable lead 252; the signals of each lead performing the previously described functions.

A parallel resistor/diode arrangement 254/256 serves two functions. The diode 254 may be used to provide current flow in a unilateral direction, while the resistor 256 is used to control the power provided from lead 258 to the motor of the circuit breaker 20. The value of the resistor 256 is selected according to the necessary current specified to operate the motor. In the event that the lead 258 is used to control a plurality of poles, e.g., for controlling two or three circuit breaker poles, the resistance required will vary. For single pole operation by the FK130S-10300 Mabuchi motor exemplified in the above referenced copending application, the value of the resistor 256 is preferably 12 Ohms.

Figure 9E:
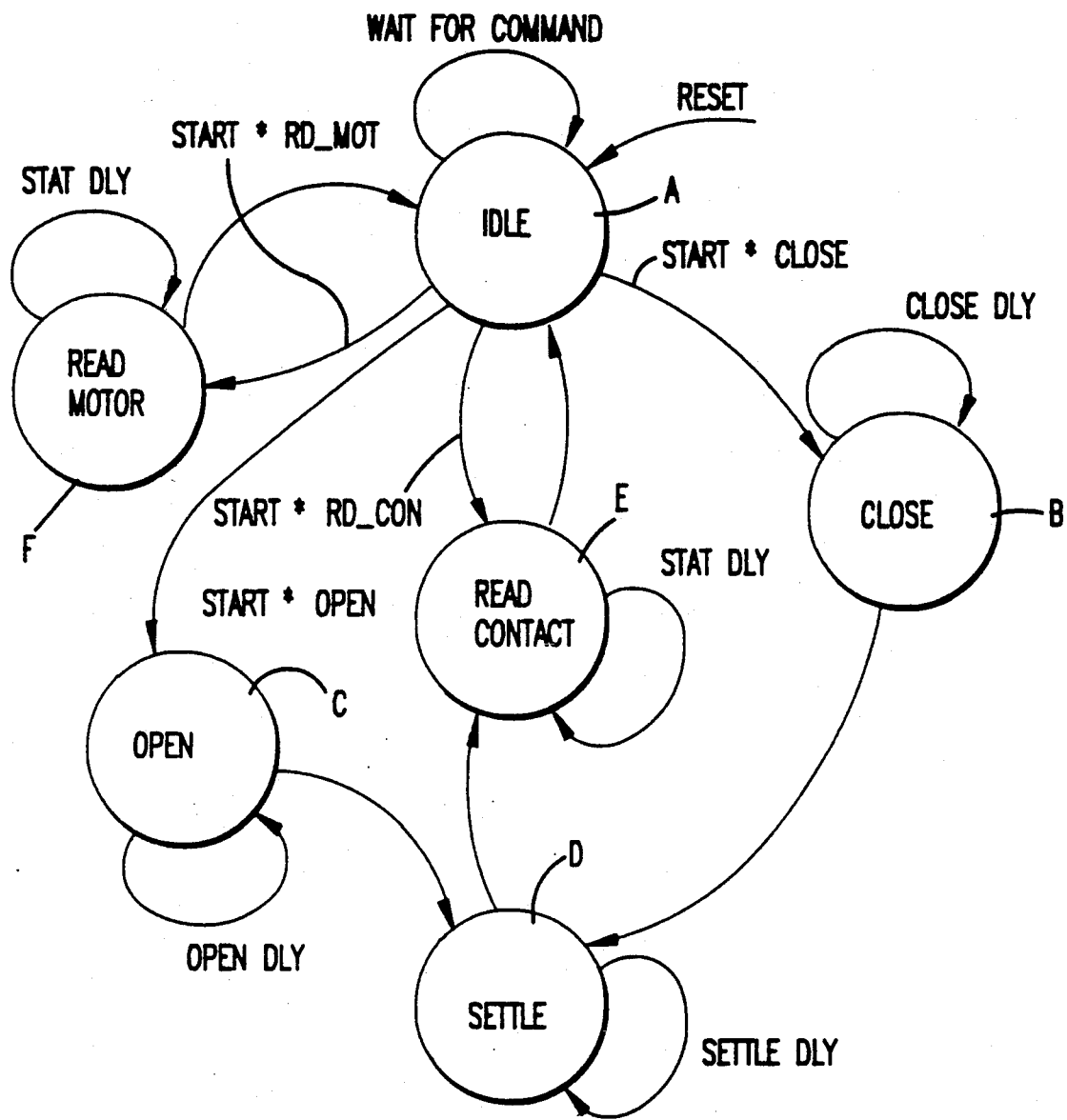

FIG. 9e is a state diagram which depicts the power driver operation of the gate array illustrated in FIG. 9a. The diagram includes six states, depicted A-F. Beginning at state A, the gate array waits for a command from the controller. The command may be one of four commands: a close contacts command which instructs a particular circuit breaker to close its contacts, depicted by the sequence of states A-B-D-E-A; an open contacts command which instructs a particular circuit breaker to open its contacts, depicted by the sequence of states A-C-D-E-A; a read contacts command to determine if a particular circuit breaker's contacts are closed or open, depicted by the sequence of states A-E-A; and a read motor command to determine if the motor is present, depicted by the sequence of states A-F-A. The state delay associated with state D is to allow the contacts sufficient time to settle before reading the status of the contacts at state E. The state delays associated with states B and C are to allow the contacts sufficient time to react before commencing the settling-time delay of state D. The state delay associated with states E and F are to provide the gate array with the appropriate timing response before reporting to the controller with the requested status.

Figure 9F:
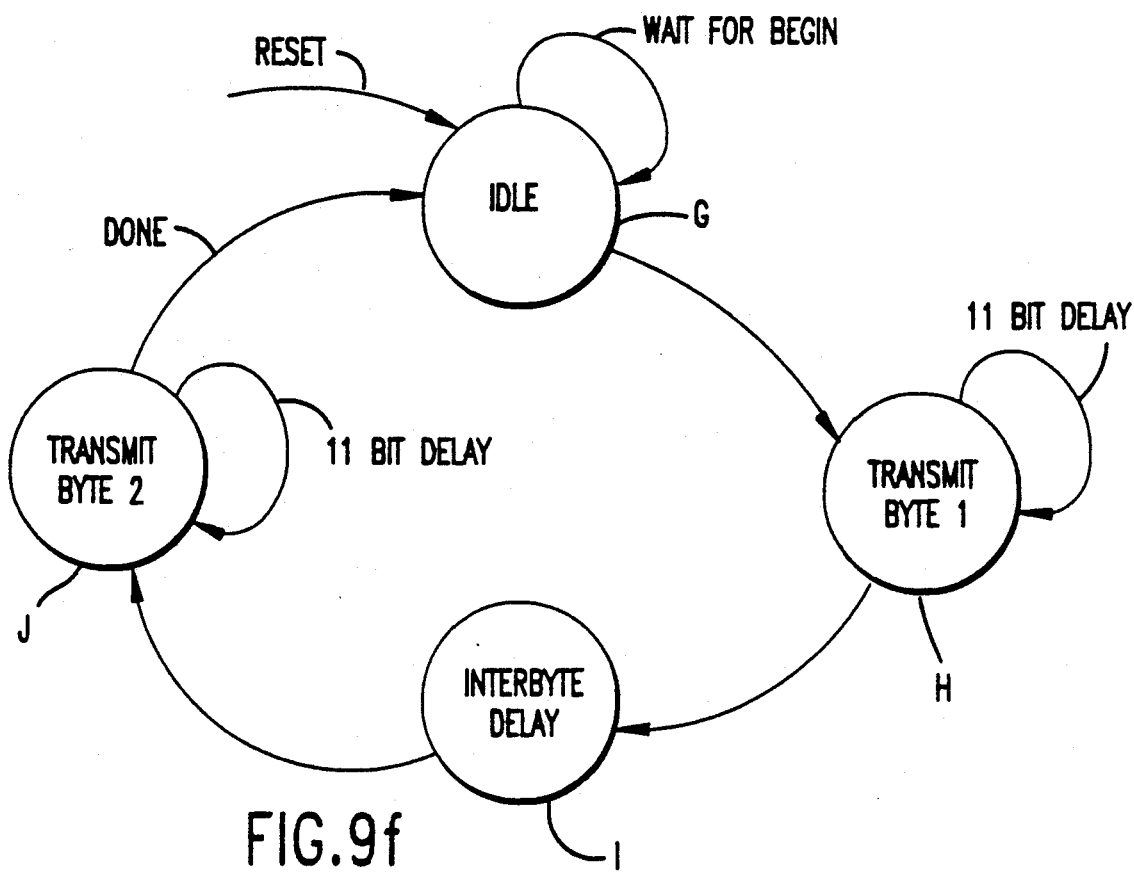

FIG. 9f depicts the message transmit operation of the gate array illustrated in FIG. 9a in state diagram form. The diagram includes four states, depicted G-J. Beginning at state G, the gate array waits for flow from states E and F for transmitting a contact status or motor status response. Once received, flow proceeds to block H where the first of the two bytes is transmitted. Since each byte consists of a start bit, 8 data bits, a stop bit and a parity bit, an 11 bit delay is illustrated. From state H, flow proceeds to state I where the gate array waits for prescribed interbyte delay before moving to state J. At state J, the second of the two bytes is transmitted, and, after the 11 bit delay, the transmission is complete.

Figure 9G:
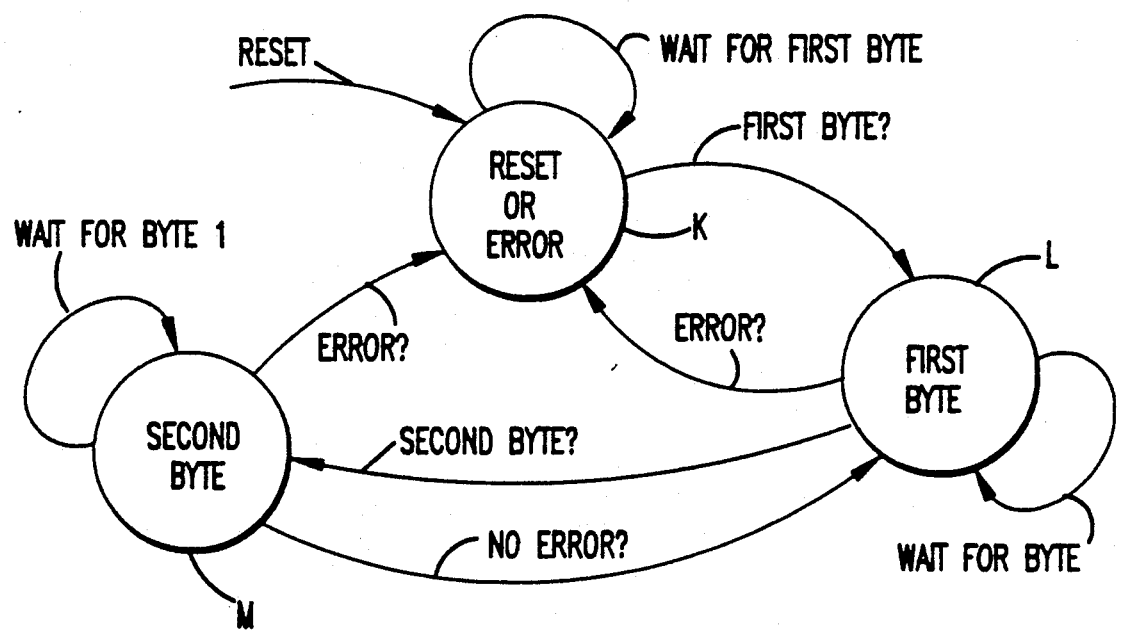

FIG. 9g depicts the message receive operation of the gate array illustrated in FIG. 9a in state diagram form. The diagram includes states K, L and M. Beginning at state K, the gate array is reset and flow proceeds to state L to wait for reception of the first byte of the two-byte message from the controller. If the first byte is received with an error, flow returns to state K for corrective action (e.g., a reset and a communication to the controller that an error occurred). Once the first byte is received, flow proceeds to state M where the gate array waits for the second of the two bytes. Once the second byte is received, the gate array determines whether or not the second byte was received with an error. If the second byte is received with an error, flow returns to state K once again for corrective action. Otherwise, the reception of the second byte completes the reception mode for a two-byte message and flow returns to state L.

The gate array 60 is preferably implemented using an ACTEL A1020APL84I-type gate array which is fused according to the information attached hereto in Appendix B, which includes parts I-IV. Part I is the fuse file, which constitutes the main input to the ACTEL fusing program for the subject part. To save space, the file is presented with seven parallel columns of fusing data, which is read top to bottom/left to right. To actually use the file, the seven columns of data on each page must be converted to a single column on the far left of the page. Part II is a definition file which is also required to program the subject ACTEL device. Part III is a gate array pin list which is also presented to the ACTEL fusing program so that the program can determine which pins correspond to which device circuits. The parenthetical comments to the right of the PIN numbers may be used to correlate the listed PIN numbers to the schematics of FIGS. 9a, 9b and 9c.

Part IV consists of four sheets of commands sent from the controller and proper responses from the gate array. The first sheet includes 42 commands which may be used to instruct each of the 42 circuit breakers to report as to whether or not a motor (or circuit breaker) is present in the load center. The second sheet includes 42 commands which may be used to instruct each of the 42 circuit breakers to report as to whether the associated circuit breaker contacts are open or closed. The third sheet includes 42 commands which may be used to instruct each of the 42 circuit breakers to open the associated contacts; the response by the gate array is one which indicates whether the contacts are open or closed after the controller command is executed. The fourth sheet includes 42 commands which may be used to instruct each of the 42 circuit breakers to close the associated contacts; the response is similar to that for the open command in that the gate array indicates whether the contacts are open or closed after the controller command is executed.

FIGS. 9h-9k comprise a series of timing diagrams which respectively depict the receive message, open contacts, read status and read motor timing operations of the gate array. There are fourteen signals shown in the figures: RCV is the receive signal (and gate array pin) which is used by the gate array to receive a two byte message from the controller; ENABLE SAMPLE is an internal signal to the gate array which tracks the timing for receive data sent between the controller and the gate array; XMIT is the send signal (and gate array pin) which is used by the gate array to transmit a two byte message to the controller; DRVTRIAC corresponds to the isolator enable lead 252 and is an active low signal (and gate array pin) which is used to drive the triac circuit 226 when the gate array is preparing for a status read; DRVCOND corresponds to the signal 219 of FIG. 9 and is driven low when the status is not actually being read—when this signal is low, the status filters drive the inputs to the gate array; PSEL#-DRV and NSEL#-DRV are active low signals which are respectively used to drive the select or row drivers 212 during status/motor read and open command execution (where # designates one of the six rows); PMOT#-DRV and NMOT#-DRV are active low signals which ar respectively used to drive the PNP and NPN motor or column drivers 214 during open command execution and close command execution (where # designates one of the seven columns); PS[] represents the combination of all PNP select or row power transistor drivers 212; NS[] represents the combination of all NPN select or row power transistor drivers 212; PM[] represents the combination of all PNP motor or column power transistor drivers 214; and NM[] represents the combination of all NPN motor or column power transistor drivers 214. The PS[], NS[], PM[] AND NM[] are denoted in hexidecimal form in each of the diagrams.

Figure 9H:
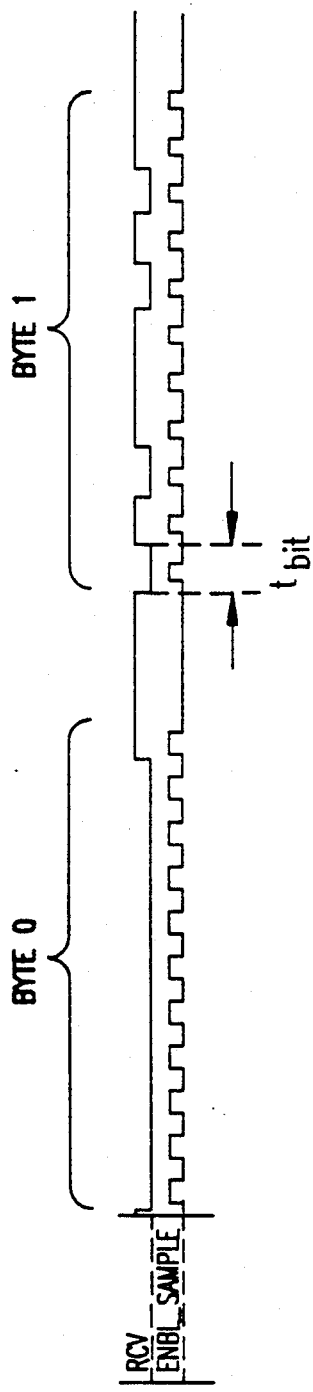

FIG. 9h illustrates byte 0 and byte 1 being received by the gate array from left to right, with the least significant bit being on the left and the most significant bit being on the right. The enable sample signal being high indicates when the gate array latches in a bit from the receive signal. The bit definitions for each byte are the same. Each includes an active low start bit, a byte number bit (0 for byte 0 and 1 for byte 1), four data bits for the message, three check bits for detecting communication errors, a parity bit and an active high stop bit. The notation $t_{bit}$ represents 1/1200 second bit width for a 1200 baud rate transmission.

Figure 9I:
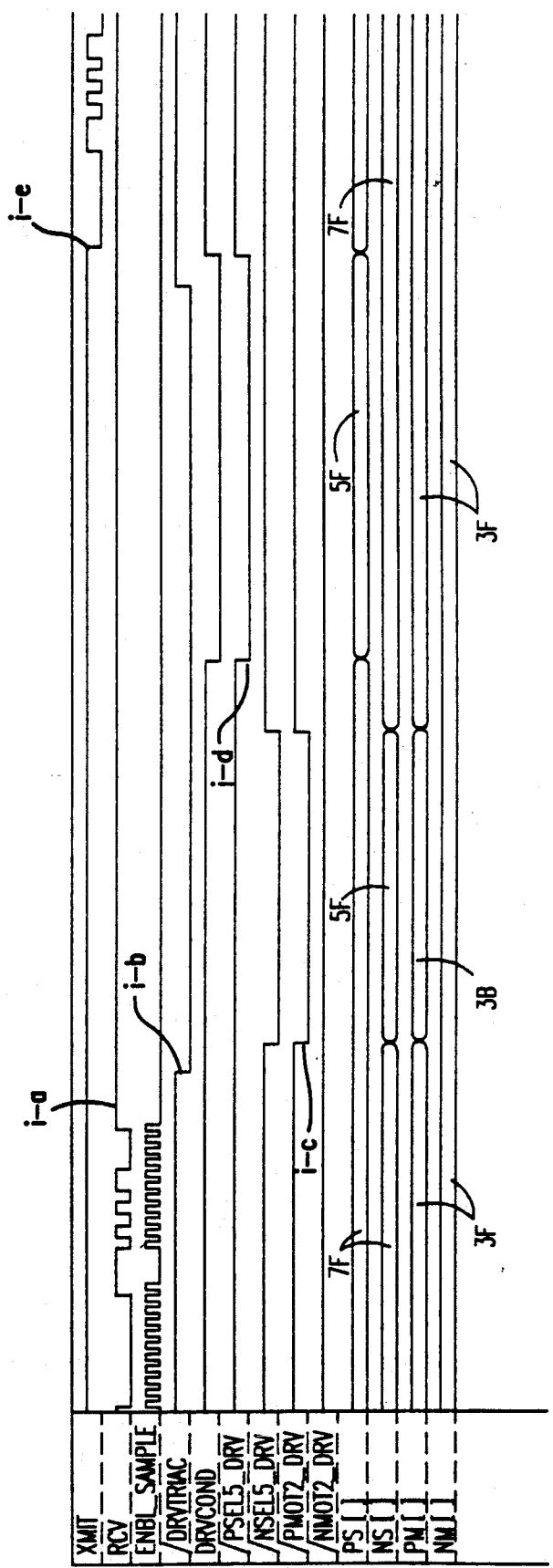
Figure 9:
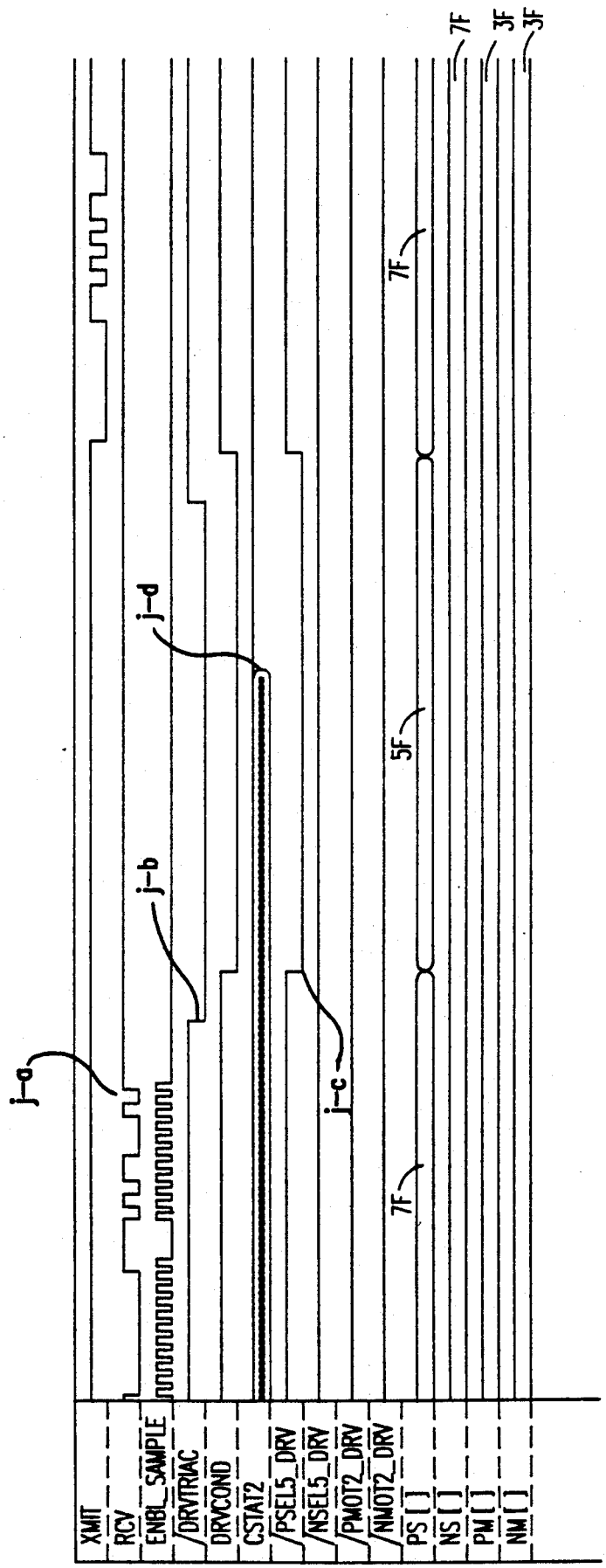

FIG. 9i illustrates the gate array timing when an open contacts command is being received and executed. At point i-a of the diagram, the two byte message or command is received by the gate array. At point i-b, the triac is enabled, and at point i-c the particular column and row drivers for the designated circuit breaker are enabled to open the circuit breaker contacts. The hexidecimal representation of NS[] and PM[] (5F and 3B) reflect one bit of the row drivers and one bit of the column drivers being low so as to select the correct circuit breaker from the circuit breaker array. At point i-d, the gate array prepares to read the status of the circuit breaker contacts, and at point i-e the gate array begins reporting the status of the circuit breaker contacts to the controller.

FIG. 9j illustrates the gate array timing when a read status command is being received and executed. At point j-a of the diagram, the two byte message or command is received by the gate array. At point j-b, the triac is enabled, and at point j-c the particular column driver for the designated circuit breaker is enabled to allow the CSTAT signal to read the selected filter. At point j-d, the gate array begins reading the status of the circuit breaker contacts, and at point j-e the gate array begins reporting the status of the circuit breaker contacts to the controller.

Figure 9K:
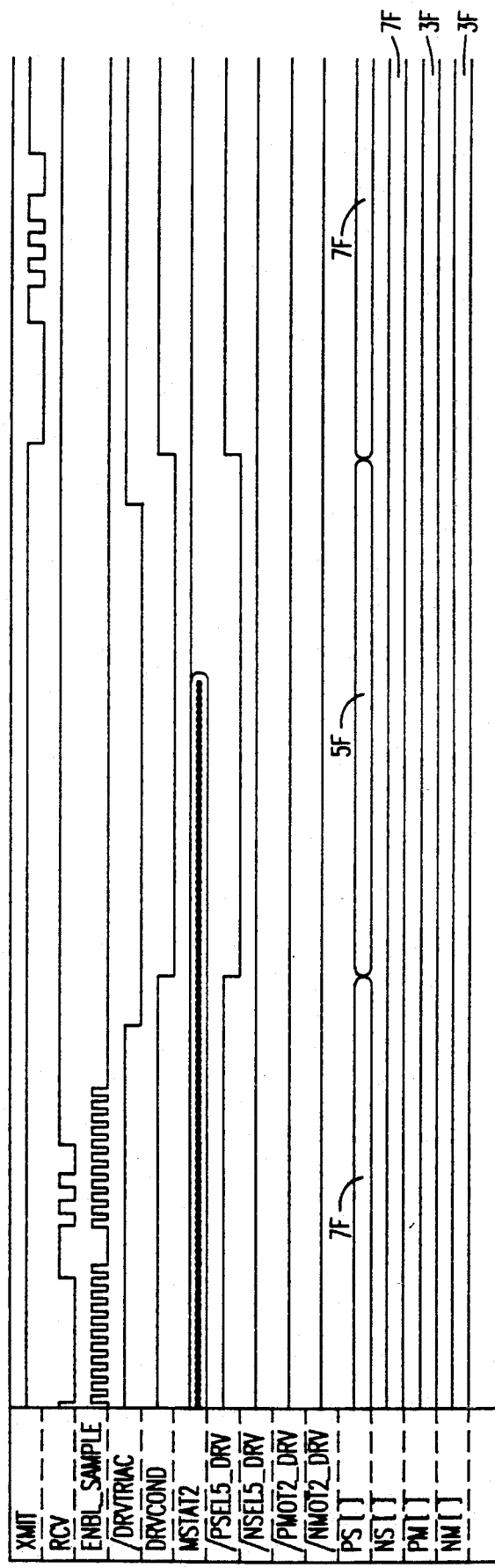
Figure 10B:
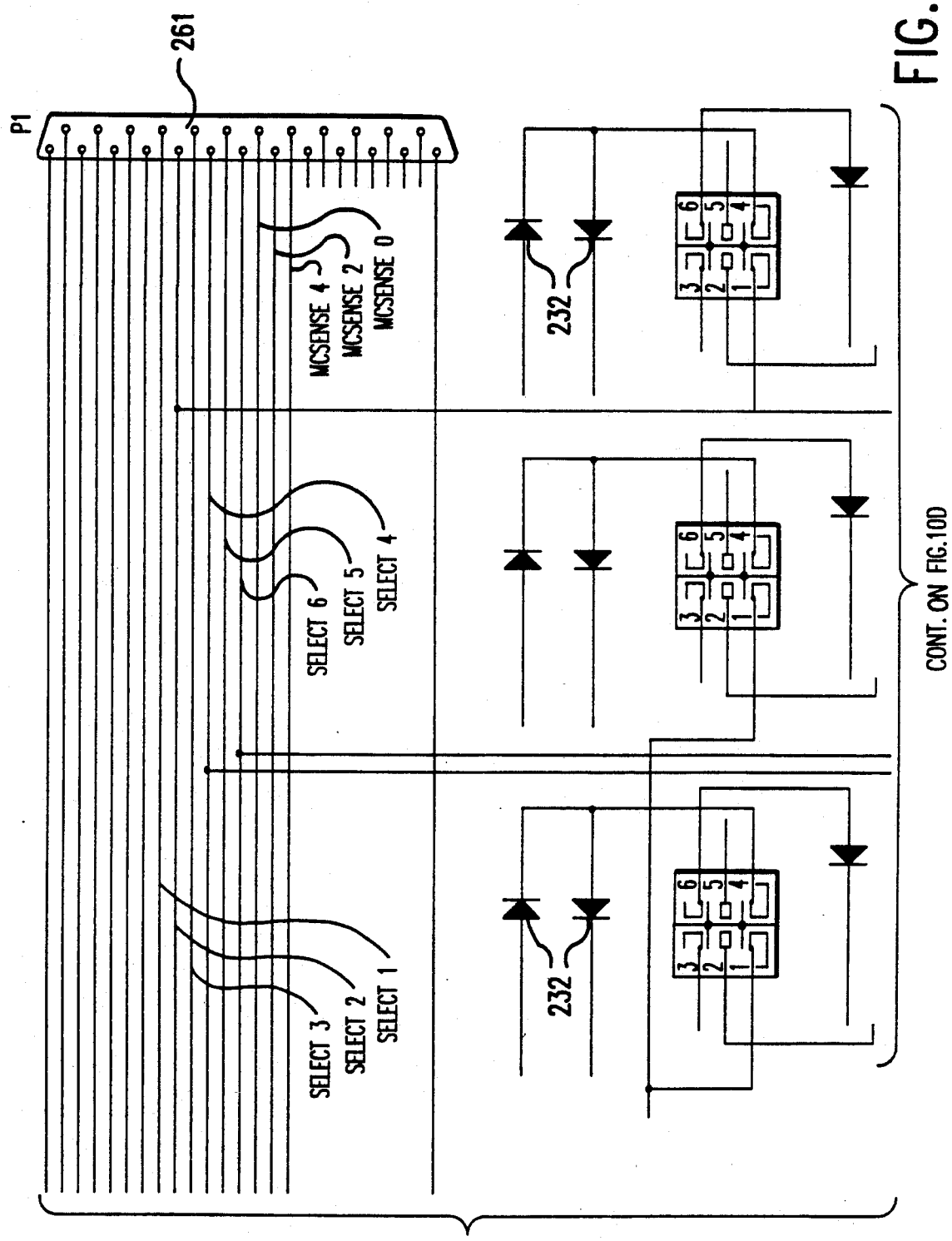
Figure 10D:
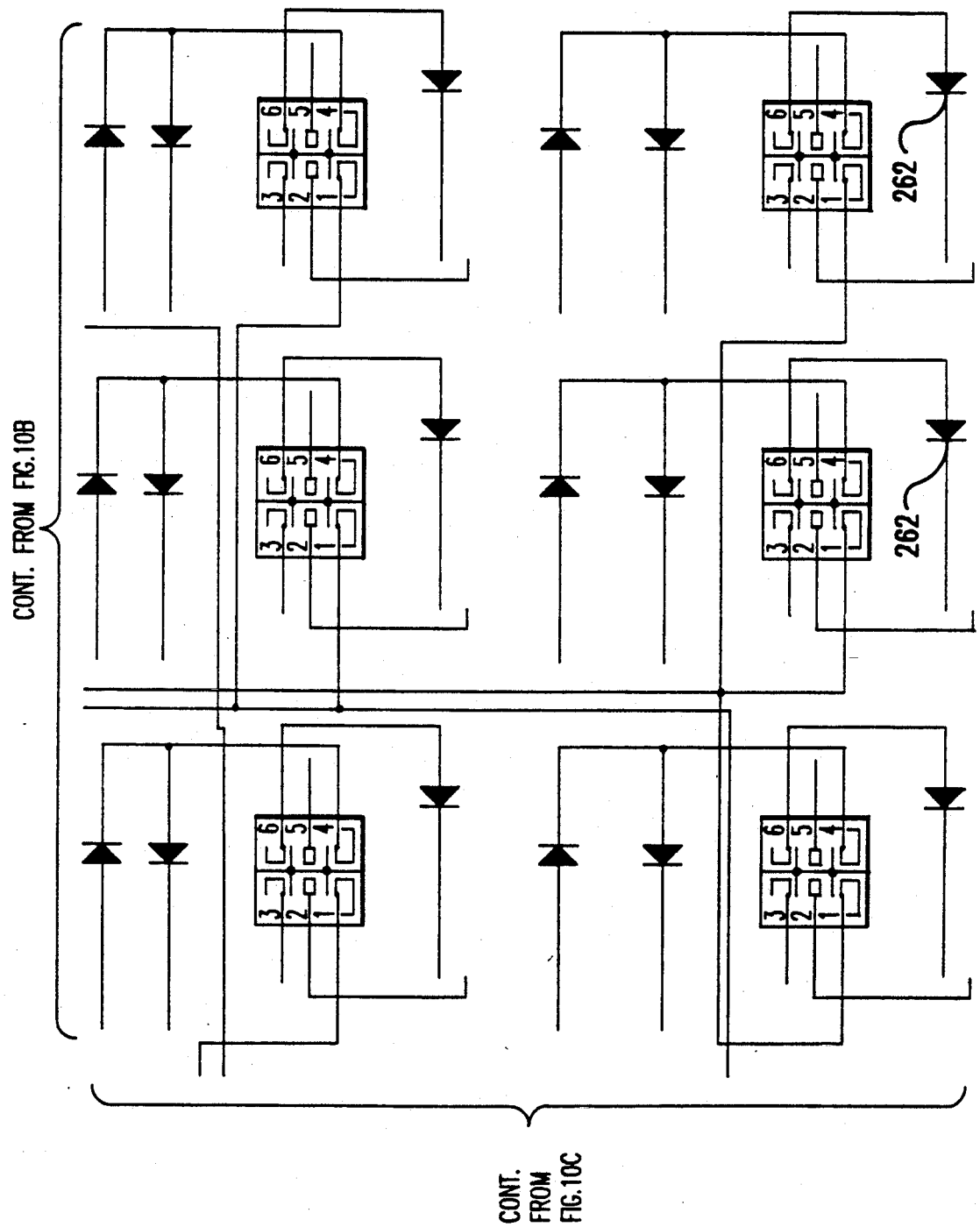

FIG. 9k illustrates the gate array timing when a motor read command is being received and executed. The only substantive difference between the signal transitions of the diagrams FIGS. 9j and 9k is MSTAT is used in place of CSTAT.

FIGS. 10a-d illustrate one of the identical bus boards 16 and 18 of FIG. 4 from a schematic perspective. Shown are connectors 22 for each of the remote control circuit breakers 20. Each connector 22 carries each of the four signals (the select lead 246, status lead 248, motor drive lead 250 and the isolator common lead 252) between the interface driver board 34 and the circuit breaker 20. The diodes 232 are also illustrated and discussed in connection with the circuit in FIG. 9b. The connectors 260 or 261 may be used to connect the bus board 16 or 18 with the interface driver board 34 at either the top or the bottom, respectively, of the load center 10. The diodes 232 are used to provide current blocking so that only one motor can be selected at a time, and the diode 262 is used to provide current blocking so that all the current must flow through the opto triac circuit 226, rather than through the other various available paths.

Figure 11A:
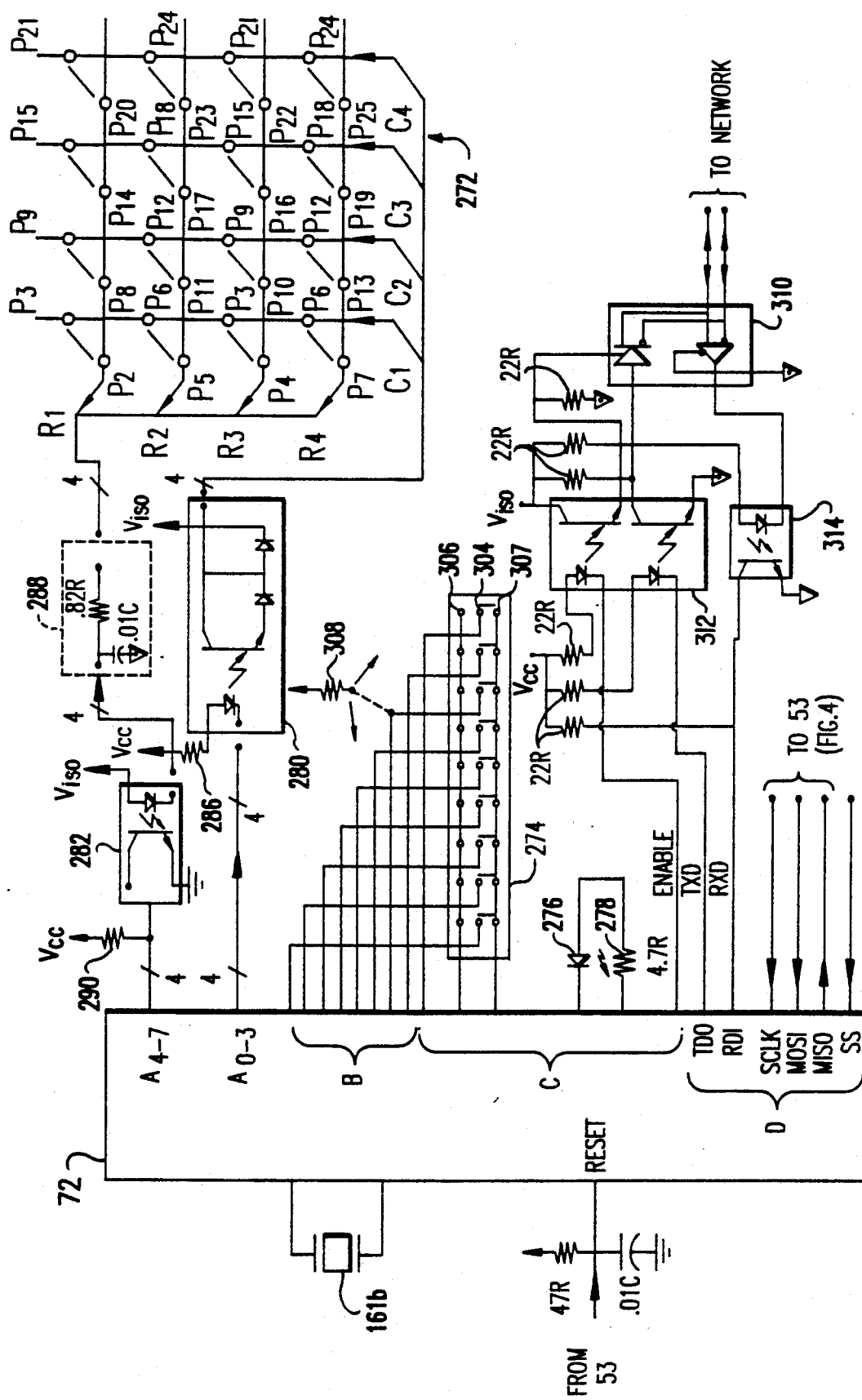
FIGS. 11a-11d represent various implementations of the termination board shown in FIG. 2 from a schematic perspective.
Figures 11B, 11C:
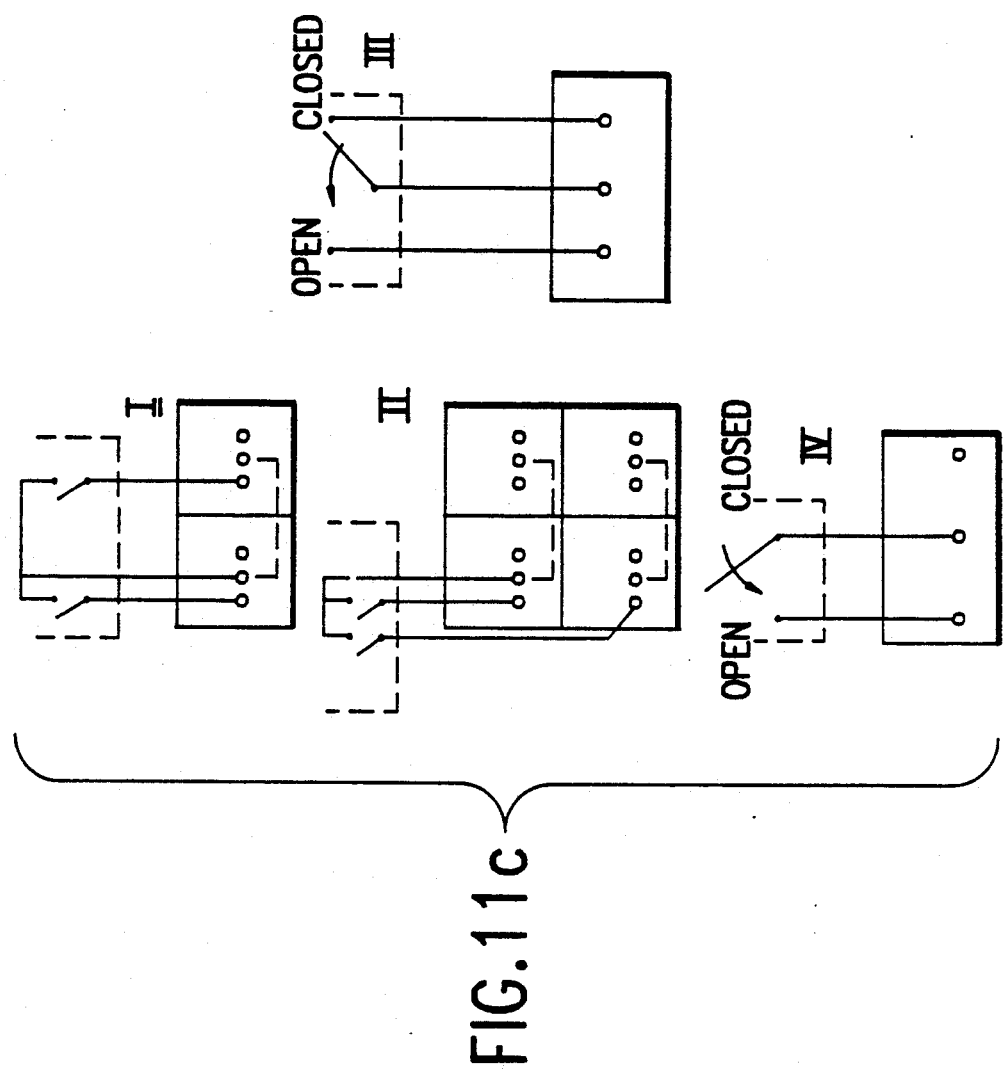

FIGS. 11a-11d represent various aspects of the termination board 38 in considerably more detail than FIG. 4. FIG. 11a, by itself, illustrates each of the components of the termination board 38 in schematic form, except for certain matrix circuitry 272 which is shown schematically in FIG. 11d. FIGS. 11b and 11c illustrate terminal blocks 270 (implementing the input terminals 54 of FIG. 4), which may be used for connecting dry-contact switches or relays to the termination board 38.

The microcomputer 72 of FIG. 11a, which may be implemented using the same type of IC as that used for the microcomputer 53 of FIG. 8, controls the termination board using ports A, B and C, along with certain designated bits from the D port for serial communication. The A port is used to scan or read the terminal blocks 270 (illustrated as part of the matrix circuitry 272) in a highly efficient manner, as will be discussed. The B port and the first three bits of the C port are used to read a set of nine trinary DIP switches 274. The C port may also be used for controlling a multi-color LED 276, via resistor 278, to provide diagnostic-related information regarding the operation of the termination board.

The matrix circuitry 272 is optically isolated from the remainder of the termination board 38 using a pair of quad NEC PS2501-4 ICs, opto-couplers 280 and 282, so as to isolate Vcc (and its common) from Viso (and its common) to protect the termination board circuitry from induced electrical noise received from the remote control devices connected to the terminal blocks 272 and to block the radiation of noise into the wiring. The A port bits A:0-3 are individually received at the anode side of the four inputs of the opto-coupler 280 and coupled past a pair of transient protecting diodes 284 to provide four optically isolated control bits C1 through C4, which are used to drive four columns of the matrix circuitry 272. The cathode side of each of the four inputs of the opto-coupler 280 is preferably connected to Vcc (+5 Volts) through a 820 Ohm pull-up resistor.

Four rows of the matrix circuitry 272 are read by the A port bits A:4-7 via four optically isolated control bits R1 through R4. Each of the control bits R1 through R4 is individually received at the collector side of an associated one of the four outputs of the opto-coupler 282 and coupled from a low pass filter circuit 288, which removes high frequency noise. From the low pass filter circuit 288, each control bit R1 through R4 is received at the anode side of a respective one of the four inputs of the opto-coupler 282, which couples R1 through R4 to the A port bits A:0-3. Each of the collector outputs of the opto-coupler 282 are pulled to Vcc via 1 k Ohm resistors 290.

In the matrix circuitry 272, C1 through C4, which are normally at a logic high, are alternately set low (0 Volts) while the microcomputer 72 scans each of R1 through R4 for each C1 through C4. If any switch input, e.g., defined by P2-P3 in the upper left corner of the matrix circuitry 272, is shorted, the microcomputer 72 is then able to detect that short by scanning R1 through R4.

Figure 11D:
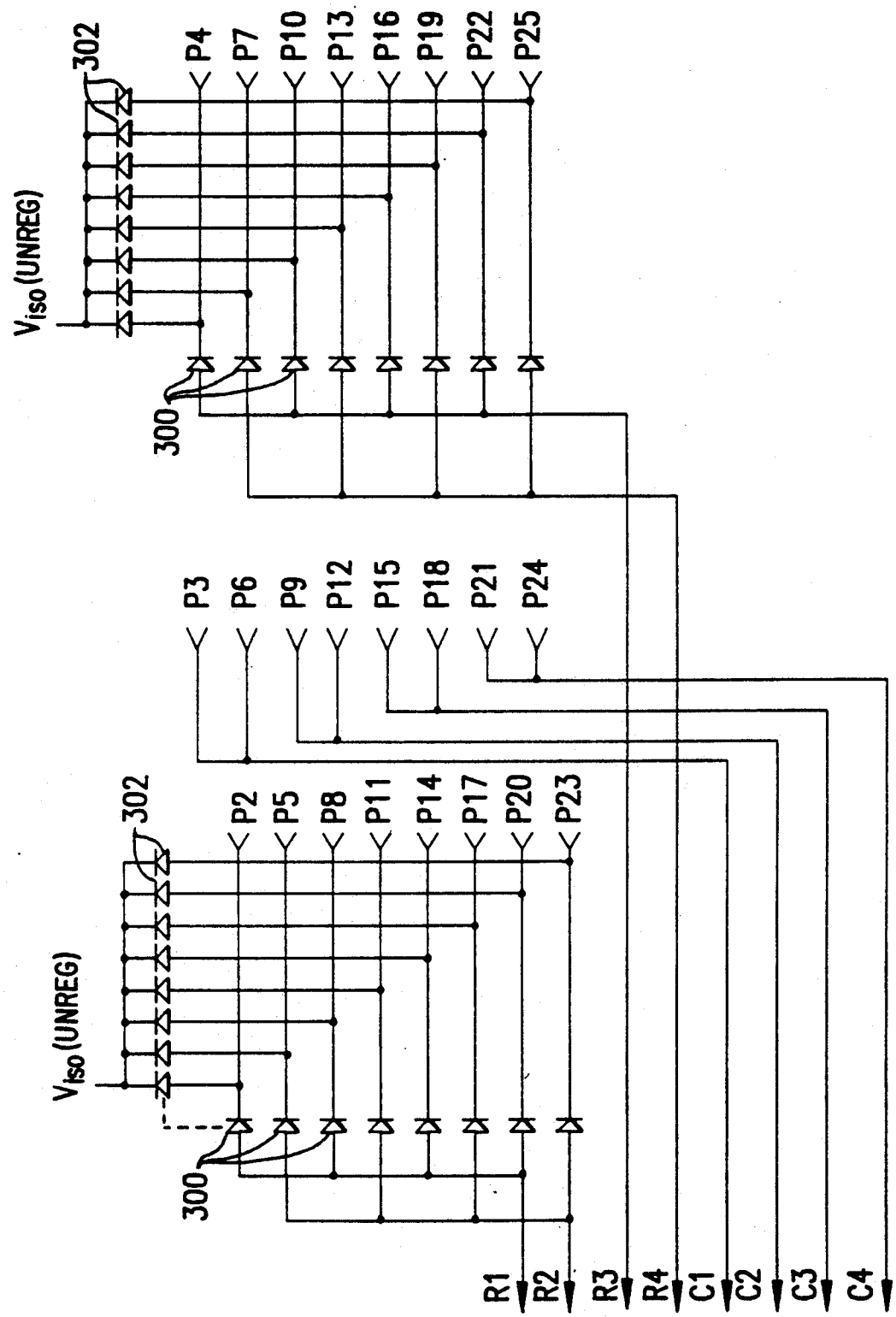

FIG. 11d illustrates the matrix circuitry 272 schematically, with each of the switch pairs (e.g., P2-P3, P8-P9, P17-P18, etc.) shown separated out for illustrative purposes. The diodes 300 are selectively placed to prevent the microcomputer 72 from falsely determining that one of the switch inputs is in the shorted state. Without the diodes 300, such a condition could occur if, for example, the adjacent three switch inputs (forming a square in the matrix) were each shorted simultaneously. The diodes 302 are used to provide transient protection.

FIG. 11b illustrates a preferred manner of arranging the switch inputs, each of which is labeled with a circle around the respective number 1-8, such that a three-wire signal, having positive, common and negative (as previously discussed), may be received by each of the switch inputs to control one, or a set, of the circuit breakers 20. The terminals of each switch input, e.g., P2, P3 and P4, are designated in FIG. 11b to indicate the corresponding switch input in FIGS. 11a and 11d.

FIG. 11c is used to illustrate the proper manner of connecting the signal wires to the switch inputs. Embodiment III illustrates a preferred way of wiring a three-wire pulsed (momentary) or maintained signal at a single one of the eight switch inputs, while embodiment IV illustrates a preferred way of wiring a two-wire maintained signal at a single one of the eight switch inputs. The embodiments depicted I and II respectively illustrate an acceptable manner of connecting two two-wire signals and an unacceptable manner of connecting a three-wire signal (or two two-wire signals) to the switch inputs. In order to avoid false switching or undetected switching, no three-wire signals should be connected across vertical terminal blocks 270; thus, embodiment I is proper and embodiment II is improper. The dotted lines in each terminal block depict a shared common between the wire terminals, and each terminal block includes only three wires terminals for a total of 24 possible wire terminals.

Eight of the nine trinary DIP switches 274 are used to program the microcomputer 72 for the kind of remote control signal (e.g., pulsed or maintained) which is to be received at each of eight input terminals (FIGS. 11b and 11c), as previously discussed. As an alternative, the function of the first eight trinary DIP switches 274 may be implemented by programming the microcomputer 72 through the controller 32 (e.g., via the programmer station 66) or through one of the input terminals (assuming that the microcomputer 72 has a known default mode for receiving this information). The remaining one of the trinary switches 274 is used to program the microcomputer 72 for the network configuration. For example, each of the three positions of the remaining trinary switch can be used to indicate point-to-point, multidrop (e.g., RS485-type) and a disable network communication mode, respectively.

Each of the trinary DIP switches 274 is read by the microcomputer 72 by scanning the center terminal 304 of the switches 274, while, alternately, driving a logic low on each outside terminal 306 or 307. By pulling up to Vcc each of the center terminals 304 using pull-up resistors 308, the microcomputer 72 is able to determine the position of each trinary switch 274.

As previously discussed in connection with the microcomputer 53 of FIG. 8, the SCLK, MOSI, MISO and SS ports of the microcomputer 72 are directly connected with the corresponding ports of the microcomputer 53 of FIG. 8 to provide synchronous serial communication therebetween. Although not shown, a pair of diodes may be situated on each of the lines emanating from the SCLK, MOSI, MISO and SS ports to provide protection from both high and low level power transients.

The network drivers 68 of FIG. 4 are preferably implemented using an LTC-485 type IC 310, which is optically isolated from the microcomputer-related circuitry using NEC PS2501 type opto-couplers. The purpose of the optical isolation is to eliminate noise and ground-loop related problems. This conventional arrangement may include transient-resistant diodes to provide reliable and efficient RS485 type network capabilities for the system.

Figure 12D:
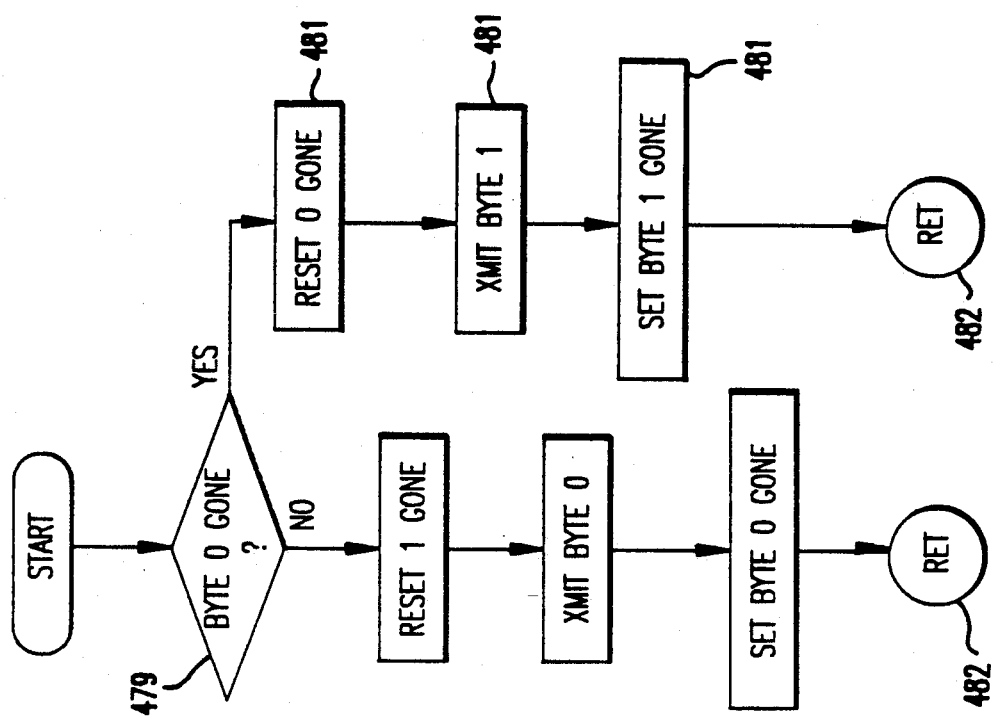
FIGS. 12a-12d comprise a flow chart which may be used to program the microcomputer shown in FIG. 8.
Figure 12A:
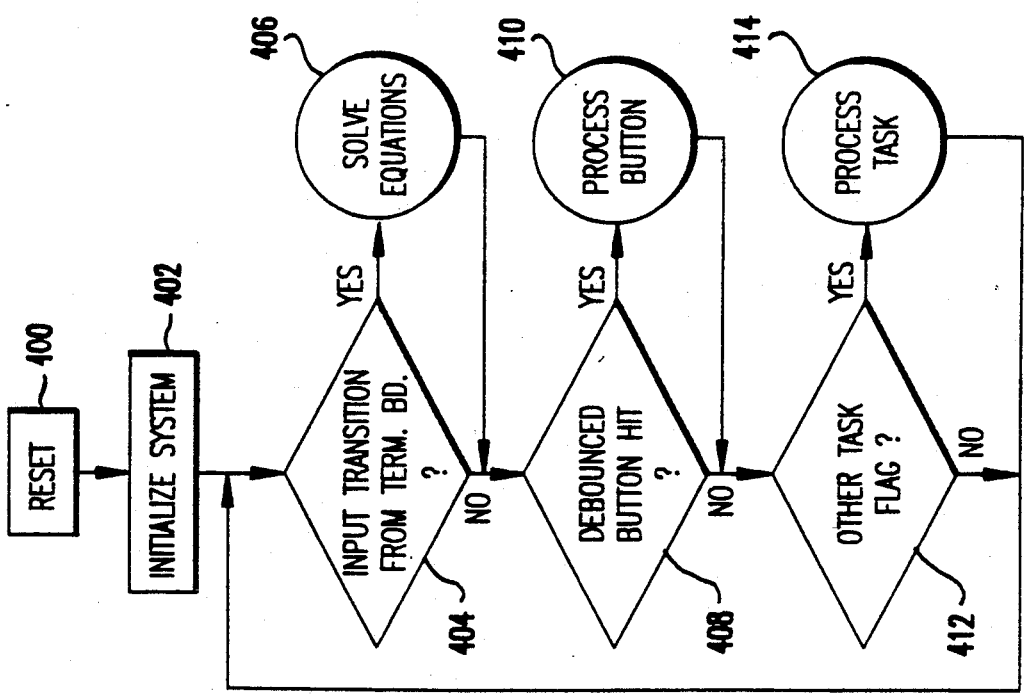

FIG. 12a illustrates a preferred flow chart which may be used to implement the operating program for the microcomputer of the controller 32 of FIG. 4. The flow chart begins at blocks 400 and 402 where the microcomputer is depicted transitioning from the reset to system initialization stage. At block 404, a test is performed to determine if any signal transitions have been detected at the input terminals of the termination board. As previously discussed, any such signal transitions are interpreted by the termination board 38 and passed to the microcomputer of the controller 32 via the synchronous link. Once the microcomputer of the controller 32 receives notification of such a signal transition, flow proceeds from block 404 to block 406 where the microcomputer determines which circuit breakers are associated with the signal transition and which tasks must be scheduled in accordance with the signal transition. From block 406, or if no signal transition was detected at block 404, flow proceeds to block 408.

Figure 12B:
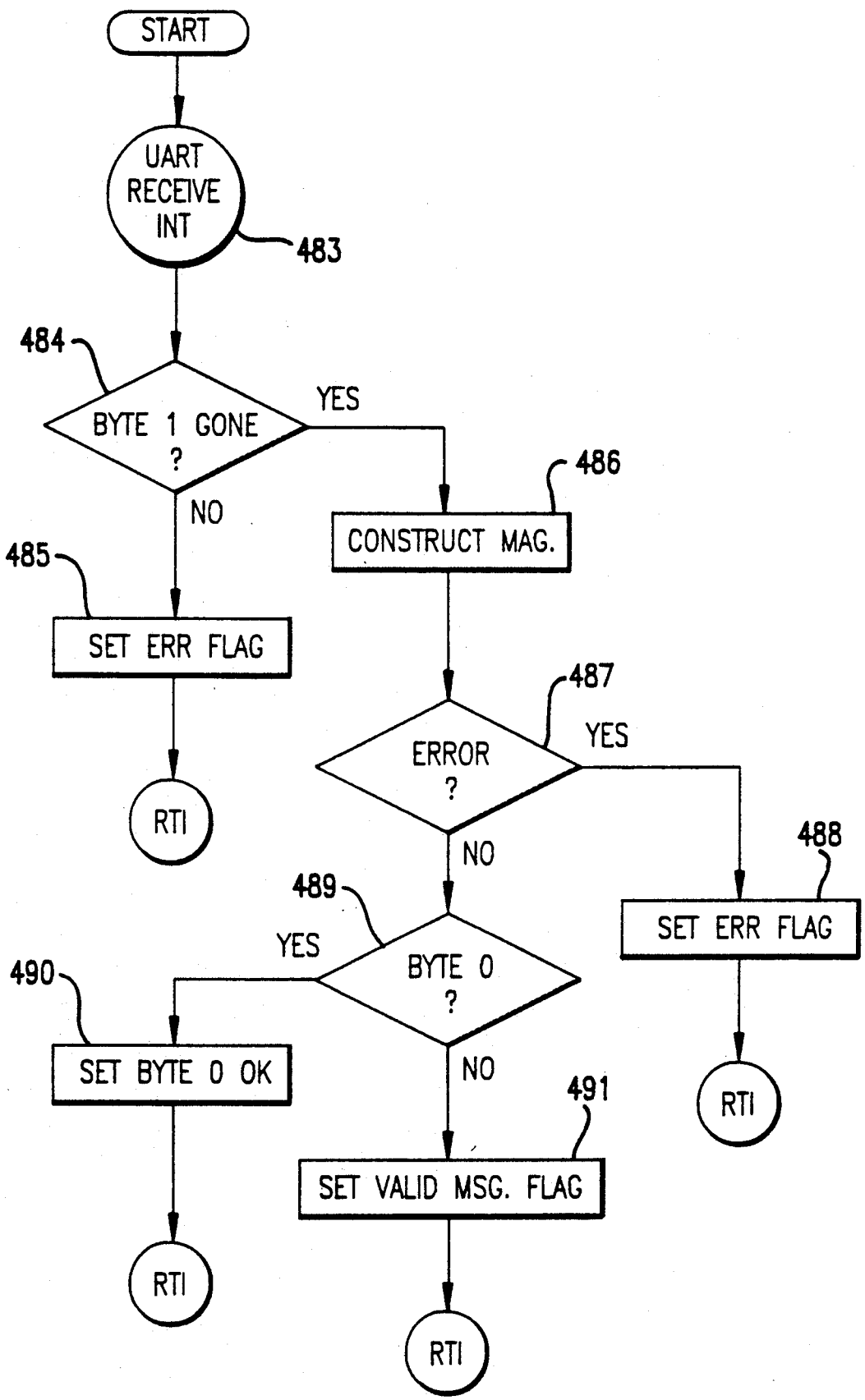
Figure 12C:
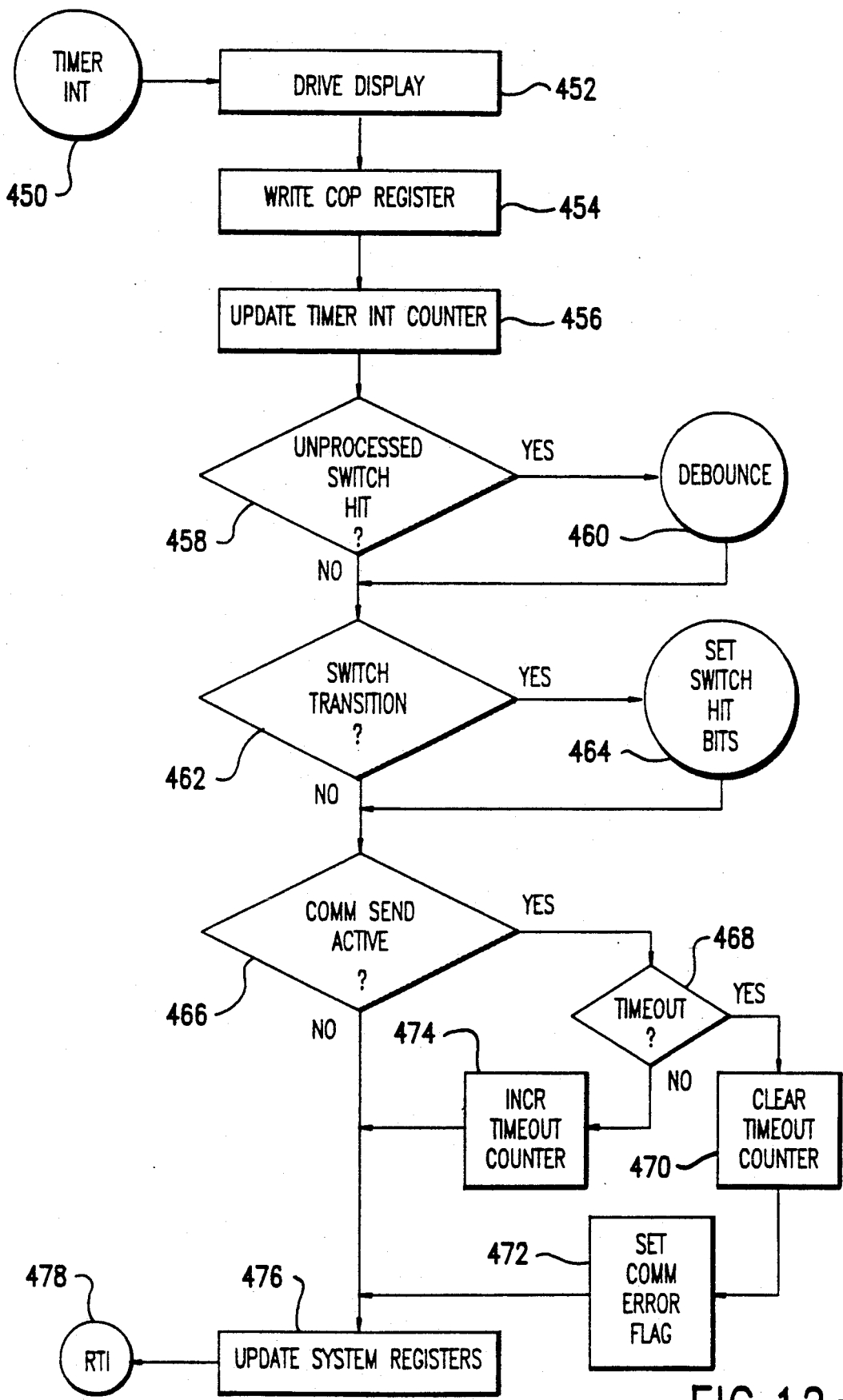

At block 408, the microcomputer performs a test to determine if any manual inputs have been received and debounced via the timer interrupt routine of FIG. 12c. In response to the reception of such an input, flow proceeds from block 408 to block 410 where the requisite tasks associated with that input are processed. From block 410, or if no manual input was received at block 408, flow proceeds to blocks 412 and 414 where the microcomputer performs any tasks which have been scheduled for execution; for example, such a task would include any automatic action to be taken as a result of a prompt from the real time clock. From blocks 412 and 414, flow returns to block 404 for additional monitoring of the signal inputs at the termination board and the manual inputs at the front panel of the controller 32.

FIG. 12b illustrates a preferred manner of receiving the two-byte message from the gate array. The flow chart begins at block 483 where the microcomputer receives a byte via an interrupt. At block 484, the microcomputer determines if the second byte (byte 1) has been sent to the gate array for a proper response. If not, flow proceeds to block 485 where the microcomputer sets a flag indicating an error (e.g., both bytes must be transmitted before a valid response can be received) and that corrective action needs to be taken. Otherwise, flow proceeds to block 486 where the microcomputer constructs and interprets the received message from the gate array. At block 487, the microcomputer checks for errors. If an erroneous response was received, flow proceeds to block 488 where an appropriate error flag is set for subsequent action. Otherwise, flow proceeds to block 489 where the microcomputer determines whether byte 0 or byte 1 has been received. If byte 0 was received, a flag is set (block 490) to indicate that another byte is forthcoming. If byte 1 was received, a flag is set (block 491) to indicate that a valid message was received and, if needed, further action taken. From blocks 485, 488, 490 and 491, a return from interrupt command is executed.

FIG. 12c illustrates a flow chart which may be used to implement a timer interrupt routine for the microcomputer 32. This routine services, upon the receipt of the timer interrupt, various inputs to the controller including the switches on its front panel. The routine starts at block 450 where the microcomputer of the controller is depicted being interrupted from its normal flow. From block 450, flow proceeds to block 452 where the microcontroller updates the display as previously described. At block 454, the microcomputer refreshes its internal COP (computer operating properly) register to prevent a reset from occurring. Block 456 depicts the microcomputer presetting the counter which is used to generate the next timer interrupt.

From block 456, flow proceeds to block 458 where the microcomputer performs a test to determine if there are any switch inputs at the front panel of the controller that have to be processed. If there are any switch inputs that have to be processed, flow proceeds from block 458 to block 460 where the microcomputer debounces the next unprocessed switch input. Any such manual input is preferably debounced using conventional software debouncing steps. If there are no switch inputs that have to be processed, or from block 460, flow proceeds to block 462.

At block 462, the microcomputer performs a test to detect switch transitions caused by manual inputs at the front panel. If such transitions have occurred, flow proceeds to block 464 where flags (bits) are set to record which switches have been selected. Otherwise, flow proceeds to block 466.

Blocks 466 through 476 represent a timeout procedure to ensure that the gate array is responding to the commands sent from the controller. If the gate array does not respond within a certain time limit (block 468) by returning the requisite acknowledgement or status report, the associated timer is cleared and an error flag is set (block 472) for appropriate action during the main flow chart (block 412 of FIG. 12a). If the gate array responds within the time limit, flow proceeds from block 468 to block 474 where the timer counter is incremented for the next pass through block 468. Before exiting the routine at block 478, any restoration of system registers occurs at block 476.

FIG. 12d illustrates a more detailed perspective of a preferred manner of sending the two-byte message from the controller to the gate array. The flow chart begins at block 479 where the microcomputer determines if the first byte (byte 0) has been sent yet. If not, flow proceeds to blocks 480 where the microcomputer resets a flag indicating that byte 1 has been transmitted, then transmits byte 0, and then sets a flag indicating that byte 0 has been transmitted. If the microcomputer determines that the first byte has been sent, the opposite occurs at blocks 481; the microcomputer resets a flag indicating that byte 0 has been transmitted, then transmits byte 1, and then sets a flag indicating that byte 1 has been transmitted. This subroutine, which may be called from block 412 of FIG. 12a, is exited at block 482.

Figure 13A:
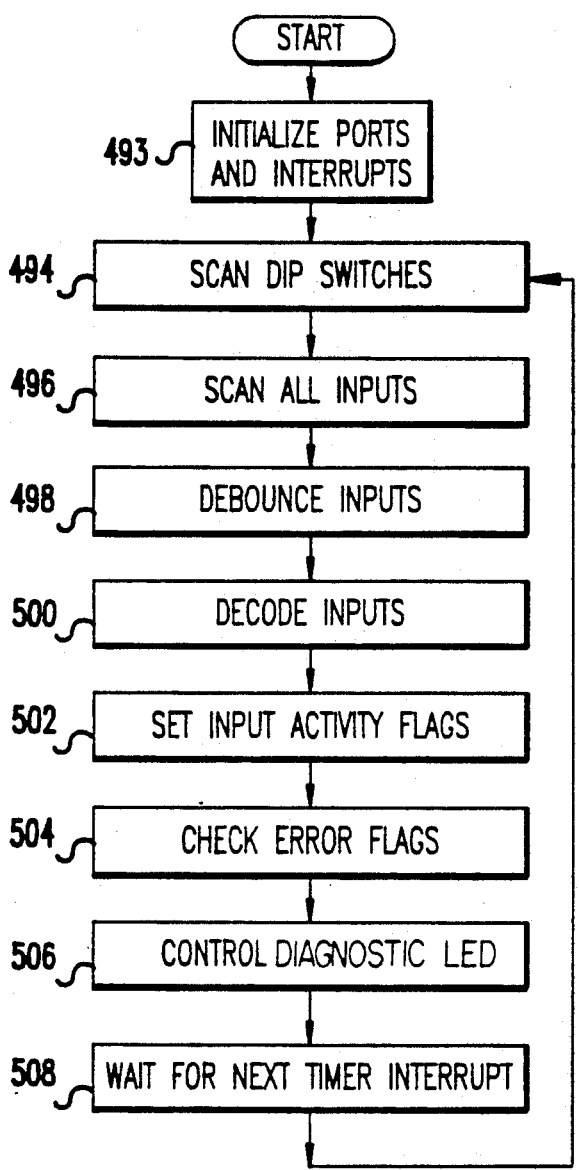

FIGS. 13a-13d respectively illustrate a main routine, a timer interrupt routine, a serial communications interrupt routine, and a serial peripheral interrupt routine as a preferred manner of programming the microcomputer of the termination board 38 (FIG. 11d). FIG. 13a begins at block 493 where the microcomputer is depicted transitioning from the reset to initialization stage. At block 494, the microcomputer scans the trinary DIP switches to determine the configuration set by the operator.

At blocks 496 through 500, the microcomputer scans, debounces and decodes all inputs to determine which tasks must be executed. Activity flags, as depicted at block 502, may be set to record the types of tasks to be performed. Blocks 504 and 506 depict the microcomputer checking for and displaying errors that may have transpired via the scanned inputs. Other tasks may also be processed at this point in response to messages or flags being sent from any of the other routines.

From block 506, flow proceeds to block 508 where the microcomputer waits for the timer interrupt routine to prompt another reading of the DIP switches and other inputs to the microcomputer.

Figure 13B:
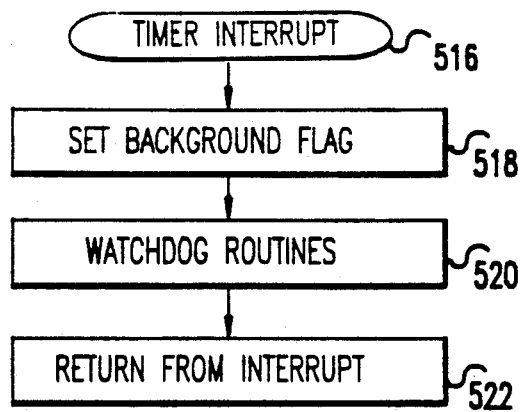

The timer interrupt routine, illustrated in FIG. 13b and beginning at block 516, comprises two basic steps, depicted at blocks 518 and 520. At block 518, the microcomputer sets a background flag to indicate that the time has come to once again scan the DIP switches and other inputs to the microcomputer. Thus, when the microcomputer returns from block 508, it proceeds to block 494.

From block 518, flow proceeds to block 520 where the microcomputer refreshes an internal conventional watchdog timer circuit (e.g., an internal COP register), which protects the microcomputer from entering into nonprogrammed modes. Other watchdog routines may also be implemented at this point to ensure proper operation external to the microcomputer. The interrupt routine is exited via block 522.

Figure 13C:
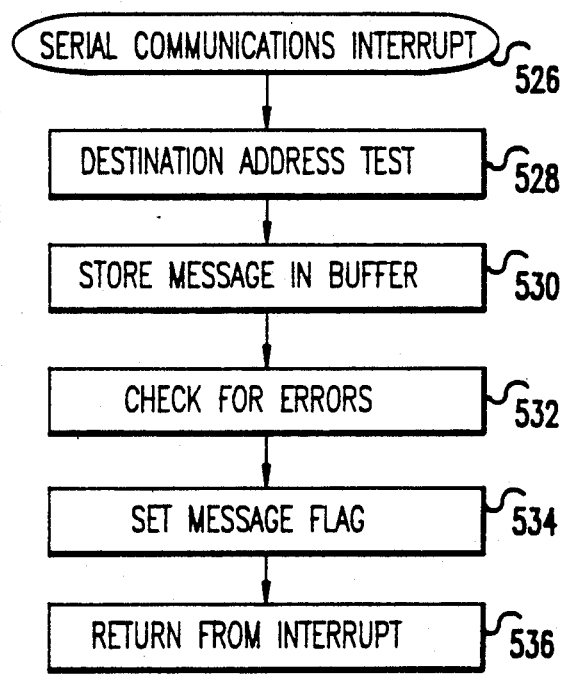

The serial communications interrupt routine, illustrated in FIG. 13c, illustrates a preferred manner for the termination board to communicate with external devices via the network drivers. The routine begins at blocks 526 and 528 where the microcomputer enters the routine and checks the network address to determine if the communication over the network contains the destination address of the subject termination board. At blocks 530, 532 and 534, the microcomputer stores, validates and flags the communication. The message flag set at block 534 may be executed, for example, in the main routine of FIG. 13a or the interrupt routine of FIG. 13d, depending on the particular type of message. The routine is exited at block 536 via a return from interrupt command.

Figure 13D:
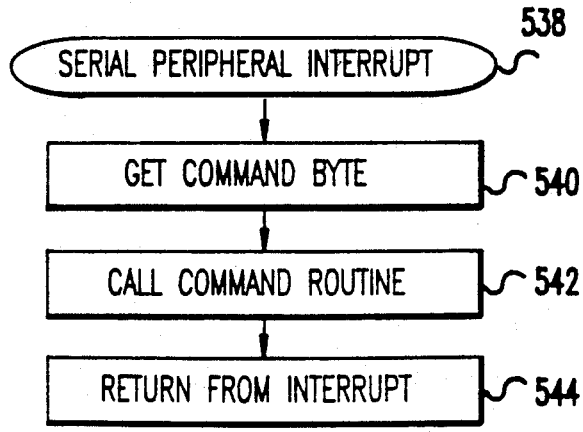

FIG. 13d illustrates a preferred manner for the termination board to communicate with the controller board via the previously discussed master/slave interface. The routine begins at blocks 538 and 540 where the microcomputer enters the routine and retrieves the command being sent from the controller. At block 542, the microcomputer calls the appropriate subroutine for executing the command sent from the controller. For example, the microcomputer may be instructed to send the current status of each of the eight input switches to the controller. In this instance, the microcomputer would call a subroutine which reads the status of each switch and transmits that data to the controller. The routine is exited at block 544 via a return from interrupt command.

While the invention has been particularly shown and described with reference to a few particular embodiments, it will be recognized by those skilled in the art that modifications and changes may be made to the present invention described above without departing from the spirit and scope thereof. For instance, the termination board 38 may be used as one of several types of circuit boards used to interface with various types of outside devices and/or to provide varying levels of control to the circuit breakers.

APPENDIX A

```
* DISPLAY TABLE
* distab is a 1- to 1 map of the display LED's. Bits in this table are sent
* directly to PORTS A and B to drive the control panel LED's.

*       The table format is:

*       ----------------------------------------------------------------
*       | 16 O | 16 C | 15 C | 15 O | 02 O | 02 C | 01 C | 01 O |
*       ----------------------------------------------------------------
*       | D4SA | D3SA | D2SA | D1SA | 30 O | 30 C | 29 C | 29 O |
*       ----------------------------------------------------------------
*       | 18 O | 18 C | 17 C | 17 O | 04 O | 04 C | 03 C | 03 O |
*       ----------------------------------------------------------------
*       | D4SB | D3SB | D2SB | D1SB | 32 O | 32 C | 31 C | 31 O |
*       ----------------------------------------------------------------
*       | 20 O | 20 C | 19 C | 19 O | 06 O | 06 C | 05 C | 05 O |
*       ----------------------------------------------------------------
*       | D4SC | D3SC | D2SC | D1SC | 34 O | 34 C | 33 C | 33 O |
*       ----------------------------------------------------------------
*       | 22 O | 22 C | 21 C | 21 O | 08 O | 08 C | 07 C | 07 O |
*       ----------------------------------------------------------------
*       | D4SD | D3SD | D2SD | D1SD | 36 O | 36 C | 35 C | 35 O |
*       ----------------------------------------------------------------
*       | 24 O | 24 C | 23 C | 23 O | 10 O | 10 C | 09 C | 09 O |
*       ----------------------------------------------------------------
*       | D4SE | D3SE | D2SE | D1SE | 38 O | 38 C | 37 C | 37 O |
*       ----------------------------------------------------------------
*       | 26 O | 26 C | 25 C | 25 O | 12 O | 12 C | 11 C | 11 O |
*       ----------------------------------------------------------------
*       | D4SF | D3SF | D2SF | D1SF | 40 O | 40 C | 39 C | 39 O |
*       ----------------------------------------------------------------
*       | 28 O | 28 C | 27 C | 27 O | 14 O | 14 C | 13 C | 13 O |
*       ----------------------------------------------------------------
*       | D4SG | D3SG | D2SG | D1SG | 42 O | 42 C | 41 C | 41 O |
*       ----------------------------------------------------------------
*       |  X   |  X   | MNTN | PULS | REVW | MANL | HALT | RUN  |
*       ----------------------------------------------------------------
*       | D4DP | D3DP | D2DP | D1DP |  X   | OPEN | CLOS | NOCHG|
*       ----------------------------------------------------------------

*       ## O means => breaker open
*       ## C means => breaker closed
*       D#Sx means => display #, segment x
*       D#DP means => display #, decimal point
```

```
* DIGFORM
*
* Maps input BCD digit to bits in display table
* A zero means segment ON
*
* The column # in the EM2000 varies between columns 4 through 7 on odd bytes
* in the DISPTAB table. The routine takes the row formatted info in table
* DIGPAT and converts it to the column format required in DIGPAT.
*
* INPUTS:  BCD Digit @ [varptr-1], column # @ [varptr-2]
* RETURNS: None
* LOCALS:  Segment pattern [varptr], disptab index [varptr+1], !ColMask [varptr+2]
* CHANGES: None
*
*                       -----------------
*           varptr-2    | Col. mask      |  Mask of column to fix passed from caller
*                       -----------------
*           varptr-1    | BCD #          |  BCD digit to format passed from caller
*                       -----------------
* entry/exit ptr>  varptr | Segment Pattern |  From table digpat
*                       -----------------
*           varptr+1    | Current disptab |  Index into disptab array
*                       -----------------
*           varptr+2    | Comp. col. mask |  Compliment of column mask
*                       ----------------- digform  ldx    varptr   * get stack ptr
         lda    #1
         sta    1,x      * save disptab byte counter
         ldx    -1,x     * get BCD digit (or DP)
         lda    digpat,x * get segment pattern
         ldx    varptr   * restore x
         sta    ,x       * save segment pattern on stack
         lda    -2,x     * get column mask
                         * compliment pattern mask
         sta    2,x      * save it lsr    ,x       * digit bit = 0?
         bcc    df1      * yes, put 0 in table
         lda    -2,x     * else, get column mask
         ldx    1,x      * load index into disptab
         ora    disptab,x * set table bit to 1
         bra    df2

1        lda    2,x      * get complimented column mask
         ldx    1,x      * get disptab index
         and    disptab,x * clear table bit 2        sta    disptab,x * fix table
         ldx    varptr   * restore stack frame
         inc    1,x
         inc    1,x      * prepare for next digit segment
         lda    #16
         cmp    1,x      * past table end?
         bcc    df3      * no, loop
         rts             * else, return
```

***************************************************
BKR2DISP converts breaker slot # (0 to 41) in [varptr-1] to byte # and doublet #
dublets are the even numbered bits in each byte which signify the first
bit of the two ON/OFF bits for each breaker in the status display byte# = (slot# X 14) & 0xfe)) + int(chan / 28)
doublet# = ((slot# X 2) * 2) + (4 * (slot# / 14)) - (8 * (slot# / 28))

INPUTS:  at entry, Slot# @ [varptr-1]
RETURNS: at exit, byte# @ [varptr], doublet# @ [varptr+1]
LOCALS:  none X and A trashed

```
                       -----------
           varptr-5    | Slot#    |  Slot number passed from caller
                       -----------
entry/exit ptr>  varptr-4 | Byte#  |  Byte# returned on exit
                       -----------
           varptr-3    | Doublet# |  Doublet# returned on exit
                       -----------
           varptr-2    | Dividend |  passed to divide
                       -----------
           varptr-1    | Divisor  |  passed to divide
                       -----------
```

```
| ptr after fixup>    varptr   | Quotient  | varptr on entry to divide, Quotient returned
                              ------------
                              | Remainder | Remainder returned from divide
                              ------------

* solve byte# = (slot# % 14) & 0xfe)) + int(slot# / 28)
pkr2disp        ldx     varptr  * get stack pointer
                lda     #4      * number of local, returned, passed variables
                add     varptr
                sta     varptr
                tax
* from here on, x points to quotient of divide routine lda     -5,x    * slot# = dividend
                sta     -2,x
                lda     #14
                sta     -1,x    * divisor = 14 bsr     divide lda     #$fe
                and     1,x     * fixup remainder
                sta     -4,x    * [x] = (slot# % 14) & 0xfe lda     -5,x    * get slot number
                sta     -2,x
                lda     #28
                sta     -1,x
                bsr     divide  * [x+2] = slot# / 28 lda     -4,x
                add     ,x      * byte# = [x] = [x] + (slot# / 28)
                sta     -4,x    * save for return

* now solve for doublet number
* doublet# = ((slot# % 2) * 2) + (4 * (slot# / 14)) - (8 * (slot# / 28))

lda     -5,x    * get slot #
                and     #1
                lsla            * (slot# % 2) * 2
                sta     -3,x    * store partial doublet lda     -5,x    * get slot#
                sta     -2,x    * to psuedo stack dividend
                lda     #14     * get divisor
                sta     -1,x    * to psuedo stack
                bsr     divide lda     ,x      * get quotient
                lsla
                lsla
                add     -3,x
                sta     -3,x    *((slot# % 2) * 2) + (4 * (slot# / 14))

lda     -5,x
                sta     -2,x
                lda     #28
                sta     -1,x
                bsr     divide lda     ,x      * get slot# / 28
                lsla
                lsla
                lsla            * 8 * (slot# / 28)
                nega
                add     -3,x    * doublet# -= 8 * (slot# / 28)
                sta     -3,x    * doublet# to psuedo stack lda     varptr
                sub     #4
                sta     varptr
                tax             * fix psuedo stack pointer
                rts

*******************************************************
DIVIDE
                              ------------
                varptr-2      | Dividend  | passed variable from caller
                              ------------
                varptr-1      | Divisor   | passed variable from caller
                              ------------
entry/exit ptr> varptr        | Quotient  | return value to caller
                              ------------
                varptr+1      | Remainder | return value to caller
                              ------------
```

```
INPUTS:  dividend=[varptr-2], divisor=[varptr-1]
RETURNS: quotient=[varptr], remainder=[varptr+1]
LOCALS:  temp quotient in [varptr]

divides an 8-bit number by another 8-bit number...[varptr-2]/[varptr-1]
doesn't check for divide by zero
A trashed
divide doesn't call anything, varptr unaffected divide  ldx     varptr    * get stack pointer
        clr     ,x        * clear quotient
        lda     -2,x      * get dividend
div2    sub     -1,x      * dividend < divisor?
        bcs     div1      * yes, calculate remainder
        inc     ,x        * else, increment quotient
        bra     div2 div1    add     -1,x      * calc remainder
        sta     1,x       * remainder to stack frame [varptr+1]
        rts

************************************************
MUXDISP updates display based on what is in the display table DISPTAB
Takes data from table and writes it directly to the LED's
Lower 3 bits of PORTC contains address of 1-of-8 display mux presently displayed INPUTS:  PORTC
RETURNS:
LOCALS:  temp data for new PORTC
CHANGES:

A and X trashed muxdisp ldx     intptr    * set for temp storage
        lda     PORTC
        and     #$f8      * mask out lower bits
        sta     ,x
        lda     PORTC
        inca
        and     #7
        ora     ,x
        clr     PADIR
        clr     PBDIR     * stop driving array
        sta     PORTC     * set next display column bclr    3,PORTC
        bset    3,PORTC   * strobe HC137 and     #7
        tax
        lslx              * normalize ([disptab] = 2 * (PORTC * 7))
        lda     disptab,x
        ora     flashmsk  * turn display off if flashmask == 1
        sta     PORTA     * set first LED column
        incx
        lda     disptab,x
        ora     flashmsk
        sta     PORTB     * set second column lda     #$ff
        sta     PADIR
        sta     PBDIR     * display rows ON tst     flashctr  * flash counter active from procsw routine?
        beq     exmux     * no, exit
        inc     flashctr  * else, increment counter
        lda     flashctr  * get present counter
        cmpa    #FLASHDLY * counter > delay?
        bcs     exmux     * no, exit clr     flashctr  * else, clear flash counter
        clr     flashmsk  * enable display exmux   rts
```

APPENDIX B

```
; HEADER
; FILEID FUSEFUS /designs/em2kact/em2kact.fus 14005bb9
; CHECKSUM 14005bb9
; PROGRAM Action Logic System
; VERSION 1.22
; DEPEND DDFDIE /actel/die1020.ddf 9fe38a0b
; DEPEND FUSEADL /designs/em2kact/em2kact.adl a0fd292e
; DEPEND FUSESEG /designs/em2kact/em2kact.seg 5fc03720
; DEPEND FUSELOC /designs/em2kact/em2kact.loc bdc35912
; DEPEND MODLIB /actel/modlib.lib b0797af4
; VAR DDFDIE /actel/die1020.ddf
; VAR FUSEADL /designs/em2kact/em2kact.adl
; VAR ADLIB /actel/adl04.lib
; VAR DDFPACKAGE /actel/pkg1020.ddf
; VAR ROUTEADL /designs/em2kact/em2kact.adl
; VAR ROUTELOC /designs/em2kact/em2kact.loc
; VAR PLACEPIN /designs/em2kact/em2kact.pin
; VAR PLACECRT /designs/em2kact/em2kact.crt
; VAR FUSESEG /designs/em2kact/em2kact.seg
; VAR PLACEADL /designs/em2kact/em2kact.adl
; VAR FUSELOC /designs/em2kact/em2kact.loc
; VAR FUSEEXTRA 1
; VAR FUSALLLATE 1
; VAR MODLIB /actel/modlib.lib
; ENDHEADER
```

| | | | | | | |
|---|---|---|---|---|---|---|
| X03110b0b0b1012 | X03190b0b08191a | X031b0b0b100b20 | X03270b09092627 | X0b060b0204002b | X0b0d0b0704002b | X0b170b0004002b |
| X0b110b010b1012 | X0b1a0b0308191a | X0b120b07100b20 | X0b270b07092627 | X0b060b0404002b | X0b0e0b0304002b | X0b170b0204002b |
| X0b120b030b1012 | X0b1a0b0508191a | X0b140b01100b20 | X03230b0801222b | X0b060b0504002b | X0b0e0b0504002b | X0b170b0304002b |
| X03110b09131112 | X03170b080c111a | X0b190b06100b20 | X0b230b0701222b | X0b070b0004002b | X0b0e0b0704002b | X0b180b0004002b |
| X0b110b06131112 | X0b140b070c111a | X0b1b0b05100b20 | X0b250b0701222b | X0b070b0504002b | X0b0f0b0104002b | X0b180b0204002b |
| X0b120b06131112 | X0b150b070c111a | X0b1b0b07100b20 | X0b280b0701222b | X0b070b0604002b | X0b0f0b0204002b | X0b190b0004002b |
| X030e0b0b050c0f | X0b170b070c111a | X0b1f0b01100b20 | X0b170b0603002b | X0b080b0404002b | X0b0f0b0304002b | X0b190b0204002b |
| X0b0f0b07050c0f | X0b190b070c111a | X03040b0a06000a | X0b180b0603002b | X0b080b0504002b | X0b0f0b0504002b | X0b190b0304002b |
| X03130b0b061113 | X030b0b0c12060f | X0b040b0106000a | X0b000b0004002b | X0b080b0604002b | X0b0f0b0604002b | X0b1b0b0304002b |
| X0b110b03061113 | X0b0f0b0412060f | X0b080b0306000a | X0b000b0104002b | X0b080b0704002b | X0b100b0004002b | X0b1b0b0404002b |
| X0b120b01061113 | X03160b0801101b | X0b090b0106000a | X0b000b0204002b | X0b090b0304002b | X0b100b0104002b | X0b1c0b0304002b |
| X030d0b09060d0e | X0b100b0701101b | X0b0a0b0606000a | X0b000b0304002b | X0b090b0404002b | X0b100b0204002b | X0b1c0b0404002b |
| X0b0c0b06060d0e | X0b110b0701101b | X03080b0a0b0009 | X0b010b0004002b | X0b090b0504002b | X0b100b0304002b | X0b1c0b0604002b |
| X03140b0b131314 | X0b160b0701101b | X0b050b030b0009 | X0b010b0104002b | X0b090b0704002b | X0b100b0504002b | X0b1c0b0704002b |
| X0b130b01131314 | X0b180b0701101b | X0b070b010b0009 | X0b010b0504002b | X0b0a0b0104002b | X0b100b0604002b | X0b1d0b0304002b |
| X03150b0b081516 | X031b0b0c071a1b | X0b090b060b0009 | X0b020b0004002b | X0b0a0b0204002b | X0b110b0004002b | X0b1d0b0404002b |
| X0b160b03081516 | X0b1a0b07071a1b | X03030b0c0c0003 | X0b020b0104002b | X0b0a0b0304002b | X0b110b0204002b | X0b1d0b0604002b |
| X03100b0b180c16 | X03050b0c100506 | X0b020b070c0003 | X0b020b0204002b | X0b0a0b0504002b | X0b110b0504002b | X0b1d0b0704002b |
| X0b130b00180c16 | X0b060b07100506 | X031a0b08111721 | X0b020b0404002b | X0b0a0b0704002b | X0b120b0204002b | X0b1c0b0304002b |
| X03100b090b0a14 | X031c0b0c081b1c | X0b1a0b06111721 | X0b020b0504002b | X0b0b0b0104002b | X0b120b0504002b | X0b1c0b0404002b |
| X0b0d0b01080a14 | X0b1c0b0101081b1c | X0b1b0b06111721 | X0b030b0104002b | X0b0b0b0204002b | X0b130b0204002b | X0b1c0b0604002b |
| X0b0c0b01080a14 | X03040b0b0c0405 | X0b200b06111721 | X0b030b0204002b | X0b0b0b0304002b | X0b130b0404002b | X0b1f0b0004002b |
| X030a0b0c180a0b | X0b050b010c0405 | X0b210b06111721 | X0b030b0504002b | X0b0b0b0504002b | X0b130b0504002b | X0b1f0b0204002b |
| X0b0a0b04180a0b | X030f0b0b000e1d | X03200b0b182021 | X0b030b0704002b | X0b0b0b0604002b | X0b130b0604002b | X0b1f0b0304002b |
| X0b0b0b04180a0b | X0b1a0b01000e1d | X0b200b01182021 | X0b040b0404002b | X0b0b0b0704002b | X0b130b0704002b | X0b1f0b0404002b |
| X03180b0b0d1618 | X0b1b0b01000e1d | X0b210b05182021 | X0b040b0504002b | X0b0c0b0004002b | X0b140b0004002b | X0b1f0b0704002b |
| X0b160b010d1618 | X03130b09020c1f | X03230b0b002123 | X0b040b0604002b | X0b0c0b0104002b | X0b140b0204002b | X0b200b0404002b |
| X0b170b010d1618 | X0b120b00020c1f | X0b210b07002123 | X0b040b0704002b | X0b0c0b0204002b | X0b140b0304002b | X0b200b0704002b |
| X0b180b030d1618 | X0b140b06020c1f | X03220b0b182223 | X0b050b0004002b | X0b0c0b0304002b | X0b150b0004002b | X0b210b0004002b |
| X03080b0b0c0810 | X0b190b01020c1f | X0b230b01182223 | X0b050b0204002b | X0b0c0b0504002b | X0b150b0104002b | X0b210b0204002b |
| X0b0c0b070c0810 | X0b1a0b00020c1f | X03230b09102324 | X0b050b0404002b | X0b0c0b0604002b | X0b150b0204002b | X0b220b0004002b |
| X03080b0c180809 | X0b1b0b00020c1f | X0b230b00102324 | X0b050b0504002b | X0b0d0b0004002b | X0b150b0304002b | X0b220b0104002b |
| X0b080b01180809 | X0b1e0b0702021f | X0b240b00102324 | X0b050b0604002b | X0b0d0b0204002b | X0b150b0604002b | X0b220b0204002b |
| X0b090b00180809 | X0b1f0b06020c1f | X03250b0b112526 | X0b050b0704002b | X0b0d0b0304002b | X0b160b0204002b | X0b220b0304002b |
| X03070b0b100708 | X031f0b09071e1f | X0b250b01112526 | X0b060b0004002b | X0b0d0b0404002b | X0b160b0204002b | X0b220b0404002b |
| X0b080b01100708 | X0b1e0b00071e1f | X0b260b05112526 | X0b060b0104002b | X0b0d0b0604002b | X0b160b0604002b | X0b220b0504002b |
| X0b220b0604002b | X0b1e0b050c002b | X0b170b03081718 | X0b050b0009000b | X0b010b0404002b | X0b170b0204002b | X03210b0c05122b |
| X0b220b0704002b | X0b1f0b050c002b | X0b180b03081718 | X0b050b0109000b | X0b020b0404002b | X0b170b0504002b | X0b130b0605122b |
| X0b230b0504002b | X0b200b020c002b | X030e0b090e0810 | X0b090b0109000b | X0b020b0604002b | X0b170b0604002b | X0b140b0105122b |
| X0b230b0604002b | X0b200b060c002b | X0b080b000e0810 | X03030b090b0009 | X0b020b0704002b | X0b170b0704002b | X0b160b0105122b |
| X0b240b0104002b | X0b210b030c002b | X0b0b0a020e0810 | X0b020b050b0009 | X0b030b0404002b | X0b170b0704002b | X0b180b0105122b |
| X0b240b0304002b | X0b210b040c002b | X0b0a0a040e0810 | X0b030b010b0009 | X0b030b0504002b | X0b180b0604002b | X0b1b0b0105122b |
| X0b240b0504002b | X0b230b020c002b | X03090b0c180809 | X0b030b070b0009 | X0b030b0704002b | X0b180b0704002b | X0b1d0b0105122b |
| X0b250b0004002b | X0b230b040c002b | X0b080b0404180809 | X0b060b020b0009 | X0b040b0204002b | X0b190b0204002b | X03150b0a06142b |

| | | | | | | |
|---|---|---|---|---|---|---|
| X0b25060204002b | X0b24060020c002b | X0b0906a00180809 | X0b0906a0306000909 | X0b0406a0704002b | X0b19060504002b | X0b16060506142b |
| X0b26060004002b | X0b24060040c002b | X030706a09100708 | X030f0a0b0d0013 | X0b05060204002b | X0b19060604002b | X0b1a06a0706142b |
| X0b26060204002b | X0b25060030c002b | X0b070601100708 | X0b06060070a0013 | X0b05060504002b | X0b19060704002b | X0b1d06a0606142b |
| X0b27060104002b | X0b25060040c002b | X0b08060310a0708 | X0b06060010a0013 | X0b05060704002b | X0b1a06a0004002b | X0b20060606142b |
| X0b27060404002b | X0b26060030c002b | X03190a090c111a | X0b0c06a010a0013 | X0b06060104002b | X0b1a06a0204002b | X0b21060106142b |
| X0b27060504002b | X0b26060040c002b | X0b140a030c111a | X0b0f0a060d0013 | X0b06060304002b | X0b1a06a0404002b | X03210906082b12b |
| X0b28060004002b | X0b27060020c002b | X0b190a030c111a | X0b12060010d0013 | X0b06060404002b | X0b1a06a0504002b | X0b27060108212b |
| X0b28060104002b | X0b27060060c002b | X030906a0b12060f | X0b13060010d0013 | X0b06060604002b | X0b1a06a0604002b | X03260b0604002b |
| X0b28060204002b | X0b28060040c002b | X0b0d0a0412060f | X03020a0c0c0003 | X0b07060004002b | X0b1b06a0004002b | X0b01060070a002b |
| X0b28060504002b | X0b28060060c002b | X0b0d0a0512060f | X0b02060030c0003 | X0b07060404002b | X0b1b06a0404002b | X0b23060070a002b |
| X0b29060004002b | X0b29060040c002b | X0b0c0a0112060f | X03060a0b110011 | X0b07060504002b | X0b1b06a0504002b | X0b26060070a002b |
| X0b29060104002b | X0b29060060c002b | X031a0a0a011011b | X0b0806a02110011 | X0b07060704002b | X0b1b06a0604002b | X03180a0a0h162b |
| X0b29060204002b | X0b2a060060c002b | X0b100a0001101b | X03000a05120002 | X0b08060504002b | X0b1b06a0704002b | X0b18060050b162b |
| X0b29060504002b | X0b2b060090c002b | X0b140a0001101b | X0b01060a05120002 | X0b08060704002b | X0b1c06a0204002b | X0b1a06a010b162b |
| X0b2a060004002b | X0b2b060a0c002b | V021c0a00 | X030c0a013000d | X0b09060404002b | X0b1c06a0504002b | X0a1d06a000b162b |
| X0b2a060104002b | X0b2b060b0c002b | X031a0a09181a1c | X0a030a0013000d | X0b09060504002b | X0b1c06a0704002b | X0a200a000b162b |
| X0b2a060504002b | X0b2b060b0c002b | X0a1c0a00181a1c | X0b05060613000d | X0b09060704002b | X0b1d06a0204002b | X0b01060060c002b |
| X0324060a08212b | X031f0b0c0c1e2b | V02040a00 | X0b09060a0713000d | X0b0a06a010400b | X0b1d06a0704002b | X0b02060020c002b |
| X0b23060308212b | X0b20060050e1e2b | V021d0a00 | X031f0a0b011f21 | X0b0a06a030400b | X0b1e06a0204002b | X0b03060020c002b |
| X0b24060608212b | X0b21060010e1e2b | X03060a0c080406 | X0b1f0a00011f21 | X0b0a06a050400b | X0b1e06a0504002b | X0b04060040c002b |
| X0b25060608212b | X0b25060050e1e2b | X0b04060a03080406 | X0b21060011f21 | X0b06060204002b | X0b1e06a0604002b | X0b05060040c002b |
| X0b26060608212b | X0b26060010e1e2b | X031d0a0a000e1d | X03170a0a111721 | X0b06060304002b | X0b1e06a0704002b | X0b06060050c002b |
| X0b01060060c002b | X03240b060f1a2b | X0b11060a00000e1d | X0b1b060511721 | X0b06060704002b | X0b1f06a0204002b | X0b07060060c002b |
| X0b02060060c002b | X0b1a060040f1a2b | X0b15060000000e1d | X0b1c060611721 | X0b0c06a0304002b | X0b1f06a0504002b | X0b09060020c002b |
| X0b03060040c002b | X0b1b060020f1a2b | X031d06b071c1d | X0b20060711721 | X0b0c06a0504002b | X0b1f06a0704002b | X0b0c06a0020c002b |
| X0b03060060c002b | X03250b0818242b | X0b1d06a05071c1d | X0b21060711721 | X0b0c06a0604002b | X0b20060204002b | X0b0d06a0020c002b |
| X0b04060020c002b | X0b24060718242b | V02030a00 | X03200a0c182021 | X0b0c06a0704002b | X0b20060504002b | X0b0d06a0030c002b |
| X0b04060030c002b | X0b26060718242b | V021c0a00 | X0b20060118021 | X0b0c06a0204002b | X0b21060204002b | X0b0d06a0060c002b |
| X0b06060060c002b | X0b29060718242b | X03040a0c120305 | V02230a00 | X0b0c06a0504002b | X0b21060504002b | X0b0c06a0000c002b |
| X0b07060030c002b | X0b31060a09051011 | X0b03060612030S | V02240a00 | X0b0f0a0504002b | X0b21060604002b | X0b0c06a0030c002b |
| X0b08060020c002b | X0b10060a01051011 | X031e0a09081d1e | .X03220a0c112224 | X0b0f0a0704002b | X0b22060204002b | X0b0c06a0040c002b |
| X0b09060020c002b | X0b1c06a0181d1e | X0b1c06a0181d1e | X0b22060a07112224 | X0b10060a0504002b | X0b23060204002b | X0b0f0a0020c002b |
| V020f0a00 | V02130a00 | X031b0a0a020c1f | X0b23060111224 | X0b10060504002b | X0b23060304002b | X0b0f0a0030c002b |
| X0b0c06b0040c002b | X030e0a0c050e0f | X0b16060000020c1f | X0b24060711224 | X0b10060604002b | X0b23060604002b | X0b0f0a0040c002b |
| X0b0d0b0050c002b | X0a0f0a00050e0f | X0b17060000020c1f | X03250a09112526 | X0b10060704002b | X0b23060604002b | X0b10060030c002b |
| X0b0c0b0000c002b | X03120a09111213 | X031c0a09133151f | X0b25060001112526 | X0b11060104002b | X0b24060204002b | X0b10060040c002b |
| X0b0c0b0020c002b | X0b12060511213 | X0b16060313151f | X0b26060011526 | X0b11060204002b | X0b24060304002b | X0b11060040c002b |
| X0b0c0b0040c002b | X0b13060511213 | X0b1c06a0313151f | V02270a00 | X0b11060404002b | X0b24060604002b | X0b13060040c002b |
| X0b10060040c002b | X03130a091311314 | V022000a00 | X03280a09152628 | X0b11060504002b | X0b25060204002b | X0b14060040c002b |
| X0b11060040c002b | X0b14060513314 | X031c0a0a100b20 | X0a270a00152628 | X0b11060604002b | X0b25060304002b | X0b15060040c002b |
| X0b12060040c002b | X03150a09061315 | X0b18060010b020 | X03220a0801222b | X0b11060704002b | X0b25060604002b | X0b16060040c002b |
| X0b13060030c002b | X0b13060201315 | X0b19060010b020 | X0b22060501222b | X0b12060004002b | X0b26060204002b | X0b17060040c002b |
| X0b14060040c002b | X0b15060301b315 | X03080a0a01000f | X0b23060501222b | X0b12060204002b | X0b26060304002b | X0b18060040c002b |
| X0b14060050c002b | V02060a00 | X0b03060301000f | X0b24060501222b | X0b12060a0304002b | X0b26060604002b | X0b19060040c002b |
| X0b15060040c002b | X030b0a09060b0c | X0b05060301000f | X0b25060601222b | X0b12060a0504002b | X0b27060a0204002b | X0b1a060050c002b |
| X0b15060050c002b | X030b0a0506060b0c | X0b07060301000f | X0b26060501222b | X0b12060a0604002b | X0b27060504002b | X0b1c060040c002b |
| X0b16060040c002b | X0b0c0a05060b0c | X0b08060101000f | X03260a0902262b | X0b12060a0704002b | X0b27060604002b | X0b1d060030c002b |
| X0b16060050c002b | X03160b0180c16 | X030b0a0c05000b | X0b28060a0002262b | X0b13060304002b | X0b27060704002b | X0b1d06a0040c002b |
| X0b17060040c002b | X0b0c0a00180c16 | X0b02060105000b | X0b29060a0002262b | X0b13060704002b | X0b28060204002b | X0b1e06a0030c002b |
| X0b17060050c002b | X0b0d0a00180c16 | X0b04060105000b | X0b08060a0603002b | X0b14060204002b | X0b28060504002b | X0b1e06a0040c002b |
| X0b18060040c002b | X0b0d0a07180c16 | X0b06060405000b | X0b09060a0603002b | X0b14060604002b | X0b28060604002b | X0b1f06a0030c002b |
| X0b18060050c002b | X0b0c0a07180c16 | X030a0a00a6000a | X0b0b06a0603002b | X0b14060a0704002b | X0b28060a0704002b | X0b1f06a0040c002b |
| X0b19060040c002b | V020a0a00 | X0b02060a0006000a | X0b0b06a0603002b | X0b15060204002b | X0b29060104002b | X0b1f06a0060c002b |
| X0b19060050c002b | X030a0a0b080a14 | X0b06060a0006000a | X0b0c0a0603002b | X0b15060504002b | X0b29060204002b | X0b20060030c002b |
| X0b1a060020c002b | X0b0d0a0108011a | X03000a04080003 | X0b06060a0004002b | X0b15060604002b | X0b29060604002b | X0b20060040c002b |
| X0b1c060020c002b | X030c0a0b0b0a0c | X0b01060a03080003 | X0b00060a0104002b | X0b15060704002b | X0b2a06a0004002b | X0b21060030c002b |
| X0b1d060050c002b | X0a0a0a000b0a0c | X03050a09090900b | X0b00060a0204002b | X0b16060204002b | X0b2a06a0104002b | X0b21060040c002b |
| X0b1c060020c002b | X0a0b0a000b0a0c | X0b04060a0509000b | X0b00060a0304002b | X0b16060604002b | X0b2a06a0404002b | X0b22060040c002b |
| X0b23060a040c002b | X03170a09081718 | X0b04060a0609000b | X0b01060a0004002b | X0b16060a0604002b | X0b2a06a0609002b | X0b22060a040c002b |
| X0b24060a040c002b | X03180909071819 | X0b170906100b20 | X0b15090704002b | X0b2b060a0904002b | X0b10060801060f10 | |
| X0b25060a040c002b | X0b1806a0901071819 | X0b1806a0906100b20 | X0b03090504002b | X0b16090704002b | X0314090b06142b | X0311080b131112 |
| X0b26060a040c002b | X0b19060a0903071819 | X0b19060a0906100b20 | X0b04090504002b | X0b16090504002b | X0b1f090606142b | X0b11080503131112 |
| X0b27060a030c002b | V021a0901 | X0b1b09060100b20 | X0b04090204002b | X0b17090704002b | X0b26090406142b | X0b11080503131112 |
| X0b27060a040c002b | X0307090b100708 | X0b1c09060100b20 | X0b04090504002b | X0b17090204002b | X0b27090606142b | X0b12080131312 |
| X0b28060a030c002b | X0b0709090100708 | V022109019 | X0b05090504002b | X0b17090404002b | X0a28090106142b | X030f0800050e0f |
| X0b28060a040c002b | X031a09090c111a | X0302090909080003 | X0b05090504002b | X0b17090504002b | X03200909070202b | X0b0c0802050e0f |
| X0b29060a040c002b | X0b12090010c111a | X0b03090901080003 | X0b06090104002b | X0b17090704002b | X0b24090607202b | X0b0f0800050e0f |
| X0b2a06a060c002b | X03060906060e0607 | X0b03090901080003 | X0b06090304002b | X0b18090604002b | X0b28090607202b | X030e0809130e10 |
| X0b2b060a060c002b | X0b06090020e0e607 | X030809060b0009 | X0b06090404002b | X0b18090504002b | X03220906082b12b | X0b10080301320e10 |
| X0b2b060a0c002b | X0b07090100e607 | X0b02090903060009 | X0b06090504002b | X0b18090704002b | X0b220906082b12b | V020d0800 |
| X03270a0a0f1a2b | X03080906120e060f | X0b03090903060009 | X0b06090604002b | X0b19090604002b | X0b24090607202b | X030c0805050c0d |
| X0b1b060a03011a2b | X0b06090612060f | X0b04090503060009 | X0b07090604002b | X0b19090604002b | X0b25090602a2b | X0b0c08050505c0d |
| X03180b08141812b | X0b0d090a012060f | X0b0805090b10b0009 | X0b1a09060040402b | X0a0f09010a002b | X03240906a040c002b | X0b0d080505050c0d |
| X0b22060014181b | V021c0901 | X03000906061c000J | X0b1a09060604002b | X0b04090904002b | X0b040909040c002b | X030c0800508090c0c |
| X0b25060a071418b | X0305090b000507 | X0b01090903000c0003 | X0b1b09060104002b | X0b05090020c002b | X0b0d080804090c0c | |

| | | | | | | | |
|---|---|---|---|---|---|---|---|
| X0b260a0114182b | X0b070907000507 | X03000905100004 | X0b08090504002b | X0b1b090504002b | X0b0509040c002b | X0b0c0801090c0c |
| X03290a0c15292b | X03060909100506 | X0b010904100004 | X0b09090104002b | X0b1c090204002b | X0b0709020c002b | X0b1308080b1315 |
| X0b2b0a0915292b | X0b050900100506 | X03000907120002 | X0b09090304002b | X0b1c090504002b | X0b0709030c002b | X0b1308030b1315 |
| X0310090a051011 | X0b060900100506 | X0b010905120002 | X0b09090404002b | X0b1d090204002b | X0b0609020c002b | X0b1508040b1315 |
| X0b100900051011 | X031b0909081b1c | X0320090b111721 | X0b09090504002b | X0b1d090504002b | X0b0609030c002b | X0315080b081516 |
| X0b110900051011 | X0b1b0901081b1c | X0b1a0904111721 | X0b09090604002b | X0b1e090204002b | X0b0c09020c002b | X0b150802081516 |
| V020f0901 | X0b1c0903081b1c | X0b1c0904111721 | X0b09090704002b | X0b1f090304002b | X0b0d09020c002b | X0b150803081516 |
| X030f0909060f10 | X03050909080406 | X0b1c0904111721 | X0b0a090304002b | X0b1f090704002b | X0b0d09050c002b | X030a0809080a14 |
| X0b0f0903060f10 | X0b040907080406 | X0b1d0904111721 | X0b0a090404002b | X0b1f090704002b | X0b0e09020c002b | X03140808080a14 |
| X0b0f0905060f10 | X030409090c0405 | X0b1e0904111721 | X0b0a090404002b | X0b20090304002b | X0b0f09020c002b | X0317080b071617 |
| X0b100901060f10 | X0b0409010c0405 | V02220901 | X0b0a090504002b | X0b20090404002b | X0b1009020c002b | X0b170803071617 |
| X0312090c131112 | X0b0509010c0405 | X0320090a022022 | X0b0a090604002b | X0b20090604002b | X0b1009030c002b | X0b170804071617 |
| X0b110901131112 | X0316090b000c1d | X0b200902022022 | X0b0a090704002b | X0b20090704002b | X0b1109020c002b | X0309080a1090a |
| V02130901 | X0b140903000c1d | X0b220902022022 | X0b21090004002b | X0b1109030c002b | X0b0a080010090a |
| X030c090a050c0f | X0a150901000c1d | V02240901 | X0b0b090504002b | X0b21090204002b | X0b1209020c002b | X030a080b00080a |
| X0b0c0900050c0f | X0b160903000c1d | X0323090a102324 | X0b0b090704002b | X0b21090304002b | X0b1209030c002b | X0b08080700080a |
| X0b0f0900050c0f | X0a170901000c1d | X0b230902102324 | X0b0c090304002b | X0b21090604002b | X0b1309020c002b | X030c080c0c0810 |
| X0312090c111213 | X0b180903000c1d | X0b240902102324 | X0b0c090404002b | X0b22090304002b | X0b1809020c002b | X0b0908070c0810 |
| X0b120900111213 | X0a190901000c1d | V02250901 | X0b0c090704002b | X0b22090504002b | X0b1a09050c002b | X0308080c180809 |
| X0b130900111213 | X0b1b0903000c1d | X0321090a151c25 | X0b0d090104002b | X0b22090704002b | X0b1d09030c002b | X0b090801180809 |
| X03130909131314 | X0a1c0901000c1d | X0a220901151c25 | X0b0d090304002b | X0b23090104002b | X0b1e09030c002b | X0318080b071819 |
| X0b130905131314 | X031d0908071c1d | X0b230906151c25 | X0b0d090404002b | X0b23090304002b | X0b1f09050c002b | X0b180800071819 |
| V020c0901 | X0b1d0907071c1d | X0a250901151c25 | X0b0d090604002b | X0b23090404002b | X0b2009050c002b | X0b180803071819 |
| V02150901 | X031d0909081d1e | X0325090a112526 | X0b0e090104002b | X0b23090504002b | X0b2109040c002b | V02070800 |
| X031409090d1415 | X0b1d0901081d1e | X0b250902112526 | X0b23090704002b | X0b2109050c002b | V021a0800 |
| X0b1409010d1415 | X0b1e0901081d1e | X0b260902112526 | X0b0e090304002b | X0b24090304002b | X0b2709050c002b | X031308090c111a |
| X0b1509030d1415 | V021f0901 | V02270901 | X0b0e090404002b | X0b24090504002b | X0b2809020c002b | X0b1408010c111a |
| X030b090a060b0c | X031a090b020c1f | X0327090a092627 | X0b0c090504002b | X0b24090704002b | X0b2809050c002b | X0b1508000c111a |
| X0b0b0900060b0c | X031a0908020c1f | X0b270902092627 | X0b0c090604002b | X0b25090304002b | X0b2909020c002b | X0b1708000c111a |
| X0b0c0900060b0c | X0b120906020c1f | V02280901 | X0b0c090704002b | X0b25090404002b | X0b2909050c002b | X0b1808060c111a |
| V02170901 | X0b130906020c1f | X0327090901222b | X0b0f090404002b | X0b25090504002b | X0b2a09060c002b | V02060800 |
| X030d090a080a14 | X0b1d0906020c1f | X0b220904012226 | X0b0f090704002b | X0b25090704002b | X0b2b090b0c002b | V021b0800 |
| X0b110906080a14 | X0b1e0906020c1f | X0b020906032002b | X0b100904040002b | X0b26090104002b | X0b2b090c0c002b | X0306080b0c0607 |
| X030c09090b0a0c | X031e0909071e1f | X0b03090603002b | X0b100905040002b | X0b26090304002b | X0321090c0c1e2b | X0b0608030c0607 |
| X0b0c09030b0a0c | X0b1f0902071e1f | X0b04090603002b | X0b100907040002b | X0b26090504002b | X0b1f0900001e2b | X0b0608050c0607 |
| X0b0c09050b0a0c | X031d090b13151f | X0b0709060302b | X0b110904040002b | X0b26090704002b | X0b22090000 1e2b | X0b0708010c0607 |
| X030b090c180a0b | X0b1a090713151f | X0b08090603002b | X0b11090704002b | X0b27090404002b | X0b24090000 1e2b | X030c080a12060f |
| X0b0b0901180a0b | X0b1b090713151f | X0b0b090603002b | X0b12090404002b | X0b27090704002b | X0b26090000 1e2b | X0b0b080212060f |
| X03160909071617 | X0b1c090713151f | X0b0b090603002b | X0b12090504002b | X0b27090704002b | X0329090a15292b | X0b0b080012060f |
| X0b160901071617 | X0b1e090713151f | X0b0c090603002b | X0b12090704002b | X0b28090304002b | X0b29090015292b | X0b0c080712060f |
| X0b170903071617 | X031d090c181d1f | X0b0f090603002b | X0b13090304002b | X0b28090404002b | X03200908170202b | V02050800 |
| X0309090b02090b | X0a1f0901181d1f | X0b10090603002b | X0b13090404002b | X0b28090704002b | X0a010901170002b | V021c0800 |
| X0b09090b02090b | V02010901 | X0b000900040002b | X0b13090404002b | X0b29090104002b | X0b01090717002b | X0305080a100506 |
| X0309090910090a | V02200901 | X0b00090010402b | X0b13090404002b | X0b29090404002b | X0b1809001702b | X0b05080210050 |
| X0b0a090110090a | X031f0909081f20 | X0b00090020402b | X0b14090004002b | X0b29090504002b | X0b2109071702b | X0b06080210050 |
| V02190901 | X0b1f090408120 | X0b00090030402b | X0b14090504002b | X0b29090704002b | X0a24090117002b | X031c0808181a1c |
| X030b09080c0810 | X031e09b10b20 | X0b01090204002b | X0b15090204002b | X0b2a090004002b | X0b2609090617002b | X0b1a080618 1a1c |
| X0b080907x00810 | X0b14090610b20 | X0b01090604002b | X0b15090204002b | X0b2a090104002b | X030f080b060f10 | X0b1b080618 1a1c |
| X0309090c180809 | X0b15090610b20 | X0b02090040002b | X0b15090404002b | X0b2a090504002b | X0b0f080306060f10 | V021d0800 |
| X0b09090218089 | X0b16090610b20 | X0b02090050402b | X0b15090504002b | X0b2b09090402b | X0b0f080506060f10 | X0304080b0c0405 |
| X0b04080 30a0405 | X032608092627 | X0b0f0807020420 | X0b21080204002b | X0b1708060c002b | V020a0701 | X0b170706100b20 |
| X0b04080 50a0405 | X0b26080009 2627 | X0b10080040402b | X0b21080304002b | X0b1808010c002b | X031007060080a14 | X0b180706100b20 |
| X0b0508010a0405 | X0b27080209 2627 | X0b10080704002b | X0b21080404002b | X0b1908060c002b | X0b0a0706080a14 | X0305070b070015 |
| V021e0800 | X0327080c102527 | X0b11080404002b | X0b21080604002b | X0b1c08030c002b | X0b0c0705080a14 | X0b04070307015 |
| X03030809120305 | X0b26080710252 | X0b11080704002b | X0b22080104002b | X0b1f08050c002b | X0b0f0703080a14 | X0b05070107015 |
| X0b040806120305 | V02280800 | X0b12080504002b | X0b22080304002b | X0b20080504002b | X0b10070108080a14 | X0b07070707015 |
| X031c080c011c1e | X0327080b152628 | X0b12080704002b | X0b22080404002b | X0b2208050c002b | X030a070c180a0b | X0b0d0700070015 |
| X0b1c080601 1c1e | X0a28080015262 | X0b13080404002b | X0b23080104002b | X0b26080504002b | X0b0a0700712080a0b | X0b110700 070015 |
| X0b1d080601 1c1e | X0329080a0226 2b | X0b13080504002b | X0b23080304002b | X0b26090402b | X0316070c071617 | X0b110705 070015 |
| X0b1e080601 1c1e | X0b26080102262 | X0b13080704002b | X0b23080404002b | X0b2906020c002b | X0b16070007161 7 | X0b1507030 70015 |
| V02010800 | X0b27080102262 | X0b14080004002b | X0b24080404002b | X0b2a08060c002b | X0309070c10090a | X0307070b0 b009 |
| V02200800 | X0b29080302262 | X0b14080304002b | X0b24080504002b | X0b2b080b0c002b | X0b09070210090a | X0b0407050b 0009 |
| X031f080a0810 20 | X0b0b08060 3002b | X0b14080404002b | X0b25080404002b | X031c080b0 d1c2b | X031807090817 18 | X0b0607030 b0009 |
| X0b1f08000 81020 | X0b0c0806030 02b | X0b14080404002b | X0b25080504002b | X0b1f08060 d1c2b | X0b18070408 1718 | X0b0707010 b0009 |
| X0b200802 081020 | X0b0c08060 3002b | X0b14080704002b | X0b25080704002b | X0b20080604 d1c2b | V02080701 | X0301070a180 007 |
| X0313080a100b20 | X0b0e080603 002b | X0b15080504002b | X0b26080304002b | X0b22080604d1c2b | X030b070b0c0810 | X0307070 8180007 |
| X0b0b0807 100b20 | X0b10080603 002b | X0b15080704002b | X0b26080404002b | X0b2308060d1c2b | X0b0807070c0810 | X0321070b011f21 |
| X0b0c0804 100b20 | X0b10080603 002b | X0b16080004002b | X0b27080404002b | X0b2408060d1c2b | X0308070c180809 | X0b1f07040 11f21 |
| X0b12080210 0b20 | X0b11080603 002b | X0b16080104002b | X0b27080504002b | X0b25080 60d1c2b | X0b0907060180809 | X0317070b111721 |
| X0b13080010 0b20 | X0b12080603 002b | X0b16080304002b | X0b27080704002b | X0b26080 60d1c2b | X0319070c07181 9 | X0b1c0702 111721 |
| X030a0808060 00a | X0b13080603 002b | X0b16080404002b | X0b27080704002b | X0b27080 40d1c2b | X0b19070007181 9 | X0321070a1 82021 |
| X0b06080606 00a | X0b28080603 002b | X0b16080404002b | X0b28080304002b | X0328080 c01e2b | X0307070a100708 | X0b21070712 2021 |
| X0b06080606 00a | X0b29080603 002b | X0b16080504002b | X0b28080504002b | X0b1f08020 c1e2b | X0307070a100708 | X0322070802 2022 |
| X0b0a080206 00a | X0b00080004 002b | X0b17080204002b | X0b28080704002b | X0b1f08020 c1e2b | X0318070b091 81a | X0b200701022 022 |
| X0312080b07 0015 | X0b00080104 002b | X0b17080504002b | X0b29080404002b | X0a22080 20c1e2b | X0b1a0702 0918 1a | X0b21070402 2022 |
| X0b0a0801070 015 | X0b00080204 002b | X0b17080704002b | X0b29080504002b | X0a23080 00c1e2b | X0312070b0 c111a | X0b22070402 2022 |

| | | | | | | |
|---|---|---|---|---|---|---|
| X0b0b0801070015 | X0b01080104002b | X0b18080504002b | X0b29080704002b | X0b2408020c1e2b | X0b1107030c111a | X0322070b102122 |
| X0b0b0804070015 | X0b01080204002b | X0b18080704002b | X0a2508020c1e2b | X0a2508020c1e2b | X0b1207000c111a | X0b220707102122 |
| X03010808090b0009 | X0b01080604002b | X0b19080004002b | X0b2a080004002b | X0b2608020c1e2b | X0b1207010c111a | V02240701 |
| X030808080b0009 | X0b02080004002b | X0b19080104002b | X0b2a080104002b | X0a2708000c1e2b | X0b1807030c111a | V02250701 |
| X030d08090d0013 | X0b02080104002b | X0b19080304002b | X0b2a080404002b | X0328080a10282b | V02060701 | X0325070c092425 |
| X0b0408010d0013 | X0b02080404002b | X0b19080404002b | X0b2b080904002b | X0b28080210282b | X030d070b12060f | X0b250706092425 |
| X0b0608010d0013 | X0b03080004002b | X0b19080504002b | X0b2b080a04002b | X0b28080410282b | X0b0607051206 0f | V02270701 |
| X0b0808000d0013 | X0b03080104002b | X0b1a080104002b | X0328080a09282b | X0b29080010282b | X0b0707001206 0f | X03270709092627 |
| X0b0c08010d0013 | X0b03080404002b | X0b1a080204002b | X0b29080109282b | X0310080912102b | X0b0b07001206 0f | X0b270706092627 |
| X0b0c08000d0013 | X0b04080004002b | X0b1a080304002b | X0320080c0a002b | X0b1008021210 2b | X0b0c0703120 60f | X0324078 01222b |
| X0b0f08010d0013 | X0b04080204002b | X0b1a080404002b | X0a01080a0a002b | X0b1208041210 2b | X0b0d07011206 0f | X0b24070501222b |
| X0b1108010d0013 | X0b04080404002b | X0b1a080504002b | X0b1908070a002b | X0b24080112102b | X0310070c01101b | X0b25070501222b |
| X0b1208000d0013 | X0b04080704002b | X0b1a080704002b | X0b1c08010a002b | X0324080818242b | X0b10070201101b | X0b27070501222b |
| X0304080a110011 | X0b05080404002b | X0b1b080104002b | X0b2108070a002b | X0b24080318242b | X0b14070501101b | X0b29070401222b |
| X0310080811011 | X0b05080504002b | X0b1b080204002b | X0b2208070a002b | X0b25080318242b | X0b18070201101b | X0329070b02262b |
| X0b0d0806110011 | X0b05080704002b | X0b1b080404002b | X0b02080060c002b | X0b27080318242b | X031b0709071a1b | X0b26070002262b |
| X03000804120002 | X0b06080404002b | X0b1c080204002b | X0b0308060c002b | V02110701 | X0b1a0704071a1b | X0b04070603002b |
| X0b01080412 0002 | X0b06080704002b | X0b1c080404002b | X0b0508030c002b | V020f0701 | V021c0701 | X0b05070603002b |
| X0311080a140017 | X0b07080204002b | X0b1c080504002b | X0b0708030c002b | X030c070c050c 0f | X031b070c081b1c | X0b06070603002b |
| X0b0a0806140017 | X0b07080504002b | X0b1c080704002b | X0b0708040c002b | X0b0c0700050c 0f | X0b1b070081b1c | X0b07070603002b |
| X0b1008041400 17 | X0b07080604002b | X0b1d080104002b | X0b0808030c002b | X0311070c061113 | V02040701 | X0b0c070603002b |
| X0b1108001400 17 | X0b07080704002b | X0b1d080304002b | X0b0808040c002b | X0b1107020611 13 | X030f070c000c1d | X0b0d070603002b |
| X03210808111721 | X0b08080004002b | X0b1d080404002b | X0b0908050c002b | X0b1107040611 13 | X0b0f0700000c1d | X0b0f070603002b |
| X0a1a0800111721 | X0b08080204002b | X0b1d080504002b | X0b0a08030c002b | X0b1307030611 13 | X0b1707030 00c1d | X0b10070603002b |
| X0a1c0800111721 | X0b08080504002b | X0b1d080504002b | X0b0b08030c002b | X0312070c111213 | X031c070b0 71c1d | X0b11070603002b |
| X0b1f0807111721 | X0b08080604002b | X0b1d080704002b | X0b0c0802 0c002b | X0b1207020 11213 | X0b1c0704071c1d | X0b12070603002b |
| V02230800 | X0b09080004002b | X0b1e080104002b | X0b0d08020c002b | X0b1207041 11213 | X031d0708081d1e | X0b0007004 002b |
| X031f080b091b23 | X0b09080204002b | X0b1e080204002b | X0b0d0802 0c002b | V02140701 | X0b1d0701081d1e | X0b000070104002b |
| X0a1b0800091b23 | X0b09080304002b | X0b1e080304002b | X0b0c0803 0c002b | X030f070a 0b0d0f | X03130706020c1f | X0b00070204002b |
| X0a1d0800091b23 | X0b09080404002b | X0b1e080404002b | X0b0f0802 0c002b | X0b0d0707 060d0f | X0b1f0702020c1f | X0b000070304002b |
| X0a1e0800091b23 | X0b09080604002b | X0b1e080504002b | X0b1008030c002b | X0b0f0705 b0d0f | X031707091 31 51f | X0b01070 04002b |
| X0322080a182223 | X0b0a080404002b | X0b1e080704002b | X0b1108020 c002b | X0314070c131314 | X0b1507071 31 51f | X0b010701 04002b |
| X0b220800182223 | X0b0a080504002b | X0b1f080104002b | X0b12080 30c002b | X0b1407021 31314 | X0b1807071 31 51f | X0b01070504002b |
| X0b230802182223 | X0b0a080704002b | X0b1f080304002b | X0b130801 0c002b | V020c0701 | X0b1a07071 31 51f | X0b02070004002b |
| V02250800 | X0b0b080004002b | X0b1f080404002b | X0b130802 0c002b | X0315070b0d1415 | X0b1c07071 c1d | X0b02070104002b |
| X0324080a092425 | X0b0c080404002b | X0b1f080404002b | X0b1408060c002b | X0b1507020d1415 | X0b1f07071 31 51f | X0b02070504002b |
| X0b240800092425 | X0b0c080704002b | X0b200080104002b | X0b1508010 c002b | V020b0701 | X0320070c081f20 | X0b03070004002b |
| X0b250802092425 | X0b0d080504002b | X0b20080304002b | X0b1508060c002b | X03150709081516 | X0b20070008 1f20 | X0b03070104002b |
| X0326080c002426 | X0b0d080704002b | X0b20080404002b | X0b1608060c002b | X0b15070408 1516 | X03140708100 b20 | X0b03070504002b |
| X0b240807002426 | X0b0e080504002b | X0b20080504002b | X0b16080702c002b | X0311070918 0c16 | X0b13070610 0b20 | X0b04070004002b |
| V02270800 | X0b0f080404002b | X0b21080010c002b | X0b17080102 c002b | X0b14070318 0c16 | X0b15070610 0b20 | X0b05070004002b |
| X0b05070504002b | X0b1e070704002b | X0b05070302c002b | X0b2807011 8242b | X0b1b060707 1a1b | X0b25070715 1 f25 | X0b0c060104002b |
| X0b06070004002b | X0b1e070704002b | X0b0707020c002b | X0b29070018242b | X031a060c0d191b | X0326060b112526 | X0b0c060304002b |
| X0b07070404002b | X0b1f070104002b | X0b07070300002b | X0b2a070018242b | X0b1c0604d191b | X0b26060011 2526 | X0b0c060504002b |
| X0b07070504002b | X0b1f070304002b | X0b08070200 c002b | V02110600 | X0b1c06000d191b | X0327060c 092627 | X0b0c060704002b |
| X0b08070304002b | X0b1f070504002b | X0b08070500 c002b | X03110609051011 | X03060609100506 | X0b27060109 2627 | X0b0d060204002b |
| X0b08070404002b | X0b20070404002b | X0b09070000 c002b | X0b10060505 1011 | X0b0506010 0506 | X0327060a10 2527 | X0b0d060304002b |
| X0b08070504002b | X0b20070504002b | X0b0a070500c002b | X0b11060510 5101 | X0b06060 3100506 | X0b25060610 2527 | X0b0d060404002b |
| X0b09070104002b | X0b20070704002b | X0b0a07050c002b | V02120600 | X031d060c000c1d | X0b26060610 2527 | X0b0d060704002b |
| X0b09070304002b | X0b2107014002b | X0b0b07020c002b | X030c060c130c10 | X03180608000c1d | X0b27060710 2527 | X0b0d060704002b |
| X0b09070404002b | X0b2107020 4002b | X0b0b0700 50c002b | X0b10060213 0c10 | X0b1e0602000c1d | X0328060b152628 | X0b0e060104002b |
| X0b09070504002b | X0b2107030 4002b | X0b0c0c070 20c002b | V020d0600 | X031c060c071c1d | X0b27060315 2628 | X0b0c060404002b |
| X0b09070704002b | X0b2107050 4002b | X0b0d0707 0c002b | V021140600 | X0b1c0604 071c1d | X0b27060515 2628 | X0b0f060104002b |
| X0b0a070304002b | X0b21070 70 40 02b | X0b0c0700 30c002b | X030d06 0c 06 0c | X0b1d06007 1c1d | X0b1506 06 03002b | X0b0f060304002b |
| X0b0a070404002b | X0b2207010 4002b | X0b0c07 020c002b | X0b0c060 50 60 0c | X031c060 801 1c1e | X0b1606 06 03002b | X0b0f060504002b |
| X0b0a070704002b | X0b22070204002b | X0b0d0700 70c002b | X03130 60c 091214 | X0b1d0607 011c1e | X0b1806 06 03002b | X0b0f060704002b |
| X0b0b070304002b | X0b22070304002b | X0b10070 00c002b | X0b1306 00 091214 | X0b1c06 00 011c1e | X0b19060 6 03 002b | X0b10060404002b |
| X0b0b070404002b | X0b22070504002b | X0b10070 30c002b | X0b14060 2091214 | X031f06 0b 071c1f | X0b1a060 6 03 002b | X0b10060704002b |
| X0b0b070604002b | X0b22070604002b | X0b12070 30c002b | X03130 60 9131314 | X0b1f060 7071c1f | X0b1b060603002b | X0b11060404002b |
| X0b0b070704002b | X0b23070104002b | X0b1307 00 0c002b | X0b130 60 213131 4 | X031706091 3151f | X0b1c060603002b | X0b11060504002b |
| X0b0c070404002b | X0b23070204002b | X0b1307010 c002b | X0a140 600 131314 | X0b15060 01 3151f | X0b1d060603002b | X0b11060704002b |
| X0b0c070404002b | X0b23070504002b | X0b13070 20 c002b | V02 0c 0600 | X0b1806 01 3151f | X0b1f060 11 51f | X0b12060404002b |
| X0b0d070404002b | X0b23070604002b | X0b14070 60 c002b | X030d06 0c 050c0d | X0b1a0600 1 3151f | X0b1a0600 1 3151f | X0b12060504002b |
| X0b0d070504002b | X0b23070704002b | X0b15070100 c002b | X0b0c06 0 60 50 c0d | X0b1c060013 151f | X0b23060 6 03 002b | X0b12060 704 002b |
| X0b0c070104002b | X0b24070304002b | X0b16070 20 c002b | X030b06 0c 060 0c | X0b1f06 0 01 3151f | X0b24060 6 03 002b | X0b13060 104 002b |
| X0b0c070304002b | X0b24070404002b | X0b16070 50 c002b | X0a0c0600060 0c | X031d06 0818 1d1f | X0b2906 06 03 002b | X0b13060 304 002b |
| X0b0c070404002b | X0b24070604002b | X0b170701 0c002b | X0315060 c081516 | X0b1d06 0 1181 d1f | X0b2a060 603 002b | X0b13060 404 002b |
| X0b0c070504002b | X0b24070704002b | X0b18070 10c002b | X0b15060 4081516 | X0b1c06 07 18 1d1f | X0b0006 01 04 002b | X0b13060 504 002b |
| X0b0c070704002b | X0b25070304002b | X0b19070 30c002b | X0b16060 0081516 | X0b1f06 0 6081 1f | X0b0006 02 04 002b | X0b130606 704 002b |
| X0b0f070404002b | X0b25070704002b | X0b1a0700 30c002b | X030c06 0c180c16 | X0b1f06 0c08 1f20 | X0b00 06 03 04 002b | X0b14060 104002b |
| X0b0f070704002b | X0b26070104002b | X0b1a0706 0c002b | X0b0c060 6180c16 | X0b20060 008 1 20 | X0b0106 01 04 002b | X0b14060 304 002b |
| X0b10070404002b | X0b26070304002b | X0b1b0706 00 0c 002b | X0b0f060618 0c 1 6 | X030 90 60 c06 000 a | X0b0106 03 04 002b | X0b14060 404 002b |
| X0b10070504002b | X0b26070404002b | X0b1b07060c002b | X0b110606 180 c16 | X0b070607 06 000 a | X0b0 106 04 04 002b | X0b14060 504 002b |
| X0b10070704002b | X0b26070504002b | X0b1c070 50c002b | X0b120606 180 c16 | X0b0806 01 06 000 a | X0b0106 07 04 002b | X0b14060 704 002b |
| X0b11070704002b | X0b26070704002b | X0b1d0707 020c002b | X030d06 0c 080a 14 | X0b0906 01 06 000 a | X0b0206 00 04 002b | X0b15060 304 002b |

| | | | | | | |
|---|---|---|---|---|---|---|
| X0b12070504002b | X0b27070304002b | X0b1d07050c002b | X0b0b0600080a14 | X0b0a050306000a | X0b02060704002b | X0b16060104002b |
| X0b12070704002b | X0b27070404002b | X0b1d07060c002b | X0b0c0600080a14 | X03140608070015 | X0b03060004002b | X0b16060304002b |
| X0b13070404002b | X0b28070004002b | X0b1e07030c002b | X0316060c091517 | X0b090606070015 | X0b03060104002b | X0b16060404002b |
| X0b13070504002b | X0b28070204002b | X0b1e07060c002b | X0b150602091517 | X0b0a0606070015 | X0b03060304002b | X0b17060004002b |
| X0b13070704002b | X0b28070404002b | X0b2007020c002b | X0b150607091517 | X0b100606070015 | X0b03060404002b | X0b17060104002b |
| X0b14070404002b | X0b28070504002b | X0b2007030c002b | X0b160607091517 | X030a060c09000b | X0b03060504002b | X0b17060304002b |
| X0b14070704002b | X0b29070104002b | X0b2007060c002b | V02080600 | X0b07060109000b | X0b03060704002b | X0b17060404002b |
| X0b15070504002b | X0b29070204002b | X0b2307030c002b | X0308060a0c0810 | X0b08060709000b | X0b04060004002b | X0b17060504002b |
| X0b16070104002b | X0b29070304002b | X0b2307060c002b | X0b1006030c0810 | X0b09060709000b | X0b04060104002b | X0b17060704002b |
| X0b16070304002b | X0b29070504002b | X0b2407020c002b | X0319060c071819 | X0b0a050109000b | X0b04060404002b | X0b18060304002b |
| X0b16070404002b | X0b29070604002b | X0b2607020c002b | X0b180602071819 | X0b0b060709000b | X0b05060004002b | X0b19060404002b |
| X0b16070604002b | X0b29070704002b | X0b2707020c002b | X0b180607071819 | X03020609120002 | X0b05060304002b | X0b19060504002b |
| X0b16070704002b | X0b2a070104002b | X0b2807030c002b | X0b190601071819 | X0b010601120002 | X0b05060404002b | X0b1a060104002b |
| X0b17070004002b | X0b2a070404002b | X0b2807060c002b | X0319060b181719 | X0b020603120002 | X0b05060704002b | X0b1a060304002b |
| X0b17070504002b | X0b2a070504002b | X0b2a07020c002b | X0b180611181719 | X03160602140017 | X0b06060004002b | X0b1a060504002b |
| X0b18070504002b | X0b2a070704002b | X0b2a07060c002b | X0b190607181719 | X030a0608140017 | X0b06060404002b | X0b1b060304002b |
| X0b19070404002b | X0b2b070904002b | X0b2b07080a002b | V02070600 | X03210609111721 | X0b06060704002b | X0b1b060404002b |
| X0b19070504002b | X0b2b070c04002b | X0b2b07080b002b | X0307060c100708 | X03170608111721 | X0b07060204002b | X0b1c060104002b |
| X0b19070604002b | X03140709061425 | X031d070c14182b | X0a080600100708 | V02230600 | X0b07060504002b | X0b1d060304002b |
| X0b19070704002b | X0b15070006142b | X0b19070114182b | X0318060c09181a | X0320060b091b23 | X0b07060604002b | X0b1d060404002b |
| X0b1a070504002b | X0b18070006142b | X0b1c070614182b | X0b18060409181a | X0b1d0605091b23 | X0b08060204002b | X0b1c060204002b |
| X0b1b070104002b | X0b1a070006142b | X0b1d070014182b | X0b19060009181a | X0b1e0605091b23 | X0b08060304002b | X0b1c060304002b |
| X0b1b070404002b | X0b1c070006142b | X0b2107014182b | X0318060a0c111a | X0b1f0605091b23 | X0b09060404002b | X0b1f060304002b |
| X0b1b070504002b | X0b1e070006142b | X0b2207014182b | X0b1306060c111a | X0323060c102324 | X0b09060504002b | X0b20060104002b |
| X0b1b070704002b | X0b1f070006142b | X0306070917002b | X0b1406060c111a | X0b2306021023 24 | X0b0a060404002b | X0b20060404002b |
| X0b1c070304002b | X0324070c08212b | X0b1a070117002b | X0307060b12060f | X0b23060410 23 24 | X0b0a060504002b | X0b21060004002b |
| X0b1d070304002b | X0a25070108212b | X0b1e070117002b | X0b090602120601 | X0b24060010 23 24 | X0b0a060704002b | X0b21060104002b |
| X0b1d070404002b | X0b27070008212b | X032a070c18242b | X0b0b060612060f | V02250600 | X0b0b060104002b | X0b21060204002b |
| X0b1d070704002b | X0b28070608212b | X0b25070018242b | X0b0f0601206 0f | X0325060b022325 | X0b0b060204002b | X0b21060304002b |
| X0b1e070004002b | X0b0107060c002b | X0b25070108242b | X031b060c071a1b | X0a230600022325 | X0b0b060304002b | X0b21060404002b |
| X0b1e070204002b | X0b0207060c002b | X0b25070408242b | X0b1a0602071a1b | X0321060c151c25 | X0b0b060504002b | X0b21060504002b |
| X0b1e070404002b | X0b0307060c002b | X0b27070718242b | X0b1a0607071a1b | X0240607151c25 | X0b0b060504002b | X0b21060704002b |
| X0b22060004002b | X0b1e06060c002b | X0b180520817 18 | X0b010501180007 | X0b0c050504002b | X0b1f050504002b | X0b0d05030c002b |
| X0b22060104002b | X0b20060200002b | X030805090c0810 | X0b020501180007 | X0b0c050704002b | X0b1f050704002b | X0b0d05050c002b |
| X0b22060204002b | X0b24060200002b | X0b0f05010c0810 | X0a020501180007 | X0b0d050404002b | X0b2005010402 b | X0b0c05060c002b |
| X0b22060404002b | X0b24060500002b | X0308050a180809 | X0b040501180007 | X0b0d050704002b | X0b20050404002b | X0b10050200c002b |
| X0b23060104002b | X0b25060400002b | X0b08050a180809 | X0b050501180007 | X0b0c050104002b | X0b20050504002b | X0b11050300c002b |
| X0b24060104002b | X0b25050500c002b | X0319050a181719 | X0a060501180007 | X0b0c050404002b | X0b20050704002b | X0b12050100c002b |
| X0b24060304002b | X0b26060200c002b | X0b17050618 1719 | X0b05010180007 | X0b0c050504002b | X0b21050404002b | X0b13050300c002b |
| X0b24060404002b | X0b27060400c002b | X031a050a0819 1a | X0b1d0506111721 | X0b0c050704002b | X0b21050504002b | X0b14050300c002b |
| X0b25060104002b | X0b28060400c002b | X0b1a050008191a | X0a1e0501111721 | X0b0f050404002b | X0b21050704002b | X0b14050600c002b |
| X0b25060204002b | X0b29060200c002b | X0318050b0c111a | X031d050a091b23 | X0b0f050504002b | X0b22050004002b | X0b15050200c002b |
| X0b25060304002b | X0b2a060200c002b | X0b1305060c111a | X03220508091b23 | X0b0f050704002b | X0b22050104002b | X0b15050300c002b |
| X0b26060100c002b | X0b2b060a0c002b | X0b0f170500091b23 | X0b1a0500091b23 | X0b10050404002b | X0b22050504002b | X0b16050400c002b |
| X0b26060404002b | X0b2b060b0c002b | X0b18050000111a | X0325050a092425 | X0b11050404002b | X0b23050004002b | X0b17050400c002b |
| X0b27060004002b | X0b2b060c0c002b | V02060501 | X0b25050109 24 25 | X0b11050504002b | X0b23050104002b | X0b17050500c002b |
| X0b27060204002b | X0320060c0c1e2b | V021b0501 | X031c0508 15 1c25 | X0b11050704002b | X0b23050504002b | X0b18050300c002b |
| X0b27060604002b | X032b06040c1e2b | X030a050a120601 | X0b1f0506151c25 | X0b12050404002b | X0b24050304002b | X0b18050400c002b |
| X0b28060004002b | X0b1f06020c1e2b | X0a0d050112060f | V02270501 | X0b12050504002b | X0b24050604002b | X0b19050500c002b |
| X0b28060104002b | X0b2106060c1e2b | X031405060101b | X0326050a092627 | X0b12050704002b | X0b25050004002b | X0b1a05020c002b |
| X0b28060204002b | X0329060c152923 | X0b14050101101b | X0b26050009 26 27 | X0b13050004002b | X0b25050204002b | X0b1a05050c002b |
| X0b28060404002b | X0b29060015292b | X0b17050101101b | X0b2705000926 27 | X0b13050504002b | X0b25050304002b | X0b1b05030c002b |
| X0b29060104002b | X0b2a060015292b | X031905090d191b | X0322050c01222b | X0b14050004002b | X0b25050404002b | X0b1c05020c002b |
| X0b29060404002b | X0324060918242b | X0b1a05060d191b | X0b240500 01222b | X0b14050504002b | X0b25050604002b | X0b1c05060c002b |
| X0b2a060104002b | X0b2b060918242b | X0a1b05010d191b | X0b28050701222b | X0b15050404002b | X0b26050104002b | X0b1d05020c002b |
| X0b2a060404002b | V02100501 | X03050509100506 | X0b00050204002b | X0b15050504002b | X0b26050404002b | X0b1f05020c002b |
| X0312060905122b | X0b100506b051011 | X0b0505003100506 | X0b00050304002b | X0b15050604002b | X0b26050504002b | X0b2005020c002b |
| X0320060805122b | X0b10050605 1011 | X0b0a0603100506 | X0b01050204002b | X0b15050704002b | X0b26050704002b | X0b2005060c002b |
| X0b12060305122b | X0b11050605 1011 | V021c0501 | X0b01050704002b | X0b16050104002b | X0b27050304002b | X0b2105020c002b |
| X0b22060605122b | X0310050a060f10 | X031c050c081d1c | X0b02050704002b | X0b16050304002b | X0b27050404002b | X0b2105030c002b |
| X0b0006000c002b | X0a100501060f10 | X0b1c05068 1d1c | X0b03050204002b | X0b16050404002b | X0b27050604002b | X0b2105060c002b |
| X0b0106050c002b | X03100509090f 11 | V02020501 | X0b03050504002b | X0b16050704002b | X0b27050704002b | X0b2205060c002b |
| X0b0106060c002b | X0b100503090f 11 | X031a050913 151f | X0b03050704002b | X0b17050304002b | X0b28050004002b | X0b2305060c002b |
| X0b0206050c002b | X0b1005050901f1 | X0a150501131515 f | X0b04050104002b | X0b17050704002b | X0b28050104002b | X0b2405020c002b |
| X0b0206060c002b | X0b110501090f 11 | X0b160506131515 f | X0b04050704002b | X0b18050504002b | X0b28050204002b | X0b2405040c002b |
| X0b0306060c002b | X0311050a131112 | X031f050a081f20 | X0b05050004002b | X0b18050604002b | X0b28050504002b | X0b24050504002b |
| X0b0406060c002b | X0b110500131112 | X0b1f0500081f20 | X0b06050004002b | X0b18050704002b | X0b29050004002b | X0b2505050c002b |
| X0b0506050c002b | X0b120500131112 | X030b050805000b | X0b06050204002b | X0b19050004002b | X0b29050104002b | X0b2605020c002b |
| X0b0506060c002b | X030c050a050c0f | X0b03050105000b | X0b06050504002b | X0b19050104002b | X0b29050504002b | X0b2605060c002b |
| X0b0606050c002b | X0b0c0500050c0f | X030c050b070015 | X0b07050104002b | X0b19050204002b | X0b2a050004002b | X0b2705020c002b |
| X0b0606060c002b | X0b0f0500050c0f | X0309050207 0015 | X0b07050304002b | X0b19050304002b | X0b2a050104002b | X0b2705050c002b |
| X0b0706030c002b | X0312050c111213 | X0b0a0502070015 | X0b07050504002b | X0b19050404002b | X0b2a050204002b | X0b2805040c002b |
| X0b0706040c002b | X0b120503111213 | X0b0b0502070015 | X0b07050604002b | X0b19050504002b | X0b2a050504002b | X0b2805060c002b |
| X0b0806040c002b | V020d0501 | X0b0d0502070015 | X0b07050704002b | X0b19050704002b | X0b2a050704002b | X0b2905060c002b |
| X0b0806050c002b | X03140508091214 | X0b0c0502070015 | X0b08050104002b | X0b1a050104002b | X0320050a07202b | X0b2a05050c002b |
| X0b0906000c002b | X0b120506091214 | X0b0f0502070015 | X0b08050104002b | X0b1a050304002b | | X0b2b05050b0c002b |

| | | | | | | |
|---|---|---|---|---|---|---|
| X0b0906030c002b | V02150501 | X0b110502070015 | X0b08050304002b | X0b1a050404002b | X0b20050007202b | X0b2b050c0c002b |
| X0b0a06000c002b | X030c050a050c0d | X0b120502070015 | X0b08050404002b | X0b1a050704002b | X0b21050107202b | X032a050a15292b |
| X0b0b06040c002b | X0b0c0500050c0d | X0304050a0b0009 | X0b08050504002b | X0b1b050004002b | X0b25050707202b | X0b2b050a15292b |
| X0b0c06040c002b | X0b0d0500050c0d | X0b0305000b0009 | X0b08050604002b | X0b1b050504002b | X0321050a08212b | X0b2b050918242b |
| X0b0d06040c002b | X030c05090b0c | X0b0405020b0009 | X0b08050704002b | X0b1b050604002b | X0b21050008212b | X0b2b050918242b |
| X0b0e06020c002b | X0b0b0507060b0c | X0b05050060b0009 | X0b09050304002b | X0b1c050104002b | X0b24050108212b | V02100400 |
| X0b0f06020c002b | X0315050b081516 | X0b0605060b0009 | X0b09050404002b | X0b1c050404002b | X0b24050708212b | X030f040c060f10 |
| X0b1006000c002b | X0b150500081516 | X0313050b0d0013 | X0b09050404002b | X0b1c050504002b | X0b0005000c002b | X0a100400060f10 |
| X0b1106020c002b | X0314050c080a14 | X0b0605070d0013 | X0b09050504002b | X0b1d050104002b | X0b0005010c002b | X030f0409090f11 |
| X0b1106030c002b | X0b0b0501080a14 | X0b0605030d0013 | X0b09050604002b | X0b1d050404002b | X0b0105040c002b | X0b110402090f11 |
| X0b1206010c002b | X0b0c0506080a14 | X0b0c05030d0013 | X0b09050704002b | X0b1d050304002b | X0b0105050c002b | X03120406111213 |
| X0b1206020c002b | X0b0d0506080a14 | X0b0f0503d0d013 | X0b0a05010d0013 | X0b1d050404002b | X0b0205040c002b | X0b130405111213 |
| X0b1506050c002b | X0b0f0506080a14 | X0b1005070d0013 | X0b0a05030d0013 | X0b1d050504002b | X0b0205050c002b | X030d0409060d0c |
| X0b1606020c002b | X030a05090b0a0c | X0b1305010d0013 | X0b0a05040d0013 | X0b1d050704002b | X0b0205050c002b | X0b0c0402060d0c |
| X0b1606050c002b | X0b0c05010b0a0c | X030105090c0003 | X0b0a05050d0013 | X0b1e050004002b | X0b0305030c002b | X0313040b0b1315 |
| X0b1706060c002b | X0316050a071617 | X0b0105030c0003 | X0b0a05060d0013 | X0b1e050204002b | X0b0305040c002b | X0b150407b01315 |
| X0b1806050c002b | X0b160502071617 | X0b0205030c0003 | X0b0a05070d0013 | X0b1e050304002b | X0b0305060c002b | X031404080d1415 |
| X0b1906020c002b | V02180501 | X0302050a120002 | X0b0c05000a4002b | X0b1e050404002b | X0b0405040c002b | X0b1404070d1415 |
| X0b1906030c002b | X0309050a10090a | X0b0105000120002 | X0b0c05020a4002b | X0b1e050504002b | X0b0405060c002b | V02160400 |
| X0b1b06020c002b | X0b09050010090a | X0b0105060120002 | X0b0c0505040 02b | X0b1e050704002b | X0b0505050c002b | X030b040a060b0c |
| X0b1b06050c002b | X0b0a050010090a | X0b020502120002 | X0b0c050504002b | X0b1f050104002b | X0b0605030c002b | X0b0c0402060b0c |
| X0b1d06020c002b | X0317050a081718 | X0b020506120002 | X0b0c05060504002b | X0b1f050304002b | X0b0605050c002b | X0315040a081516 |
| X0b1e06040c002b | X0b170502081718 | X0303050d180007 | X0b0c050504002b | X0b1f050404002b | X0b0705020c002b | X0b150402081516 |
| X0b160402081515 | X0b020400080003 | X0b030401040021 | X0b1a040404002b | X0b0505040c002b | X0b0805020c002b | X0306030c0c0607 |
| X030f040b180c16 | X0b030400080003 | X0b040401040021 | X0b1b040004002b | X0b0605040c002b | X0b160401160002b | X0b0603020c0607 |
| X0b0c0401180c16 | X0302040c0b0009 | X0b050500040021 | X0b1b040404002b | X0b0605050c002b | X0b170401160002b | X030d030912060f |
| X0b0f0403180c16 | X0b08040050b0009 | X0b05040104002b | X0b1c040104002b | X0b0605040c002b | X0b19040116002b | X0b0903041206f0 |
| X0b100407180c16 | X0310040b0d0013 | X0b050404004002b | X0b1d040304002b | X0b0804020c002b | X0b1d040116002b | X0306030a100506 |
| X0b110407180c16 | X0b09040604002b13 | X0b060404004002b | X0b1d040404002b | X0b0c04030c002b | X0b20040016002b | X0b050300100506 |
| X030c040b080a14 | X0b0a040604002b13 | X0b060402040 02b | X0b1d040504002b | X0b0c04050c002b | X0b21040016002b | V021d0301 |
| X0b0a0402080a14 | X0b0c040604002b13 | X0b0c040104002b | X0b1e040104002b | X0b0f04050c002b | X030f040a170002b | X031d030b0c1b1d |
| X0b0b0402080a14 | X0b0c0406040d0013 | X0b06040404002b | X0b1e040304002b | X0b1204050c002b | X0b0a040117002b | X0b1b03070c1b1d |
| X0b0e0402080a14 | X0b0d04040d0013 | X0b06040604002b | X0b1304050c002b | X0b0f0402040 02b | X0b0c040417002b | V021f0301 |
| X0b120402080a14 | X0b0f0406040d0013 | X0b070401040 02b | X0b1f040204002b | X0b1404060c002b | X0b0f040117002b | X0319030a13151f |
| V02180400 | X0b11040604 0d0013 | X0b08040404002b | X0b15040404002b | X0b1c040417002b | X0b1304060c002b | X0b170307131151f |
| X030b040a902090h | X0b120406040d0013 | X0b09040104002b | X0b20040104002b | X0b1504040c002b | X0b1e040417002b | X0b1e030713151f |
| X0b09040202090b | X030104a0e0003 | X0b0904030040 02b | X0b2004020002b | X0b16040304002b | X0325040a18242b | X030a030b06000a |
| X0317040c081718 | X0b010402e0e0003 | X0b09040504002b | X0b21040404002b | X0b1604040c002b | X0325040818242b | X0b0103010600a |
| X0b170400081718 | X0b020420e0e0003 | X0b0a040404002b | X0b21040504002b | X0b1704040c002b | X0b2804018242b | X03010306080003 |
| X030e0408080809 | X0318040fd0 019 | X0b0d040704002b | X0b22040004002b | X0b17040504002b | X0310030c051011 | X0b0003010800003 |
| X0b0e04031800809 | X0b080407f0 019 | X0b06040104002b | X0b22040404002b | X0b18040404002b | X0b110304051011 | X0302030906009 |
| X0318040c071819 | X0302040910004 | X0b0604020504002b | X0b23040004002b | X0b19040304002b | V020f0301 | X0b08030605b0009 |
| X0b180402071819 | X0b030406100004 | X0b0604030404 02b | X0b2304041004002b | X0b19040604002b | X030e030b050c0f | X030000500c0003 |
| V02070400 | X0b040406100004 | X0b0b040504002b | X0b23040404002b | X0b1a04020c002b | X0b0c030305c0f | X0b02030200e0003 |
| X0309040b080709 | X0311040c110011 | X0b0b040704002b | X0b24040104002b | X0b1a04050c002b | X0b0f030305c0f | X0310030b110011 |
| X0b07040608070 9 | X0b090400110011 | X0b0c04010402b | X0b240402040 02b | X0b1b04030c002b | X03120309111213 | X0b0103061100011 |
| X0b0804060807709 | X0b0c0400110011 | X0b0c04030c 002b | X0b24040304002b | X0b1b04040c002b | X0b1303000111213 | X03000306120002 |
| X0307040a100708 | X0b0c0400110011 | X0b0c040504002b | X0b24040604002b | X0b1b04060c002b | X030c030c06b0f0f | X0b02030412000 2 |
| X0b0704021100708 | X0b110400110011 | X0b0c04070402 0b | X0b1d04020c002b | X0b1e04020c002b | X0b0d03000b0b0d0f | X0321030c011f21 |
| X0b070404 1100708 | X0301040b120002 | X0b0d04010404b002b | X0b24040704002b | X0b1e04050c002b | X0b0c03020b0d0f | X0b1f030701121 |
| X0b080400100708 | X0b00040102000 2 | X0b0d040304002b | X0b25040004002b | X0b1f04040c002b | X0b0c030306b0d0f | X0b20030401121 |
| X0319040c08191a | X0b0004011200 02 | X0b0d04040 4002b | X0b25040104002b | X0b1e04060c002b | X0b0e030600b0d0f | X031a030c111721 |
| X0b19040008191a | X0b010401100 02 | X0b0d04 050402 0b | X0b25040204002b | X0b1f040304 002b | V021f0301 | X0b21030611721 |
| X0312040a0c 1f21 | X0031f0140 0111f21 | X0b0d040404002b | X0b25040404002b | X0b1f04050c002b | X030b0303c06b0b | V022203 01 |
| X0b1104040c 1f21 | X0b210401011f21 | X0b0c040404002b | X0b26040304002b | X0b2004050c002b | X0b0b0302060b0c | X0324030b1023 24 |
| X0b1204000c 1f21 | X031c040a111721 | X0b0c04070 4002b | X0b2104030c002b | X0b0c0302060b0c | X0b24030410 2324 |
| X0b1204070c 1f21 | X0b1f040011721 | X0b0f040404002b | X0b22040304002b | X0316030b081516 | X03220309112224 |
| X0b1a04000c 1f21 | X0b1f040011 1721 | X0b0f0407040 02b | X0b22040504002b | X0b160307081516 | X0b22030711222 4 |
| X03080409020608 | X0b200404111721 | X0b10040104002b | X0b27040404002b | X0b2204060c002b | X0314030c180c16 | X0b23030411222 4 |
| X0b08040102 0608 | X0321040a002123 | X0b10040204002b | X0b27040504002b | X0b22040060c002b | X0b0f030718b0c16 | X0b24030111222 4 |
| X03060409b06 07 | X0323040800 2123 | X0b10040304002b | X0b27040704002b | X0b2304040 c002b | V021703 01 | X031e030c151c2 5 |
| X0b0604070c0 607 | X0b210407002123 | X0b10040404002b | X0b28040104002b | X0b24040004002b | X0303030b0b00c | X0b2003001 51c25 |
| X0306040b12 060f | X0321040909b23 | X0b10040504002b | X0b28040204002b | X0b25040404002b | X0b0a03020b b0a0c | X0b22030015 1c25 |
| X0b09040712060f | X0b1b0407091b23 | X0b10040604002b | X0b28040304002b | X0b2604020 4002b | X030a03001 10090a | X0b230300151c 25 |
| X031604090 1101b | X0b1f0407091b23 | X0b11040104002b | X0b28040504002b | X0b260405 0c002b | X0b0903021009a | X0b24030015 1c25 |
| X0b1904020 1101b | X0b22040709 1b23 | X0b11040304002b | X0b28040604002b | X0b27040304 002b | X0b0a0301009a | X0326030900 2426 |
| V021c0400 | X02240 400 | X0b1104050 04002b | X0b28040704002b | X0b2904050c 002b | V02080 301 | X0b240306002426 |
| V02040400 | X031c0409151c25 | X0b12040 30404002b | X0b29040004002b | X0b29040600c002b | V02190 301 | V022703 01 |
| X0304040c080406 | X0b2004071510c25 | X0b120400304002b | X0b29040304002b | X0b2a04040 c002b | X030c0300b0810 | X0326030c092 627 |
| X0b060401080406 | X0b22040115 1c25 | X0b13040 0504002b | X0b29040404002b | X0b2a040 60c002b | X0b0b0300 00c0810 | X0b26030209 2627 |
| X031c040a071c1d | X03260408 112526 | X0b13040030 4002b | X0b29040704002b | X0b2b04 0900c002b | X0b0c030e0c0 810 | X0b26030609 2627 |
| X0b1c04020711c1d | X0b26040 0112526 | X0b130403 04002b | X0b2a040204002b | X0b2b04060c 002b | X0b0c0301 0c0810 | X0b27030409 2627 |
| X0b1c04040711c1d | X0326040 c09262 7 | X0b14040 04002b | X0b2a04040 4002b | X0b2b0400c 002b | X0a0f03010c0 810 | X0b27030609 2627 |
| X0b1d04000711c1d | X0b2604060 92627 | X0b14040 104002b | X0b2a0405 04002b | X0311040b12102b | X0308030c180809 | X0326030b1528 28 |
| X0303040a120305 | X0b26040 6092627 | X0b14040304002b | X0b2a04070 4002b | X0b15040612102b | X0308030c180809 | X0b26030115262 8 |
| X0b030402120305 | X0327040b102527 | X0b14040404002b | X0b0b040c0 002b | X0b16040612102b | X0b08030018 0809 | X0b2703031528 28 |

```
X0b040402120305   X0b260401102527   X0b14040504002b   X0b0a04070a002b   X0b1a040612102b   X0b090300180809   V022a0301
X031f0409071e1f   X0b270403102527   X0b15040104002b   X0b0b04060a002b   X0b1c040612102b   X0318030b071819   X0328030b02262b
X0b1c0407071e1f   X0327040a152628   X0b13040704002b   X0b1d040612102b   X0b180300071819   X0b26030002262b
X0b1f0401071e1f   X0b270400152628   X0b15040504002b   X0b1604070a002b   X0b1f040612102b   X0b190300071819   X0b26030302262b
X031d040913151f   X0324040a01222b   X0b17040204002b   X0b1704070a002b   X0b20040612102b   X03070308080709   X0a27030102262b
X0b1a040713151f   X0b2b040a01222b   X0b17040304002b   X0b1904070a002b   X0b21040612102b   X0b080303080709   X0a28030002262b
X0b1b040113151f   X0b010406603002b   X0b18040104002b   X0b1d04070a002b   X032a040615292b   X0307030c100708   X0b29030302262b
X030b040b100b20   X0b020406603002b   X0b18040304002b   X0b1e04000a002b   X0b29040115292b   X0b070300100708   X0b2a030002262b
X0b150400100b20   X0b170406603002b   X0b18040504002b   X0b0004030c002b   X0b2a040015292b   X0b080302100708   X0a2a030102262b
X0a160400100b20   X0b180406603002b   X0b18040704002b   X0b01040630c002b   X0b2a040315292b   X0b080304100708   X0b000302304002b
X030a040c06000a   X0b000402304002b   X0b19040304002b   X0b0104040c002b   X030d040a16002b   X0319030c08191a   X0b010303304002b
X0a07040006000a   X0b010405504002b   X0b19040504002b   X0b0204040c002b   X0b0c040416002b   X0b19030208191a   X0b010303304002b
X03030409080003   X0b010407704002b   X0b1a040104002b   X0b0304040c002b   X0b0d040016002b   V02060301         X0b02030104002b
X0b010400080003   X0b020401104002b   X0b1a040304002b   X0b0404040c002b   X0b12040116002b   V021b0301         X0b02030504002b
X0b02030704002b   X0b14030404002b   X0b23030704002b   X0b15030505c002b   X0b0d020108a014   X0320020b081f20   X0b08020704002b
X0b03030004002b   X0b14030604002b   X0b24030704002b   X0b16030305c002b   V02180200          X0b20020708f120   X0b09020104002b
X0b03030104002b   X0b14030704002b   X0b24030504002b   X0b17030305c002b   X0309020b02090b   X030b020b050006   X0b09020404002b
X0b03030204002b   X0b15030104002b   X0b24030704002b   X0b17030405c002b   X0b09020205006b   X0b050200050006   X0b0a020104002b
X0b04030004002b   X0b15030104002b   X0b25030104002b   X0b17030505c002b   X0b0a020602090b   X0a060200050006   X0b0a020404002b
X0b04030104002b   X0b15030204002b   X0b25030204002b   X0b18030205c002b   X0309020c10090a   X03000207080003   X0b0b020404002b
X0b04030504002h   X0b15030304002b   X0b25030504002b   X0b18030305c002b   X0b09020100090a   X0b020202080003   X0b0b020704002b
X0b05030104002b   X0b15030604002b   X0b25030704002b   X0b18030405c002b   X0b0a020010090a   X030002040c0003   X0b0c020704002b
X0b05030204002b   X0b15030704002b   X0b26030404002b   X0b18030605c002b   V02080200          X0b0202040c0003   X0b0d020504002b
X0b05030504002b   X0b16030104002b   X0b26030504002b   X0b19030305c002b   V02190200          X03000206120002   X0b0d020704002b
X0b05030704002b   X0b16030204002b   X0b26030704002b   X0b19030505c002b   X030c020c0c0810   X0b02020512002   X0b0e020504002b
X0b06030304002b   X0b16030404002b   X0b27030204002b   X0b1a030505c002b   X0b0b02000c0810   X0306020b13000d   X0b0e020704002b
X0b06030504002b   X0b16030504002b   X0b27030504002b   X0b1b030505c002b   X0b0c02020c0810   X0b05020613000d   X0b0f020404002b
X0b06030604002b   X0b16030604002b   X0b27030704002b   X0b1c030605c002b   X0b0d02060c0810   X0b06020613000d   X0b0f020604002b
X0b07030104002b   X0b17030004002b   X0b28030404002b   X0b1d030305c002b   X0b0e02060c0810   X0b07020613000d   X0b0f020704002b
X0b07030404002b   X0b17030204002b   X0b28030504002b   X0b1e030505c002b   X0318020c071819   X0b08020613000d   X0b10020204002b
X0b07030504002b   X0b17030404002b   X0b28030704002b   X0b1f030405c002b   X0b18020207181b   X0b06020613000d   X0b10020404002b
X0b07030704002b   X0b18030305c002b   X0b29030204002b   X0b1f030505c002b   X0b19020207181b   X0b0c020613000d   X0b11020104002b
X0b08030604002b   X0b18030704002b   X0b29030504002b   X0b20030505c002b   X0308020b100708   X031b020b111721   X0b11020204002b
X0b08030704002b   X0b19030404002b   X0b29030704002b   X0b21030505c002b   X0b07020100708    X0b180207111721   X0b11020304002b
X0b09030104002b   X0b19030604002b   X0b2a030404002b   X0b22030405c002b   X0319020b08191a   X0321020c182021   X0b11020404002b
X0b09030304002b   X0b19030704002b   X0b2a030504002b   X0b22030505c002b   X0b19020108191a   X0b20020018202    X0b12020004002b
X0b09030604002b   X0b1a030004002b   X0b2a030704002b   X0b23030605c002b   X0316020a0c1111   X0322020c102122   X0b12020404002b
X0b09030704002b   X0b1a030204002b   X0328030a09282b   X0b24030605c002b   X0a11020006111a   X0b21020510212   X0b14020404002b
X0b0a030104002b   X0b1a030304002b   X0b2b030a09282b   X0b25030405c002b   X0b11020706111a   X0322020b090212    X0b14020704002b
X0b0a030304002b   X0b1a030404002b   X032a03090a002b   X0b25030605c002b   X0b14020006111a   X0321020800212    X0b15020204002b
X0b0a030404002b   X0b1a030604002b   X030b03080a002b   X0b28030305c002b   X0b15020706111a   X0b2102020200212   X0b15020304002b
X0b0a030504002b   X0b1a030704002b   X0b0b03010a002b   X0b28030605c002b   V02060200         X0b22020030020212   X0b16020104002b
X0b0a030604002b   X0b1b030004002b   X0b0c03010a002b   X0b29030405c002b   X0306020c0e0607   X0b23020002212     X0b16020204002b
X0b0a030704002b   X0b1b030204002b   X0b0d03010a002b   X0b2b030905c002b   X0b07020700e607   X0320020c091b23    X0b16020604002b
X0b0b030504002b   X0b1b030304002b   X0b18030102b     X0b2b030b05c002b   X030c020b12060f   X0b1d02050901b23    X0b17020404002b
X0b0b030704002b   X0b1b030404002b   X0b2802301002b   X0b2b030c05c002b   X0b09020212060f   X0324020b102324    X0b17020604002b
X0b0c030504002b   X0b1b030604002b   X03210030b0162b  X0322030c10282b   X0b0a02021260f    X0b24020010324    X0b18020404002b
X0b0c030704002b   X0b1c030004002b   X031603080b162b  X0b29030010282b   X0319020a01101b   X0323020c022325    X0b19020404002b
X0b0d030204002b   X0b1c030104002b   X0b1a03010b162b  X0b29030610282b   X0b10020601101b   X0b25020502325    X0b19020504002b
X0b0d030504002b   X0b1c030204002b   X0b1c03010b162b  X0b2a030210282b   X0b12020101101b   X031c020c151c25   X0b1a020204002b
X0b0d030704002b   X0b1c030404002b   X0b20030101162b  X0b2a030610282b   X0b14020601101b   X0b1f0202151c25    X0b1a020404002b
X0b0c030504002b   X0b1c030504002b   X0b000030000c002b X0329030b15292b  X0b15020011011b   X0b20020215c25     X0b1b020404002b
X0b0c030704002b   X0b1c030704002b   X0b000030c0002b   X0b29030115292b   X0305020c100506   X0b22020215c25    X0b1b020604002b
X0b0f030004002b   X0b1d030004002b   X0b010305c002b    X0b2a030315292b   X0b05020210056    X0b23020215c25   X0b1b020704002b
X0b0f030204002b   X0b1d030504002b   X0b020306c002b    X0328030b18242b   X0b06020210056    X0b24020215c25   X0b1c020204002b
X0b0f030404002b   X0b1d030604002b   X0b03030605c002b  X0b25030018242b   X0b1c020a001e1d   X0325020c112526   X0b1d020004002b
X0b10030104002b   X0b1c030004002b   X0b04030605c002b  X0b27030018242b   X0a10020001e1d    X0b25020112526    X0b1d020104002b
X0b10030204002b   X0b1c030204002b   X0b05030405c002b  X0b28030218242b   X0b12020700e1d    X0b26020112526   X0b1d020304002b
X0b10030304002b   X0b1c030304002b   X0b050305c002b    V02100200          X0b14020200e1d    X0327020c152628   X0b1d020404002b
X0b10030604002b   X0b1c030404002b   X0b06030405c002b  V02110200         X0b15020600e1d    X0b27020152628    X0b1e020104002b
X0b10030704002b   X0b1c030604002b   X0b07030202b     X031002080605f10   X0b150206000e1d   X0b28020212628    X0b1e020504002b
X0b11030104002b   X0b1f030004002b   X0b070306b002b   X0b1a02070605f10   X0b1a020700e1d    X0327020b00272b   X0b1e020604002b
X0b11030204002b   X0b1f030204002b   X0b09030506c002b  V020c0200          X0b31020b01c1e    X0b29020600272b  X0b1e020704002b
X0b11030304002b   X0b1f030304002b   X0b0b0303c002b   X0312020911121b   X0b1c02070111c1c   X0b2a02060b0272b  X0324020c01222b
X0b11030604002b   X0b1f030604002b   X0b0b03040c002b   X0b13020211121b   V02020200          X0324020b01222b   X0b1c02070704002b
X0b11030704002b   X0b20030204002b  X0b0b03060c002b   X030d020c06d0c   X0314020b020c1f   X0327020501222b    X0b1f020604002b
X0b12030004002b   X0b20030304002b  X0b0c03030c002b   X0b0d02050d0c   X0b1302070201f    X0b00020204002b   X0b21020104002b
X0b12030104002b   X0b20030604002b  X0b0c030b04002b   X0b0c02020606d0c   X0b17020007021f   X0b0102010402b    X0b21020304002b
X0b12030304002b   X0b20030704002b  X0b0c030b05c002b  X030f020c06d0f    X0b18020502c1f    X0b01020104002b   X0b21020404002b
X0b12030504002b   X0b21030004002b  X0b0c030306c002b  X0b0d02030c0d0f   X0b19020602c1f    X0b01020404002b   X0b21020704002b
X0b12030604002b   X0b21030104002b  X0b0c030405c002b  X0b0c02030b5d0f   X0b1c020020c1f    X0b02020004002b   X0b22020504002b
X0b13030104002b   X0b21030204002b  X0b0c030406c002b  X030d020b050c0d   X031f0206071e1f   X0b03020204002b   X0b22020604002b
X0b13030204002b   X0b21030304002b  X0b0c030306c002b  X0b0c020005b0d    X0b1f02070701e1f   X0b03020404002b   X0b22020704002b
X0b13030304002b   X0b21030404002b  X0b0c030405c002b  X0b0c02050506d    X0315020b13151f    X0b03020704002b   X0b24020704002b
X0b13030504002b   X0b21030704002b  X0b0f030505c002b  X0315020c0d1415   X0b160201013151f   X0b04020004002b   X0b25020104002b
X0b13030604002b   X0b22030204002b  X0b10030404002b  X0b1502010d1415   X0b19020713151f   X0b04020404002b   X0b25020304002b
```

| | | | | | | |
|---|---|---|---|---|---|---|
| X0b13030704002b | X0b22030304002b | X0b1003050c002b | X0314020a180c16 | X0b1b020013151f | X0b04020704002b | X0b25020404002b |
| X0b14030004002b | X0b22030604002b | X0b1103050c002b | X0b0f0200180c16 | X031e0209001e20 | X0b05020104002b | X0b25020704002b |
| X0b14030104002b | X0b23030104002b | X0b1303040c002b | X0b110206180c16 | X0b1e0203001e20 | X0b06020104002b | X0b26020404002b |
| X0b14030204002b | X0b23030204002b | X0b1403050c002b | X0b130206180c16 | X0b1f0200001e20 | X0b07020204002b | X0b26020504002b |
| X0b14030304002b | X0b23030504002b | X0b1503040c002b | X030a020c080a14 | X0b200206001e20 | X0b08020404002b | X0b26020704002b |
| X031e0d0b081d1e | X0b0f0d07004002b | X0b280d0504002b | X0b1e0d030c002b | X0b250e07071c25 | X0b230e050c002b | |
| X0b1e0d06081d1e | X0b100d00004002b | X0b290d0104002b | X0b1e0d040c002b | X0b000e0204002b | X0b250e050c002b | |
| V02200c00 | X0b100d0104002b | X0b290d050-002b | X0b1f0d040c002b | X0b010e0104002b | X0b2b0e0c0c002b | |
| X03200d0a081f20 | X0b100d0204002b | X0b290d0704002b | X0b1f0d060c002b | X0b020e0104002b | | |
| X0b1f0d00081f20 | X0b100d0504002b | X0b2a0d0104002b | X0b200d020c002b | X0b030e0104002b | | |
| X0b200d04081f20 | X0b110d0104002b | X0b2a0d0504002b | X0b200d060c002b | X0b040e0104002b | | |
| X03150d0c070015 | X0b110d0404002b | X0b2a0d0704002b | X0b210d040c002b | X0b050e0104002b | | |
| X0b060d07070015 | X0b110d0504002b | X0b2b0d0904002b | X0b210d060c002b | X0b060e0104002b | | |
| X03140d0a0f0019 | X0b110d0704002b | X0b2b0d0a04002b | X0b210d070c002b | X0b070e0304002b | | |
| X0b090d060f0019 | X0b120d0104002b | X0b000d000c002b | X0b220d040c002b | X0b070e0704002b | | |
| X0b0a0d060f0019 | X0b120d0504002b | X0b000d010c002b | X0b220d070c002b | X0b080e0704002b | | |
| X0b130d000f0019 | X0b130d0204002b | X0b010d040c002b | X0b230d040c002b | X0b090e0304002b | | |
| X0b140d020f0019 | X0b130d0704002b | X0b010d060c002b | X0b230d050c002b | X0b090e0704002b | | |
| X0b190d060f0019 | X0b140d0704002b | X0b020d040c002b | X0b240d020c002b | X0b0a0e0704002b | | |
| X0b190d070f0019 | X0b150d0104002b | X0b020d060c002b | X0b240d060c002b | X0b0b0e0104002b | | |
| X03110d0c110011 | X0b150d0504002b | X0b030d040c002b | X0b250d040c002b | X0b0c0e0304002b | | |
| X0b050d07110011 | X0b150d0704002b | X0b030d060c002b | X0b250d050c002b | X0b0c0e0704002b | | |
| X03200d08022022 | X0b160d0104002b | X0b040d040c002b | X0b250d070c002b | X0b0d0e0304002b | | |
| X0b220d01022022 | X0b160d0504002b | X0b040d060c002b | X0b260d040c002b | X0b0d0e0704002b | | |
| X03230d08182223 | X0b170d0104002b | X0b050d040c002b | X0b260d060c002b | X0b0e0e0304002b | | |
| X0b230d01182223 | X0b170d0204002b | X0b050d060c002b | X0b270d060c002b | X0b0e0e0704002b | | |
| V02240c00 | X0b170d0504002b | X0b060d040c002b | X0b280d060c002b | X0b0f0e0304002b | | |
| X03240d0a102324 | X0b170d0704002b | X0b060d060c002b | X0b290d040c002b | X0b0f0e0704002b | | |
| X0b230d00102324 | X0b180d0104002b | X0b070d040c002b | X0b290d060c002b | X0b100e0104002b | | |
| X0b240d04102324 | X0b180d0504002b | X0b070d050c002b | X0b2a0d040c002b | X0b110e0104002b | | |
| X03250d08092425 | X0b180d0704002b | X0b080d040c002b | X0b2a0d060c002b | X0b120e0104002b | | |
| X0b250d01092425 | X0b190d0204002b | X0b080d050c002b | X0b2b0d0b0c002b | X0b130e0504002b | | |
| X03240d0c151c25 | X0b190d0504002b | X0b090d040c002b | X0b2b0d0c0c002b | X0b130e0704002b | | |
| X0b1e0d07151c25 | X0b1a0d0304002b | X0b090d050c002b | X031a0d090f1a2b | X0b140e0704002b | | |
| X03260d0c092627 | X0b1a0d0504002b | X0b0a0d040c002b | X03240d080f1a2b | X0b150e0704002b | | |
| X0b260d07092627 | X0b1b0d0104002b | X0b0a0d050c002b | X03110d0a17002b | X0b160e0104002b | | |
| X032b0d0401222b | X0b1b0d0204002b | X0b0b0d060c002b | X03260d0817002b | X0b170e0104002b | | |
| X0b220d0601222b | X0b1b0d0504002b | X0b0d0d040c002b | X0b0c0d0617002b | X0b180e0104002b | | |
| X0b0c0d0603002b | X0b1b0d0704002b | X0b0d0d070c002b | X0b0f0d0617002b | X0b190e0304002b | | |
| X0b0d0d0603002b | X0b1c0d0104002b | X0b0c0d030c002b | V020f0d01 | X0b190e0704002b | | |
| X0b000d0204002b | X0b1c0d0504002b | X0b0e0d040c002b | V020c0d01 | X0b1a0e0304002b | | |
| X0b000d0304002b | X0b1c0d0704002b | X0b0e0d050c002b | X030e0c09010c10 | X0b1a0e0704002b | | |
| X0b010d0104002b | X0b1d0d0104002b | X0b100d040c002b | X0b0c0c05010c10 | X0b1b0e0104002b | | |
| X0b010d0504002b | X0b1d0d0504002b | X0b100d060c002b | X0b0f0c05010c10 | X0b1c0e0104002b | | |
| X0b010d0704002b | X0b1e0d0504002b | X0b110d060c002b | X03130c0c011113 | X0b1d0e0104002b | | |
| X0b020d0104002b | X0b1f0d0104002b | X0b120d040c002b | X0b130c01011113 | X0b1e0e0304002b | | |
| X0b020d0504002b | X0b1f0d0204002b | X0b120d060c002b | V020d0d01 | X0b1e0e0704002b | | |
| X0b020d0704002b | X0b1f0d0504002b | X0b120d070c002b | V02140d01 | X0b1f0e0104002b | | |
| X0b030d0104002b | X0b1f0d0704002b | X0b130d030c002b | X03140c09001214 | X0b200e0104002b | | |
| X0b030d0204002b | X0b200d0104002b | X0b130d040c002b | X0b140e05001214 | X0b210e0104002b | | |
| X0b030d0504002b | X0b200d0504002b | X0b140d030c002b | V020c0d01 | X0b220e0304002b | | |
| X0b030d0704002b | X0b200d0704002b | X0b140d040c002b | X030c0c09000c0c | X0b230e0104002b | | |
| X0b040d0104002b | X0b210d0104002b | X0b150d040c002b | X0b0c0c05000c0c | X0b230e0304002b | | |
| X0b040d0504002b | X0b210d0504002b | X0b150d060c002b | X0b0d0c05000c0c | X0b240e0104002b | | |
| X0b040d0704002b | X0b220d0304002b | X0b160d040c002b | V020a0d01 | X0b250e0104002b | | |
| X0b050d0104002b | X0b220d0504002b | X0b160d060c002b | X030a0c090d090b | X0b250e0304002b | | |
| X0b050d0504002b | X0b230d0204002b | X0b160d070c002b | X0b090c010d090b | X0b260e0104002b | | |
| X0b060d0104002b | X0b230d0304002b | X0b170d040c002b | X0b0a0c030d090b | X0b270e0104002b | | |
| X0b060d0504002b | X0b230d0604002b | X0b170d060c002b | V02080d01 | X0b280e0104002b | | |
| X0b070d0204002b | X0b230d0704002b | X0b180d040c002b | V02190d01 | X0b290e0104002b | | |
| X0b070d0704002b | X0b240d0104002b | X0b180d060c002b | V021a0d01 | X0b2a0e0104002b | | |
| X0b080d0704002b | X0b240d0504002b | X0b190d030c002b | X03080c09060709 | X0b2b0e0a04002b | | |
| X0b0b0d0004002b | X0b240d0704002b | X0b190d040c002b | X0b070c01060709 | X0b000e00c002b | | |
| X0b0b0d0104002b | X0b250d0304002b | X0b1a0d040c002b | X0b080c03060709 | X0b070e050c002b | | |
| X0b0b0d0504002b | X0b250d0604002b | X0b1a0d070c002b | V021e0d01 | X0b080e050c002b | | |
| X0b0c0d0404002b | X0b260d0104002b | X0b1b0d040c002b | V02220d01 | X0b090e050c002b | | |
| X0b0c0d0704002b | X0b260d0504002b | X0b1b0d060c002b | X03220c08002123 | X0b0a0e050c002b | | |
| X0b0d0d0304002b | X0b270d0004002b | X0b1c0d040c002b | X0b220c05002123 | X0b130e030c002b | | |
| X0b0f0d0004002b | X0b270d0104002b | X0b1c0d060c002b | X03220c0c0b2224 | X0b140e030c002b | | |
| X0b0f0d0204002b | X0b270d0504002b | X0b1d0d040c002b | X0b220c070b2224 | X0b190e050c002b | | |
| X0b0f0d0304002b | X0b280d0004002b | X0b1d0d060c002b | X03220c09071c25 | X0b1a0e050c002b | | |
| X0b0f0d0404002b | X0b280d0104002b | X0b1d0d070c002b | X0b230c07071c25 | X0b1c0e050c002b | | |

```
; HEADER
; FILEID DEFDES /designs/em2kact/em2kact.def fb2c06f5
; CHECKSUM fb2c06f5
; PROGRAM Action Logic System
; VERSION 1.22
; VAR DEFSYS /actel/system.def
; VAR DEFUSR /actuser/ron/ron.def
; VAR DEFDES /designs/em2kact/em2kact.def
; ENDHEADER
data PACKAGE pkg1020
data DIE die1020
data PLACECLOCKBALANCESTRENGTH 6
data ta-temp-derate ind
data timer-layout post
data timer-condition ind
data ta-volt-derate V450
```

| | | | | | | |
|---|---|---|---|---|---|---|
| X0b27020104002b | X0b1c02040c002b | X0316010c081516 | X0b220103102122 | X0b13010704002b | X0b0801050c002b | X030b000b0a0810 |
| X0b27020304002b | X0b1c02050c002b | X0b150102081516 | X0322010b182223 | X0b14010404002b | X0b0901060c002b | X0b0900020a0810 |
| X0b27020404002b | X0b1c02060c002b | X03150109111416 | X0b230106182223 | X0b14010604002b | X0b0a01060c002b | X0b0a00020a0810 |
| X0b27020704002b | X0b1d02060c002b | X0b150104111416 | V02260101 | X0b14010704002b | X0b0b01050c002b | X0b0b00020a0810 |
| X0b28020404002b | X0b1e02040c002b | X030c010a080a14 | X03250109112526 | X0b15010604002b | X0b0c01050c002b | X0b0c00020a0810 |
| X0b28020504002b | X0b1f02040c002b | X0b0b0102080a14 | X0b250101112526 | X0b15010704002b | X0b0d01020c002b | X0318000a00181a |
| X0b28020704002b | X0b1f02050c002b | X0b0c0100080a14 | X0b260103112526 | X0b16010104002b | X0b0f01050c002b | X0b18000000181a |
| X0b29020404002b | X0b2002040c002b | X0b0d0107080a14 | V02280101 | X0b16010404002b | X0b1001050c002b | X0b19000200181a |
| X0b29020504002b | X0b2002050c002b | X0b0e0100080a14 | X03270109152628 | X0b16010504002b | X0b1001060c002b | X031a000c0b191b |
| X0b29020704002b | X0b2002060c002b | X0b0e0106080a14 | X0b270101152628 | X0b16010704002b | X0b1101020c002b | X0b1a00020b191b |
| X0b2a020404002b | X0b2202040c002b | X030b010b0b0a0c | X0b280103152628 | X0b17010404002b | X0b1201050c002b | V021c0000 |
| X0b2a020504002b | X0b2302040c002b | X0b0a01020b0a0c | X0b1d010603002b | X0b18010704002b | X0b1301050c002b | X031b000a011a1c |
| X0b2a020704002b | X0b2302050c002b | X0b0c01020b0a0c | X0b1e010603002b | X0b19010104002b | X0b1301060c002b | X0b1b0000011a1c |
| X0b2b020a04002b | X0b2302070c002b | X0316010a071617 | X0b21010603002b | X0b19010304002b | X0b1401050c002b | X0b1c0002011a1c |
| X0328020a08212b | X0b2402040c002b | X0b160102071617 | X0b22010603002b | X0b19010404002b | X0b1501010c002b | X030f000a0d0c1f |
| X0b25020608212b | X0b2402050c002b | X03150106091517 | X0b25010603002b | X0b19010504002b | X0b1501050c002b | X0b1300060d0c1f |
| X0b26020608212b | X0b2b020609c002b | X0b170107091517 | X0b26010603002b | X0b19010604002b | X0b1601060c002b | X0b1400060d0c1f |
| X0b27020608212b | X0b2b020b0c002b | X0317010b081718 | X0b27010603002b | X0b19010704002b | X0b1701020c002b | X0b1500060d0c1f |
| X0b28020608212b | X0b2b020c0c002b | X0b170100081718 | X0b28010603002b | X0b1a010204002b | X0b1701050c002b | X0b1600060d0c1f |
| X032b02040a002b | X032802090d1c2b | X030a010a0e0810 | X0b00010204002b | X0b1a010304002b | X0b1801050c002b | X0b1800060d0c1f |
| X0b0202010a002b | X031d02080d1c2b | X0b0901020c0810 | X0b01010004002b | X0b1a010604002b | X0b1801060c002b | X0b1900060d0c1f |
| X0b0202060a002b | X0b2102000d1c2b | X0b0a01000c0810 | X0b01010104002b | X0b1a010604002b | X0b1a01010c002b | X0b1b00060d0c1f |
| X0b0002000c002b | X0b2402060d1c2b | X0a0c01010c0810 | X0b01010504002b | X0b1b010604002b | X0b1a01040c002b | X0b1c00060d0c1f |
| X0b0002010c002b | X0b2802030d1c2b | X0b0c01020c0810 | X0b02010004002b | X0b1c010404002b | X0b1a01050c002b | X0b01000404002b |
| X0b0002030c002b | X032602090fla2b | X03190109071819 | X0b02010304002b | X0b1c010704002b | X0b1b01050c002b | X0b01000404002b |
| X0b0102060c002b | X031c02080fla2b | X0b180102071819 | X0b02010604002b | X0b1d010004002b | X0b1c01050c002b | X0b02000404002b |
| X0b0302050c002b | X0b2102060fla2b | X0319010a08191a | X0b03010004002b | X0b1d010504002b | X0b1c01060c002b | X0b02000404002b |
| X0b0302060c002b | X0b2302060fla2b | X0b19010208191a | X0b04010004002b | X0b1e010004002b | X0b1f01050c002b | X0b03000404002b |
| X0b0402050c002b | X0b2602030fla2b | X0b1a010708191a | X0b04010604002b | X0b1e010504002b | X0b1f01060c002b | X0b03000404002b |
| X0b0402060c002b | X0329020c15292b | X031a010a09181a | X0b05010004002b | X0b1f010004002b | X0b2001050c002b | X0b04000404002b |
| X0b0502040c002b | X0b29020015292b | X0b18010409181a | X0b05010104002b | X0b20010004002b | X0b2001060c002b | X0b04000404002b |
| X0b0602040c002b | X0b2a020215292b | X0317010a0c111a | X0b05010504002b | X0b21010004002b | X0b2301050c002b | X0b05000404002b |
| X0b0702040c002b | X0320020817002b | X0b13010020c111a | X0b06010004002b | X0b21010504002b | X0b2401050c002b | X0b05000404002b |
| X0b0702050c002b | X0a02020017002b | X030a010912060f | X0b06010104002b | X0b22010004002b | X0b2901040c002b | X0b06000404002b |
| X0b0802020c002b | X0b0202071700b | X0b09010412060f | X0b06010504002b | X0b22010504002b | X0b2b010b0c002b | X0b06000404002b |
| X0b0802050c002b | X0328020b18242b | X0311010a01101b | X0b07010004002b | X0b23010004002b | X0b2b010c0c002b | X0b07000404002b |
| X0b0b02040c002b | X0b25020218242b | X0b13010001101b | X0b08010004002b | X0b24010004002b | X031c010c0d1c2b | X0b07000404002b |
| X0b0b02050c002b | X0b26020018242b | X0b15010001101b | X0b08010604002b | X0b24010604002b | X0b1d01030d1c2b | X0b08000404002b |
| X0b0c02040c002b | X0b27020218242b | X0b18010409101b | X0b09010104002b | X0b25010004002b | X0a1e01010d1c2b | X0b08000404002b |
| X0b0c02050c002b | X0b28020218242b | X0b1b010001101b | X0b09010504002b | X0b25010504002b | X0b2101030d1c2b | X0b09000404002b |
| X0b0d02040c002b | X0b29020218242b | X031a01090071a1b | X0b09010704002b | X0b26010004002b | X0a2201010d1c2b | X0b0a000404002b |
| X0b0e02040c002b | X0b2a020018242b | X0b1b010407la1b | X0b0a01010404002b | X0b26010504002b | X0b2501030d1c2b | X0b0b000404002b |
| X0b0f02020c002b | X0311010c051011 | X031b010c081b1c | X0b0a01040404002b | X0b27010004002b | X0a2601010d1c2b | X0b0c000404002b |
| X0b0f02050c002b | X0b110100051011 | X0b1b0102081b1c | X0b0a01050404002b | X0b27010504002b | X0b2701030d1c2b | X0b0d000404002b |
| X0b1002050c002b | V02120101 | X031a010c181a1c | X0b0a010704002b | X0b28010004002b | X0a2801010d1c2b | X0b0d000204002b |
| X0b1102050c002b | X030f010b060f10 | X0b1a010018la1c | X0b0b010004002b | X0b28010204002b | X0329010a15292b | X0b0d000404002b |
| X0b1202030c002b | X0b0f0107060f10 | X031c010a071c1d | X0b0b010704002b | X0b28010404002b | X0b2b010a15292b | X0b0d000404002b |
| X0b1202050c002b | X03110109131112 | X0b1c0102071c1d | X0b0c010404002b | X0b28010504002b | V02140000 | X0b0c000404002b |
| X0b1202060c002b | X0b120103131112 | V021c0101 | X0b0c010604002b | X0b29010004002b | X0313000a001214 | X0b0c000204002b |
| X0b1302000c002b | V020c0101 | X031d0109081d1e | X0b0c010704002b | X0b29010204002b | X0b13000001214 | X0b0c000404002b |
| X0b1302040c002b | X0313010b061113 | X0b1d0101081d1e | X0b0d010304002b | X0b29010504002b | X0b14000201214 | X0b0c000404002b |
| X0b1302050c002b | X0b110107061113 | X0b1d0103081d1e | X0b0d010604002b | X0b29010604002b | V02160000 | X0b0f000204002b |
| X0b1402050c002b | X0313010c111213 | V02020101 | X0b0e010304002b | X0b2a010004002b | X030b000a0b0a0c | X0b0f000204002b |
| X0b1502040c002b | X0b130104111213 | X0308010c05000b | X0b0e010404002b | X0b2a010504002b | X0b0b00000b0a0c | X0b0f000604002b |
| X0b1502050c002b | V020d0101 | X0b0901000500b | X0b0c010704002b | X0b2a010604002b | X0b0c00000b0a0c | X0b10000404002b |
| X0b1602040c002b | X030a010a060d0c | X0b0b010005000b | X0b0f010004002b | X0b2b010904002b | X0315000a001517 | X0b10000404002b |
| X0b1702020c002b | X0b0d0106060d0c | X03030109080003 | X0b0f010204002b | X0329010909282b | X0b150000001517 | X0b11000004002b |

| | | | | | | |
|---|---|---|---|---|---|---|
| X0b1702050c002b | X030f010c0b0d0f | X0b020105080003 | X0b0f010404002b | X0b28010709282b | X0b160002001517 | X0b11000204002b |
| X0b1702070c002b | X0b0d010000b0d0f | X0301010b0c0003 | X0b0f010604002b | X0b29010709282b | X0309000a0d090b | X0b11000604002b |
| X0b1802050c002b | X0b0d010500b0d0f | X0b0001000c0003 | X0b10010404002b | X0b0001030c002b | X0b0900000d090b | X0b12000404002b |
| X0b1902030c002b | X0b0c010500b0d0f | X0b0001010c0003 | X0b11010104002b | X0b0101060c002b | X0b0a00000d090b | X0b12000404002b |
| X0b1a02010c002b | X0314010a131314 | X0b0301050c0003 | X0b11010304002b | X0b0301060c002b | V02190000 | X0b13000404002b |
| X0b1a02030c002b | X0b140102131314 | X031a010b111721 | X0b11010404002b | X0b0401050c002b | X0309000c01080d | X0b14000404002b |
| X0b1a02040c002b | X0315010c0d1415 | X0b170106111721 | X0b11010504002b | X0b0501060c002b | X0b0900000601080d | X0b15000404002b |
| X0b1a02060c002b | X0b1501030d1415 | V02220101 | X0b11010604002b | X0b0601060c002b | X0b0a000601080d | X0b16000404002b |
| X0b1b02040c002b | X030d010a000b0d | X03210109102122 | X0b12010404002b | X0b0701050c002b | X0b0b000601080d | X0b17000004002b |
| X0b1b02050c002b | X0b0b0104000b0d | X0b210101102122 | X0b12010604002b | X0b0701060c002b | X0b0c000601080d | X0b17000204002b |
| X0b17000404002b | X0b2100060c002b | X031a0c06071a1b | X0h1f0c04151c25 | X0b150c0604002b | X0b00c050c002b | X030f0d0c050c0f |
| X0b17000604002b | X0b2200060c002b | X0b1a0c05071a1b | X0b200c00151c25 | X0b160c0104002b | X0b00c060c002b | X0b0c0d01050c0f |
| X0b18000404002b | X0b2300060c002b | X0b1b0c05071a1b | X09210c01151c25 | X0b160c0304002b | X0b0c0c050c002b | X0b0f0d01050c0f |
| X0b19000404002b | X0b2400060c002b | V021c0b01 | X0b230c04151c25 | X0b170c0704002b | X0b0d0c030c002b | V02140c00 |
| X0b1a00060c002b | X0b2500060c002b | X031b0c0a081b1c | X0b240c00151c25 | X0b180c0704002b | X0b0d0c040c002b | X030d0d09060d0c |
| X0b1b00060c002b | X0b2600060c002b | X0b1b0c02081b1c | V0226b01 | X0b190c0104002b | X0b0c0c040c002b | X0b0d0c050c0d0c |
| X0b1c00040c002b | X0b2700060c002b | X0b1c0c02081b1c | X03250c0c112526 | X0b190c0204002b | X0b0c0c060c002b | X03130c09131314 |
| X0b1d00040c002b | X0b2800040c002b | V021d0b01 | X0b250c06112526 | X0b190c0304002b | X0b0f0c020c002b | X0b130d01131314 |
| X0b1d00040c002b | X0b2a00060c002b | X030f0c0a000c1d | X03260c0b01222b | X0b190c0404002b | X0b0f0c050c002b | X0b140d05131314 |
| X0b1e000004002b | X0b2b00090c002b | X0b130c00000c1d | X0b230c0701222b | X0b190c0504002b | X0b0f0c060c002b | V020c0c00 |
| X0b1e000404002b | X0b2b0000b0c002b | X0b140c00000c1d | X0b240c0701222b | X0b1a0c0304002b | X0b100c050c002b | X030d0d0b050c0d |
| X0b1f000004002b | X03100c08051011 | X0b170c0700c1d | X0b250c0101222b | X0b1a0c0304002b | X0b110c010c002b | X0b0c0d02050c0d |
| X0b1f000404002b | X0b100c01051011 | X0b170c01000c1d | X0b260c0501222b | X0b1b0c0304002b | X0b110c030c002b | X030c0d0a060b0c |
| X0b20000004002b | V02120b01 | X0b180c00000c1d | X0b000c0004002b | X0b1b0c0704002b | X0b120c040c002b | X0b0c0d03060b0c |
| X0b20000404002b | X03100c0a060f10 | X0a180c01000c1d | X0b000c0204002b | X0b1c0c0504002b | X0b130c040c002b | X0b0c0d05060b0c |
| X0b21000404002b | X0b100c07060f10 | X0b1b0c00000c1d | X0b000c0304002b | X0b1d0c0504002b | X0b140c040c002b | X030c0d0b180c16 |
| X0b21000404002b | X03120c0c0b1012 | X0b1c0c00000c1d | X0b010c0104002b | X0b140c0504002b | X0b140c050c002b | X0b0c0d01180c16 |
| X0b22000404002b | X0b100c060b1012 | X031c0c0b071c1d | X0b010c0604002b | X0b1e0c0504002b | X0b150c030c002b | X0b0b0d01180c16 |
| X0b22000404002b | V020c0b01 | X0a1d0c01071c1d | X0b020c0604002b | X0b1f0c0704002b | X0b150c040c002b | X0b130d05180c16 |
| X0b23000004002b | V020d0b01 | V021c0b01 | X0b020c0604002b | X0b1f0c0704002b | X0b160c040c002b | X0b140d01180c16 |
| X0b23000404002b | X030c0c0c060d0c | X03030c0a120305 | X0b030c0104002b | X0b200c0304002b | X0b160c050c002b | X03140c0c080a14 |
| X0b24000004002b | X0b0c0c07060d0c | X0b030c02120305 | X0b040c0104002b | X0b200c0704002b | X0b170c040c002b | X0b0a0d07080a14 |
| X0b24000404002b | X03140c09091214 | X0b040c02120305 | X0b040c0304002b | X0b210c0704002b | X0b170c050c002b | V02180c00 |
| X0b25000004002b | X0b120c06091214 | X031c0c0b081d1e | X0b040c0504002b | X0b220c0504002b | X0b180c040c002b | X03090d0910090a |
| X0b25000404002b | X0b130c0a131314 | X0b1d0c07081d1e | X0b050c0604002b | X0b220c0704002b | X0b180c050c002b | X0b090d0310090a |
| X0b26000004002b | X0b130c02131314 | V021f0b01 | X0b050c0304002b | X0b230c0104002b | X0b1a0c040c002b | X0b0a0d0310090a |
| X0b26000404002b | X0b140c02131314 | X031e0c0c071e1f | X0b050c0504002b | X0b230c0304002b | X0b1b0c040c002b | V02190c00 |
| X0b27000004002b | X030e0c0c050c0d | X0a1e0c01071e1f | X0b060c0104002b | X0b230c0504002b | X0b1c0c030c002b | X03100d0c0c0810 |
| X0b27000404002b | X0b0c0c06050c0d | X031c0c0a13151f | X0b070c0104002b | X0b240c0504002b | X0b1c0c040c002b | X0b090d070c0810 |
| X0b28000004002b | X03140c0a0d1415 | X0b150c0713151f | X0b070c0304002b | X0b250c0304002b | X0b1d0c030c002b | X03180d0a181719 |
| X0b28000204002b | X0b150c010d1415 | X0b170c0613151f | X0b070c0504002b | X0b250c0704002b | X0b1d0c040c002b | X0b170d00181719 |
| X0b28000604002b | X030d0c09000b0d | X0b180c0613151f | X0b080c0104002b | X0b260c0704002b | X0b1e0c030c002b | X0b180d02181719 |
| X0b29000004002b | X0b0b0c07000b0d | X0b190c0613151f | X0b080c0304002b | X0b270c0104002b | X0b1e0c040c002b | X0b190d01181719 |
| X0b29000204002b | X0b0c0c02000b0d | X031f0c0a081f20 | X0b080c0504002b | X0b270c0304002b | X0b1e0c060c002b | X03070d09100708 |
| X0b29000404002b | X0b0d0c07000b0d | X0b1f0c00081f20 | X0b090c0304002b | X0b270c0404002b | X0b1f0c020c002b | X0b070d03100708 |
| X0b29000604002b | X030c0c0c060b0c | X0b200c04081f20 | X0b090c0704002b | X0b280c0004002b | X0b1f0c030c002b | X0b080d03100708 |
| X0b2a000404002b | X0b0c0c0006060c | X030f0c0901000f | X0b0a0c0104002b | X0b280c0104002b | X0b200c020c002b | X03190d0a08191a |
| X0b2a000404002b | X03160c0c180c16 | X0b030c0001000f | X0b0a0c0304002b | X0b280c0404002b | X0b200c050c002b | X0b1a0d0108191a |
| X0318000b06122b | X0b060c06180c16 | X0b040c0001000f | X0b0c0c0004002b | X0b290c0104002b | X0b210c030c002b | X03190d0909181a |
| X0b13000206122b | X030b0c08080a14 | X0b070c0001000f | X0b070c0004002b | X0b290c0604002b | X0b210c040c002b | X0b1a0d0609181a |
| X0a14000006122b | X0b0c0c07080a14 | X0b080c0001000f | X0b080c0004002b | X0b2a0c0104002b | X0b220c040c002b | X031a0d080c111a |
| X0b15000206122b | X0b0f0c07080a14 | X0b0f0c0001000f | X0b0c0c0104002b | X0b2a0c0604002b | X0b230c020c002b | X0b130d060c111a |
| X0a16000006122b | X0b130c07080a14 | X030a0c0906000a | X0b0c0c0304002b | X0b2b0c0904002b | X0b240c020c002b | X0b140d060c111a |
| X0b18000206122b | V02090b01 | X0b050c0706000a | X0b0c0c0304002b | X03200c0c07202b | X0b250c040c002b | X03080d0a020608 |
| X0a19000006122b | V02180b01 | X0b070c0606000a | X0b0c0c0404002b | X0b220c0307202b | X0b250c050c002b | X0b070d00020608 |
| X0b1b000206122b | X03170c0a081718 | X0b070c0706000a | X0b0c0c0504002b | X0b230c0607202b | X0b260c030c002b | X0b070d06020608 |
| X0a1c000006122b | X0b170c02081718 | X0b080c0606000a | X0b0c0c0504002b | X0b240c0107202b | X0b260c040c002b | X0b080d02020608 |
| X0b0000010c002b | X0b180c02081718 | X0b0a0c0706000a | X0b0f0c0104002b | X0b240c0607202b | X0b260c060c002b | X0b080d06020608 |
| X0b0000030c002b | X03180c0c0d1618 | X03080c090b0009 | X0b0f0c0304002b | X03250c0908212b | X0b270c060c002b | X030f0d0912060f |
| X0b0100060c002b | X0b160c060d1618 | X0b030c060b0009 | X0b0f0c0404002b | X0b220c0608212b | X0b280c060c002b | X0b070d0112060f |
| X0b0200060c002b | X03170c0b181719 | X0b040c060b0009 | X0b100c0004002b | X0b000c010c002b | X0b290c040c002b | X09080d0012060f |
| X0b0300060c002b | X0b170c03181719 | X0b040c070b0009 | X0b100c0204002b | X0b010c040c002b | X0b2a0c040c002b | X0b080d0112060f |
| X0b0400060c002b | X0b180c03181719 | X0b080c070b0009 | X0b100c0404002b | X0b020c040c002b | X0b2b0c0b0c002b | X0b090d0112060f |
| X0b0500060c002b | V021a0b01 | X03050c0b110011 | X0b110c0404002b | X0b030c040c002b | X0b2b0c0c0c002b | X0b0a0d0112060f |
| X0b0600060c002b | X03070c0a100708 | X0b0c0c03110011 | X0b110c0404002b | X0b040c040c002b | X03270c0c0d1c2b | X0b0f0d0512060f |
| X0b0700060c002b | X0b070c02100708 | X03180c0b111721 | X0b110c0504002b | X0b050c040c002b | X0b1c0c070d1c2b | V021c0c00 |
| X0b0800060c002b | X0b080c02100708 | X0b190c00111721 | X0b110c0604002b | X0b050c060c002b | X03210c0b0c1c2b | X031c0d0a081b1c |
| X0b0f00040c002b | X03190c0c08191a | X0b1b0c06111721 | X0b110c0704002b | X0b060c040c002b | X0b1f0c060c1c2b | X0b1b0d0008181c |
| X0b1000060c002b | X0b1a0c0608191a | X0b1c0c06111721 | X0b120c0504002b | X0b060c060c002b | X0b200c010c1c2b | X0b1c0d02081b1c |
| X0b1100040c002b | X03120c0a0c111a | X03230c09002123 | X0b120c0704002b | X0b070c040c002b | X0b200c060c1c2b | V02040c00 |
| X0b1200060c002b | X0b120c030c111a | X0b210c06002123 | X0b130c0104002b | X0b080c040c002b | X0b210c050c1c2b | X03170d0c000c1d |
| X0b1a00000c002b | X0b190c070c111a | X03230c0c091b23 | X0b130c0304002b | X0b090c040c002b | X0b220c010c1c2b | X0b0b0d07000c1d |
| X0b1a00040c002b | V021b0b01 | X0b1d0c06091b23 | X0b130c0504002b | X0b090c050c002b | X0b240c030c1c2b | X03040d0a120305 |
| X0b1d00060c002b | X03180c0a01101b | X03230c0a102324 | X0b140c0104002b | X0b090c060c002b | X03280c0c10282b | X0b030d00120305 |
| X0b1e00060c002b | X0b130c0601101b | X0b230c00102324 | X0b140c0304002b | X0b0a0c040c002b | X0b2b0c0a10282b | X0b030d02120305 |
| X0b1f00060c002b | X0b140c0601101b | X0b240c04102324 | X0b140c0704002b | X0b0a0c050c002b | X03100d0b051011 | X031c0c0d0b01c1e |
| X0b2000060c002b | X0b160c0701101b | X031f0c0c151c25 | X0b150c0504002b | X0b00c060c002b | X0b100d07051011 | X0b1e0d01011c1e |

```
; HEADER
; FILEID PIN /designs/EM2KACT/3M2KACT.pin e3ee24d0
; CHECKSUM e3ee24d0
; PROGRAM Action Logic System
; VERSION 1.22
; DEPEND DDFDIE /actel/die1020.ddf 9fe38a0b
; DEPEND DDFPACKAGE /actel/pkg1020.ddf bb892886
; VAR DDFDIE /actel/die1020.ddf
; VAR DDFPACKAGE /actel/pkg1020.ddf
; ENDHEADER
DEF em2kact.
NET NONRST; ; PIN:54.
NET NBCLKIN; ; PIN:64.
```

PINOUTS CORRESPOND TO
FIGURES INDICATED
RS 232 XMIT LINE

```
NET TX; ; PIN:2.
NET P_DVALID; ; PIN:42.
NET P_COMERR; ; PIN:41.
NET NBCLKOUT; ; PIN:59.
NET XIN; ; PIN:53.
NET XOUT; ; PIN:55.
NET P_PM0; ; PIN:70.
NET P_NM0; ; PIN:71.
NET P_PM1; ; PIN:62.
NET P_NM1; ; PIN:63.
NET P_PM2; ; PIN:57.
NET P_NM2; ; PIN:58.
NET P_PM3; ; PIN:76.
NET P_NM3; ; PIN:77.
NET P_PM4; ; PIN:78.
```

SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b

```
NET RCV; ; PIN:3.
NET P_NM4; ; PIN:79.
NET P_PM5; ; PIN:80.
NET P_NM5; ; PIN:81.
NET P_PW0; ; PIN:44.
```

CONNECT TO FIG. 9i, SIGNAL i-a
SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b

```
NET P_CS0; ; PIN:27.
```

CONTACT STATUS INPUTS
CONNECT TO "NEW #" OF FIG. 9a.

```
NET P_PS0; ; PIN:45.
NET P_PS1; ; PIN:48.
NET P_NS1; ; PIN:49.
```

SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b

```
NET P_CS1; ; PIN:28.
```

CONTACT STATUS INPUTS
CONNECT TO "NEW #" OF FIG. 9a.

```
NET P_PS2; ; PIN:50.
NET P_NS2; ; PIN:51.
NET P_PS3; ; PIN:10.
NET P_CS2; ; PIN:29.
```

SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b
CONTACT STATUS INPUTS
CONNECT TO "NEW #" OF FIG. 9a.

```
NET P_NS3; ; PIN:9.
NET P_PS4; ; PIN:8.
NET P_NS4; ; PIN:7.
NET P_CS3; ; PIN:30.
```

SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b
CONTACT STATUS INPUTS
CONNECT TO "NEW #" OF FIG. 9a.

```
NET P_PS5; ; PIN:6.
NET P_NS5; ; PIN:5.

NET P_CS4; ; PIN:31.
```

SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b
CONTACT STATUS INPUTS
CONNECT TO "NEW #" OF FIG. 9a.

```
NET P_PS6; ; PIN:84.
NET P_NS6; ; PIN:83.

NET P_MST0; ; PIN:16.
NET P_MST1; ; PIN:17.
NET P_MST2; ; PIN:20.
NET P_CS5; ; PIN:32.
```

SAME A PS[], NS[], PM[], NME[] IN DIAGRAMS
9i, 9j, 9k CONNECT TO $CD_b$, $CD_a$, $RD_b$, AND $RD_a$
RESPECTIVELY ON FIG. 9b
MOTOR READ STATUS INPUTS
CONNECT TO MSTAT ON FIG. 9b

CONTACT STATUS INPUTS
CONNECT TO "NEW #" OF FIG. 9a.

```
NET P_MST3; ; PIN:21.
NET P_MST4; ; PIN:22.
NET P_MST5; ; PIN:23.
NET P_TDRV; ; PIN:35.
```

MOTOR READ STATUS INPUTS
CONNECT TO MSTAT ON FIG. 9b

OPTO TRIAC DRIVER LINE (FIG. 9i, i-b)
CONNECT TO "NEW #" ON FIG. 9a

Note: Erroneous COMM messages result in the gate array responding with two all 1's response bytes (ie., 11111111 and 11111111), the gate array resetting itself with no other action, and then the gate array waiting for the next valid byte 0.

The following tables are a complete list of EM2000 Gate Array Commands and responses between a controller and the device.

| Gate Array READ MOTOR Commands/Responses ||||||
|---|---|---|---|---|---|
| Command Messages || No Motor Present Response || Motor Present Response ||
| Command Byte 1 | Command Byte 0 | Response Byte 1 | Response Byte 0 | Response Byte 1 | Response Byte 0 |
| 00000001 | 00000000 | 00000001 | 00000000 | 11010001 | 00000000 |
| 00000001 | 10100010 | 00000001 | 10100010 | 11010001 | 10100010 |
| 00000001 | 11100100 | 00000001 | 11100100 | 11010001 | 11100100 |
| 00000001 | 01000110 | 00000001 | 01000110 | 11010001 | 01000110 |
| 00000001 | 01101000 | 00000001 | 01101000 | 11010001 | 01101000 |
| 00000001 | 11001010 | 00000001 | 11001010 | 11010001 | 11001010 |
| 00000001 | 10001100 | 00000001 | 10001100 | 11010001 | 10001100 |
| 00000001 | 00101110 | 00000001 | 00101110 | 11010001 | 00101110 |
| 00000001 | 11010000 | 00000001 | 11010000 | 11010001 | 11010000 |
| 00000001 | 01110010 | 00000001 | 01110010 | 11010001 | 01110010 |
| 00000001 | 00110100 | 00000001 | 00110100 | 11010001 | 00110100 |
| 00000001 | 10010110 | 00000001 | 10010110 | 11010001 | 10010110 |
| 00000001 | 10111000 | 00000001 | 10111000 | 11010001 | 10111000 |
| 00000001 | 00011010 | 00000001 | 00011010 | 11010001 | 00011010 |
| 00000001 | 01011100 | 00000001 | 01011100 | 11010001 | 01011100 |
| 00000001 | 11111110 | 00000001 | 11111110 | 11010001 | 11111110 |
| 10100011 | 00000000 | 10100011 | 00000000 | 01110011 | 00000000 |
| 10100011 | 10100010 | 10100011 | 10100010 | 01110011 | 10100010 |
| 10100011 | 11100100 | 10100011 | 11100100 | 01110011 | 11100100 |
| 10100011 | 01000110 | 10100011 | 01000110 | 01110011 | 01000110 |
| 10100011 | 01101000 | 10100011 | 01101000 | 01110011 | 01101000 |
| 10100011 | 11001010 | 10100011 | 11001010 | 01110011 | 11001010 |
| 10100011 | 10001100 | 10100011 | 10001100 | 01110011 | 10001100 |
| 10100011 | 00101110 | 10100011 | 00101110 | 01110011 | 00101110 |
| 10100011 | 11010000 | 10100011 | 11010000 | 01110011 | 11010000 |
| 10100011 | 01110010 | 10100011 | 01110010 | 01110011 | 01110010 |
| 10100011 | 00110100 | 10100011 | 00110100 | 01110011 | 00110100 |
| 10100011 | 10010110 | 10100011 | 10010110 | 01110011 | 10010110 |
| 10100011 | 10111000 | 10100011 | 10111000 | 01110011 | 10111000 |
| 10100011 | 00011010 | 10100011 | 00011010 | 01110011 | 00011010 |
| 10100011 | 01011100 | 10100011 | 01011100 | 01110011 | 01011100 |
| 10100011 | 11111110 | 10100011 | 11111110 | 01110011 | 11111110 |
| 11100101 | 00000000 | 11100101 | 00000000 | 00110101 | 00000000 |
| 11100101 | 10100010 | 11100101 | 10100010 | 00110101 | 10100010 |
| 11100101 | 11100100 | 11100101 | 11100100 | 00110101 | 11100100 |
| 11100101 | 01000110 | 11100101 | 01000110 | 00110101 | 01000110 |
| 11100101 | 01101000 | 11100101 | 01101000 | 00110101 | 01101000 |
| 11100101 | 11001010 | 11100101 | 11001010 | 00110101 | 11001010 |
| 11100101 | 10001100 | 11100101 | 10001100 | 00110101 | 10001100 |
| 11100101 | 00101110 | 11100101 | 00101110 | 00110101 | 00101110 |
| 11100101 | 11010000 | 11100101 | 11010000 | 00110101 | 11010000 |
| 11100101 | 01110010 | 11100101 | 01110010 | 00110101 | 01110010 |

Note: Erroneous COMM messages result in the gate array responding with two all 1 response bytes (ie., 11111111 and 11111111), the gate array resetting itself with no other action, and then the gate array waiting for the next valid byte 0.

| Gate Array READ CONTACT Commands/Responses ||||||
|---|---|---|---|---|---|
| Command Messages || Circuit Breaker Open Response || Circuit Breaker Closed Response ||
| Command Byte 1 | Command Byte 0 | Response Byte 1 | Response Byte 0 | Response Byte 1 | Response Byte 0 |
| 01101001 | 00000000 | 00000001 | 00000000 | 11010001 | 00000000 |
| 01101001 | 10100010 | 00000001 | 10100010 | 11010001 | 10100010 |
| 01101001 | 11100100 | 00000001 | 11100100 | 11010001 | 11100100 |
| 01101001 | 01000110 | 00000001 | 01000110 | 11010001 | 01000110 |
| 01101001 | 01101000 | 00000001 | 01101000 | 11010001 | 01101000 |
| 01101001 | 11001010 | 00000001 | 11001010 | 11010001 | 11001010 |
| 01101001 | 10001100 | 00000001 | 10001100 | 11010001 | 10001100 |
| 01101001 | 00101110 | 00000001 | 00101110 | 11010001 | 00101110 |
| 01101001 | 11010000 | 00000001 | 11010000 | 11010001 | 11010000 |
| 01101001 | 01110010 | 00000001 | 01110010 | 11010001 | 01110010 |
| 01101001 | 00110100 | 00000001 | 00110100 | 11010001 | 00110100 |
| 01101001 | 10010110 | 00000001 | 10010110 | 11010001 | 10010110 |
| 01101001 | 10111000 | 00000001 | 10111000 | 11010001 | 10111000 |
| 01101001 | 00011010 | 00000001 | 00011010 | 11010001 | 00011010 |
| 01101001 | 01011100 | 00000001 | 01011100 | 11010001 | 01011100 |
| 01101001 | 11111110 | 00000001 | 11111110 | 11010001 | 11111110 |
| 11001011 | 00000000 | 10100011 | 00000000 | 01110011 | 00000000 |
| 11001011 | 10100010 | 10100011 | 10100010 | 01110011 | 10100010 |
| 11001011 | 11100100 | 10100011 | 11100100 | 01110011 | 11100100 |
| 11001011 | 01000110 | 10100011 | 01000110 | 01110011 | 01000110 |
| 11001011 | 01101000 | 10100011 | 01101000 | 01110011 | 01101000 |
| 11001011 | 11001010 | 10100011 | 11001010 | 01110011 | 11001010 |
| 11001011 | 10001100 | 10100011 | 10001100 | 01110011 | 10001100 |
| 11001011 | 00101110 | 10100011 | 00101110 | 01110011 | 00101110 |
| 11001011 | 11010000 | 10100011 | 11010000 | 01110011 | 11010000 |
| 11001011 | 01110010 | 10100011 | 01110010 | 01110011 | 01110010 |
| 11001011 | 00110100 | 10100011 | 00110100 | 01110011 | 00110100 |
| 11001011 | 10010110 | 10100011 | 10010110 | 01110011 | 10010110 |
| 11001011 | 10111000 | 10100011 | 10111000 | 01110011 | 10111000 |
| 11001011 | 00011010 | 10100011 | 00011010 | 01110011 | 00011010 |
| 11001011 | 01011100 | 10100011 | 01011100 | 01110011 | 01011100 |
| 11001011 | 11111110 | 10100011 | 11111110 | 01110011 | 11111110 |
| 11100101 | 00000000 | 11100101 | 00000000 | 00110101 | 00000000 |
| 11100101 | 10100010 | 11100101 | 10100010 | 00110101 | 10100010 |
| 11100101 | 11100100 | 11100101 | 11100100 | 00110101 | 11100100 |
| 11100101 | 01000110 | 11100101 | 01000110 | 00110101 | 01000110 |
| 11100101 | 01101000 | 11100101 | 01101000 | 00110101 | 01101000 |
| 11100101 | 11001010 | 11100101 | 11001010 | 00110101 | 11001010 |
| 11100101 | 10001100 | 11100101 | 10001100 | 00110101 | 10001100 |
| 11100101 | 00101110 | 11100101 | 00101110 | 00110101 | 00101110 |
| 11100101 | 11010000 | 11100101 | 11010000 | 00110101 | 11010000 |
| 11100101 | 01110010 | 11100101 | 01110010 | 00110101 | 01110010 |

Note: Erroneous COMM messages result in the gate array responding with two all 1's response bytes (ie., 11111111 and 11111111), the gate array resetting itself with no other action, and then the gate array waiting for the next valid byte 0.

| Gate Array OPEN CONTACT Commands/Responses | | | | | |
|---|---|---|---|---|---|
| Command Messages | | Circuit Breaker Open Response | | Circuit Breaker Closed Response | |
| Command Byte 1 | Command Byte 0 | Response Byte 1 | Response Byte 0 | Response Byte 1 | Response Byte 0 |
| 11010001 | 00000000 | 00000001 | 00000000 | 11010001 | 00000000 |
| 11010001 | 10100010 | 00000001 | 10100010 | 11010001 | 10100010 |
| 11010001 | 11100100 | 00000001 | 11100100 | 11010001 | 11100100 |
| 11010001 | 01000110 | 00000001 | 01000110 | 11010001 | 01000110 |
| 11010001 | 01101000 | 00000001 | 01101000 | 11010001 | 01101000 |
| 11010001 | 11001010 | 00000001 | 11001010 | 11010001 | 11001010 |
| 11010001 | 10001100 | 00000001 | 10001100 | 11010001 | 10001100 |
| 11010001 | 00101110 | 00000001 | 00101110 | 11010001 | 00101110 |
| 11010001 | 11010000 | 00000001 | 11010000 | 11010001 | 11010000 |
| 11010001 | 01110010 | 00000001 | 01110010 | 11010001 | 01110010 |
| 11010001 | 00110100 | 00000001 | 00110100 | 11010001 | 00110100 |
| 11010001 | 10010110 | 00000001 | 10010110 | 11010001 | 10010110 |
| 11010001 | 10111000 | 00000001 | 10111000 | 11010001 | 10111000 |
| 11010001 | 00011010 | 00000001 | 00011010 | 11010001 | 00011010 |
| 11010001 | 01011100 | 00000001 | 01011100 | 11010001 | 01011100 |
| 11010001 | 11111110 | 00000001 | 11111110 | 11010001 | 11111110 |
| 01110011 | 00000000 | 10100011 | 00000000 | 01110011 | 00000000 |
| 01110011 | 10100010 | 10100011 | 10100010 | 01110011 | 10100010 |
| 01110011 | 11100100 | 10100011 | 11100100 | 01110011 | 11100100 |
| 01110011 | 01000110 | 10100011 | 01000110 | 01110011 | 01000110 |
| 01110011 | 01101000 | 10100011 | 01101000 | 01110011 | 01101000 |
| 01110011 | 11001010 | 10100011 | 11001010 | 01110011 | 11001010 |
| 01110011 | 10001100 | 10100011 | 10001100 | 01110011 | 10001100 |
| 01110011 | 00101110 | 10100011 | 00101110 | 01110011 | 00101110 |
| 01110011 | 11010000 | 10100011 | 11010000 | 01110011 | 11010000 |
| 01110011 | 01110010 | 10100011 | 01110010 | 01110011 | 01110010 |
| 01110011 | 00110100 | 10100011 | 00110100 | 01110011 | 00110100 |
| 01110011 | 10010110 | 10100011 | 10010110 | 01110011 | 10010110 |
| 01110011 | 10111000 | 10100011 | 10111000 | 01110011 | 10111000 |
| 01110011 | 00011010 | 10100011 | 00011010 | 01110011 | 00011010 |
| 01110011 | 01011100 | 10100011 | 01011100 | 01110011 | 01011100 |
| 01110011 | 11111110 | 10100011 | 11111110 | 01110011 | 11111110 |
| 00110101 | 00000000 | 11100101 | 00000000 | 00110101 | 00000000 |
| 00110101 | 10100010 | 11100101 | 10100010 | 00110101 | 10100010 |
| 00110101 | 11100100 | 11100101 | 11100100 | 00110101 | 11100100 |
| 00110101 | 01000110 | 11100101 | 01000110 | 00110101 | 01000110 |
| 00110101 | 01101000 | 11100101 | 01101000 | 00110101 | 01101000 |
| 00110101 | 11001010 | 11100101 | 11001010 | 00110101 | 11001010 |
| 00110101 | 10001100 | 11100101 | 10001100 | 00110101 | 10001100 |
| 00110101 | 00101110 | 11100101 | 00101110 | 00110101 | 00101110 |
| 00110101 | 11010000 | 11100101 | 11010000 | 00110101 | 11010000 |
| 00110101 | 01110010 | 11100101 | 01110010 | 00110101 | 01110010 |

Note: Erroneous COMM messages result in the gate array responding with two all 1's response bytes (ie., 11111111 and 11111111), the gate array resetting itself with no other action, and then the gate array waiting for the next valid byte 0.

| Gate Array CLOSE CONTACT Commands/Responses ||||||
|---|---|---|---|---|---|
| Command Messages || Circuit Breaker Open Response || Circuit Breaker Closed Response ||
| Command Byte 1 | Command Byte 0 | Response Byte 1 | Response Byte 0 | Response Byte 1 | Response Byte 0 |
| 10111001 | 00000000 | 00000001 | 00000000 | 11010001 | 00000000 |
| 10111001 | 10100010 | 00000001 | 10100010 | 11010001 | 10100010 |
| 10111001 | 11100100 | 00000001 | 11100100 | 11010001 | 11100100 |
| 10111001 | 01000110 | 00000001 | 01000110 | 11010001 | 01000110 |
| 10111001 | 01101000 | 00000001 | 01101000 | 11010001 | 01101000 |
| 10111001 | 11001010 | 00000001 | 11001010 | 11010001 | 11001010 |
| 10111001 | 10001100 | 00000001 | 10001100 | 11010001 | 10001100 |
| 10111001 | 00101110 | 00000001 | 00101110 | 11010001 | 00101110 |
| 10111001 | 11010000 | 00000001 | 11010000 | 11010001 | 11010000 |
| 10111001 | 01110010 | 00000001 | 01110010 | 11010001 | 01110010 |
| 10111001 | 00110100 | 00000001 | 00110100 | 11010001 | 00110100 |
| 10111001 | 10010110 | 00000001 | 10010110 | 11010001 | 10010110 |
| 10111001 | 10111000 | 00000001 | 10111000 | 11010001 | 10111000 |
| 10111001 | 00011010 | 00000001 | 00011010 | 11010001 | 00011010 |
| 10111001 | 01011100 | 00000001 | 01011100 | 11010001 | 01011100 |
| 10111001 | 11111110 | 00000001 | 11111110 | 11010001 | 11111110 |
| 00011011 | 00000000 | 10100011 | 00000000 | 01110011 | 00000000 |
| 00011011 | 10100010 | 10100011 | 10100010 | 01110011 | 10100010 |
| 00011011 | 11100100 | 10100011 | 11100100 | 01110011 | 11100100 |
| 00011011 | 01000110 | 10100011 | 01000110 | 01110011 | 01000110 |
| 00011011 | 01101000 | 10100011 | 01101000 | 01110011 | 01101000 |
| 00011011 | 11001010 | 10100011 | 11001010 | 01110011 | 11001010 |
| 00011011 | 10001100 | 10100011 | 10001100 | 01110011 | 10001100 |
| 00011011 | 00101110 | 10100011 | 00101110 | 01110011 | 00101110 |
| 00011011 | 11010000 | 10100011 | 11010000 | 01110011 | 11010000 |
| 00011011 | 01110010 | 10100011 | 01110010 | 01110011 | 01110010 |
| 00011011 | 00110100 | 10100011 | 00110100 | 01110011 | 00110100 |
| 00011011 | 10010110 | 10100011 | 10010110 | 01110011 | 10010110 |
| 00011011 | 10111000 | 10100011 | 10111000 | 01110011 | 10111000 |
| 00011011 | 00011010 | 10100011 | 00011010 | 01110011 | 00011010 |
| 00011011 | 01011100 | 10100011 | 01011100 | 01110011 | 01011100 |
| 00011011 | 11111110 | 10100011 | 11111110 | 01110011 | 11111110 |
| 01011101 | 00000000 | 11100101 | 00000000 | 00110101 | 00000000 |
| 01011101 | 10100010 | 11100101 | 10100010 | 00110101 | 10100010 |
| 01011101 | 11100100 | 11100101 | 11100100 | 00110101 | 11100100 |
| 01011101 | 01000110 | 11100101 | 01000110 | 00110101 | 01000110 |
| 01011101 | 01101000 | 11100101 | 01101000 | 00110101 | 01101000 |
| 01011101 | 11001010 | 11100101 | 11001010 | 00110101 | 11001010 |
| 01011101 | 10001100 | 11100101 | 10001100 | 00110101 | 10001100 |
| 01011101 | 00101110 | 11100101 | 00101110 | 00110101 | 00101110 |
| 01011101 | 11010000 | 11100101 | 11010000 | 00110101 | 11010000 |
| 01011101 | 01110010 | 11100101 | 01110010 | 00110101 | 01110010 |

What is claimed is:

1. A panelboard having an enclosure including a front side and a back wall, comprising:
   user interface means permitting a user to communicate with at least one of the electrical switching means, said user interface means including a first circuit section comprising an interface module and a second circuit section comprising a controller, and wherein
   the first circuit section is located adjacent the back wall of the enclosure and behind the second circuit section, and
   the second circuit section includes means for allowing an operator at the front side of the enclosure to communicate with said at least one of the electrical switching means.

2. A panelboard, according to claim 1, wherein the second circuit section is constructed and arranged to be removably connected to the first circuit section.

3. A panelboard, according to claim 1, wherein the first and second circuit sections are part of an integral unit within the panelboard enclosure.

4. A panelboard, according to claim 3, wherein the integral unit is located at one end of the enclosure.

5. A panelboard, according to claim 1, further including an enclosure cover and wherein the second circuit section is constructed and arranged such that it is located behind the enclosure cover.

6. A panelboard, according to claim 1, wherein the second circuit section is separated from the first circuit section so that heat generated near the back wall of the enclosure is minimized.

7. A panelboard, according to claim 1, wherein the second circuit section includes a programmable control circuit and associated means for allowing an operator to program said programmable control circuit.

8. A panelboard, according to claim 1, wherein the second circuit section includes means for monitoring a contact-related status for each of the plurality of electrical switching means.

9. A panelboard, according to claim 8, wherein the user interface circuit includes an informational display which operates in a program mode and in a run mode and which provides different display functions according to the operating mode.

10. A panelboard having an enclosure including a front side and a back wall, comprising:
    a first column of electrical switching means;
    a second column of electrical switching means arranged parallel to the first column;
    user interface means permitting a user to communicate with at least one of the electrical switching means, said user interface means including a first circuit section comprising an interface module and a second circuit section comprising a controller, and wherein
    the first circuit section is located adjacent the back wall of the enclosure and behind the second circuit section, and
    the second circuit section includes means for allowing an operator at the front side of the enclosure to control and monitor said at least one of the electrical switching means.

11. A panelboard, according to claim 10, wherein the second circuit section is constructed and arranged between the first electrical switching means column and the second electrical switching means column.

12. A panelboard, according to claim 10, wherein the first circuit section is located at one end of the enclosure.

13. A panelboard, according to claim 10, wherein the second circuit section is constructed and arranged such that it is disposed between the first column of electrical switching means and the second column of electrical switching means and at one end of the enclosure.

14. A panelboard, according to claim 10, wherein the second circuit section is separated from the first circuit section so that heat generated near the back wall of the enclosure is minimized.

15. A panelboard, according to claim 10, further including a dead-front panel to isolate the enclosure and wherein the second circuit section is removably connected to the first circuit section so that the dead-front panel does not have to be removed when removing the second circuit section.

16. A panelboard, according to claim 10, further including means for interpreting a coded message which provides the operator access to control said at least one of the circuit breakers.

17. A panelboard, according to claim 16, wherein said means for interpreting a coded message includes means for reading a coded key card.

18. A remotely controlled circuit breaker loadcenter having a panelboard enclosure comprising:
    a plurality of circuit breakers;
    user interface means permitting a user to communicate with at least one of the circuit breakers, said interface means including an interface module, a controller located adjacent the front side of the enclosure to communicate with said at least one of the circuit breakers, and means for interpreting a coded message which provides the operator access to control said at least one of the circuit breakers.

19. A panelboard, according to claim 18, wherein said interface module is located adjacent the back wall of the enclosure and behind said controller.

20. A panelboard, according to claim 18, wherein said means for interpreting a coded message includes means for reading a coded key card.

* * * * *